United States Patent
Ogawa et al.

(10) Patent No.: US 7,799,510 B2
(45) Date of Patent: Sep. 21, 2010

(54) METHOD FOR CORRECTING MASK PATTERN, PHOTOMASK, METHOD FOR FABRICATING PHOTOMASK, ELECTRON BEAM WRITING METHOD FOR FABRICATING PHOTOMASK, EXPOSURE METHOD, SEMICONDUCTOR DEVICE, AND METHOD FOR FABRICATING SEMICONDUCTOR DEVICE

(75) Inventors: Kazuhisa Ogawa, Kanagawa (JP); Satomi Nakamura, Kanagawa (JP); Kazuyoshi Kawahara, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/603,055

(22) Filed: Oct. 21, 2009

(65) Prior Publication Data

US 2010/0038798 A1 Feb. 18, 2010

Related U.S. Application Data

(62) Division of application No. 11/287,826, filed on Nov. 28, 2005.

(30) Foreign Application Priority Data

Nov. 30, 2004 (JP) ............................. 2004-345908

(51) Int. Cl.
*G03C 5/00* (2006.01)
(52) U.S. Cl. ...................................................... 430/311
(58) Field of Classification Search .................... 430/5, 430/311, 312, 313, 394; 716/19, 20, 21
See application file for complete search history.

(56) References Cited

U.S. PATENT DOCUMENTS 7,279,259 B2 10/2007 Ito et al.
2004/0081899 A1 4/2004 Misaka

FOREIGN PATENT DOCUMENTS

JP 2001-100390 4/2001
JP 2002-131882 5/2002

*Primary Examiner*—Stephen Rosasco
(74) *Attorney, Agent, or Firm*—Sonnenschein Nath & Rosenthal LLP

(57) ABSTRACT

A method for correcting a mask pattern to be formed on a photomask used in a lithographic step of a semiconductor device fabrication process. The method includes the steps of extracting an isolated pattern having an optically isolated portion from the mask pattern and providing, in an adjacent pattern extending parallel to the isolated portion of the isolated pattern and having a terminal end, an extended portion extending from the terminal end next to the isolated portion of the isolated pattern along a direction in which the isolated portion of the isolated pattern extends.

6 Claims, 34 Drawing Sheets

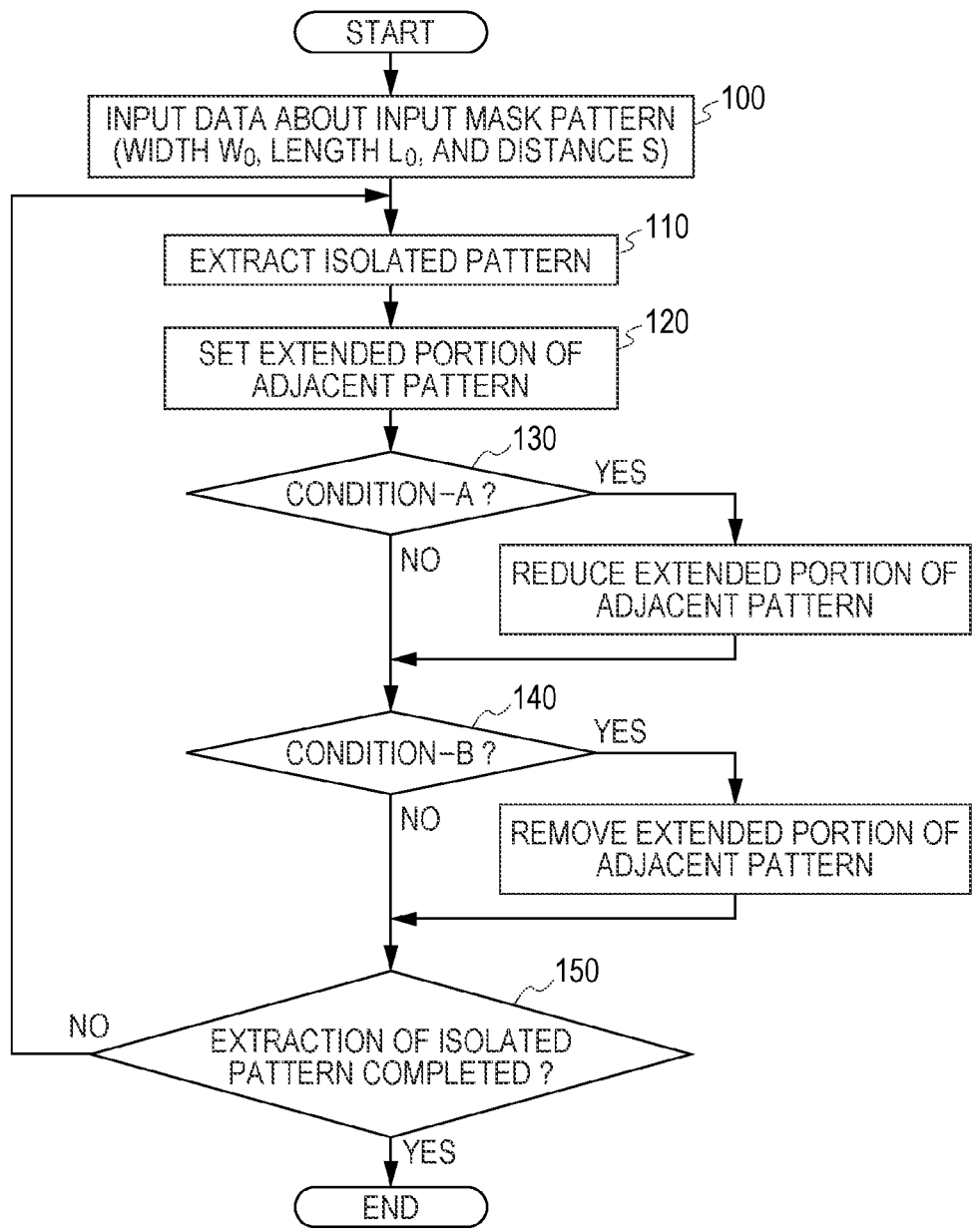

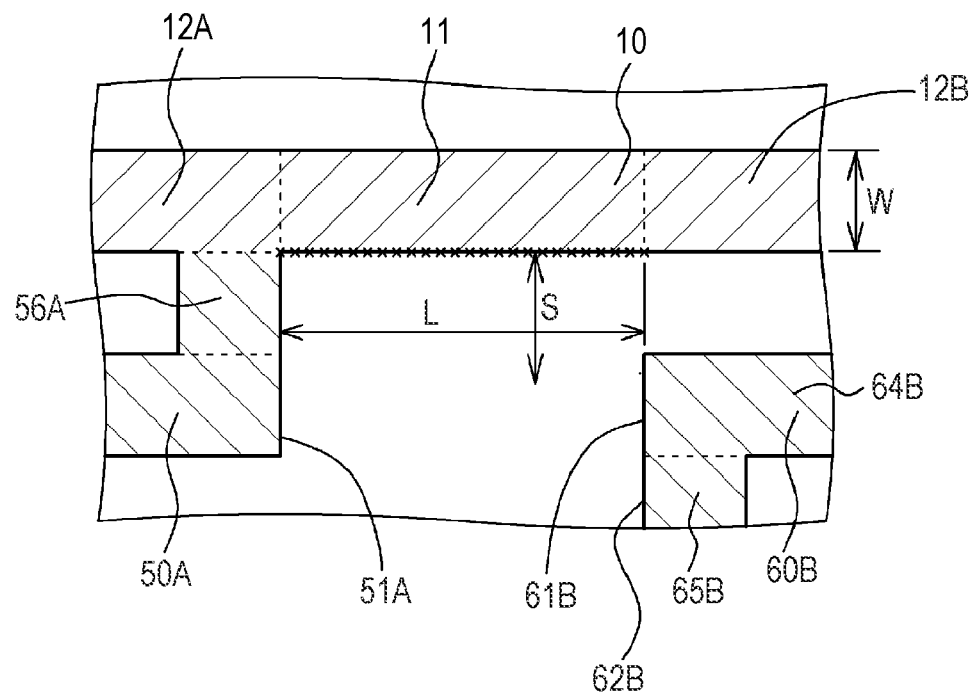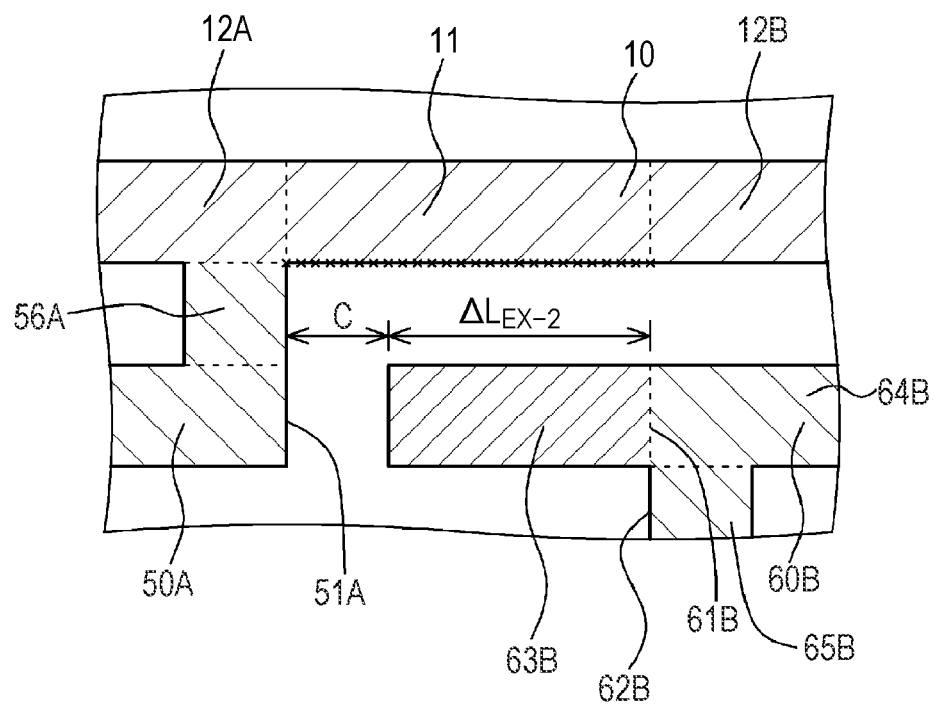

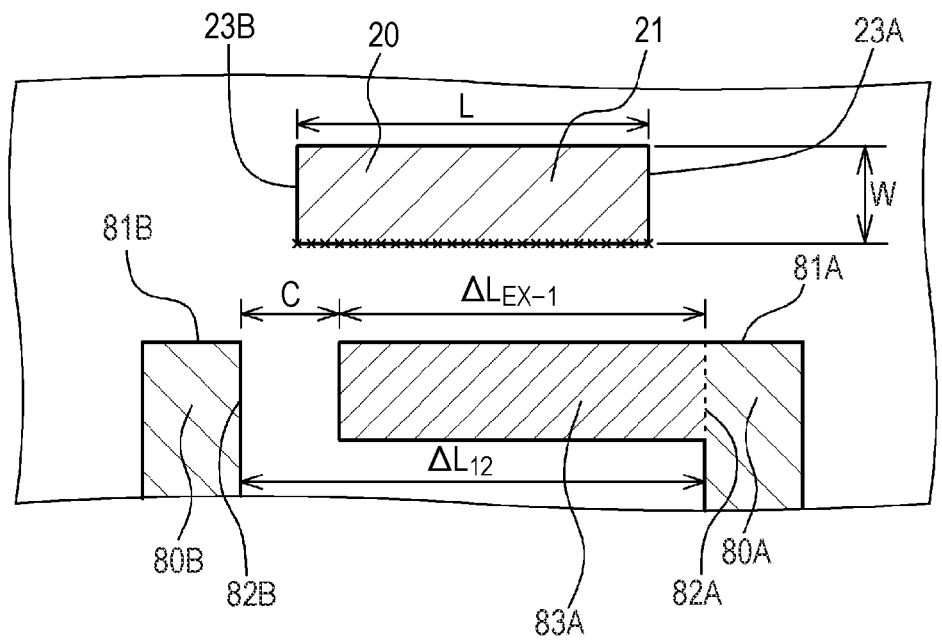
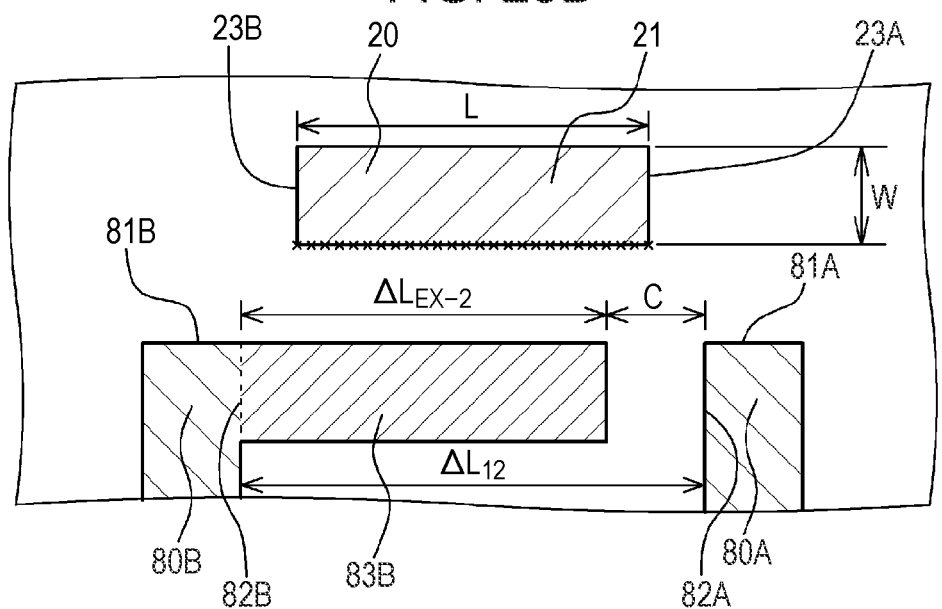

PATTERN A

PATTERN B  PATTERN A

METHOD FOR CORRECTING MASK PATTERN, PHOTOMASK, METHOD FOR FABRICATING PHOTOMASK, ELECTRON BEAM WRITING METHOD FOR FABRICATING PHOTOMASK, EXPOSURE METHOD, SEMICONDUCTOR DEVICE, AND METHOD FOR FABRICATING SEMICONDUCTOR DEVICE

RELATED APPLICATION DATA

This application is a division of U.S. patent application Ser. No. 11/287,826, filed Nov. 28, 2005, the entirety of which is incorporated herein by reference to the extent permitted by law. The present invention contains subject matter related to Japanese Patent Application JP 2004-345908 filed in the Japanese Patent Office on Nov. 30, 2004, the entire contents of which are incorporated herein by reference to the extent permitted by law.

BACKGROUND OF THE INVENTION

1. Field of the Invention

The present invention relates to a method for correcting a mask pattern to be formed on a photomask used in a photolithographic step of a semiconductor device fabrication process, a photomask, a method for fabricating a photomask, an electron beam writing method for fabricating a photomask, an exposure method, a semiconductor device, and a method for fabricating a semiconductor device.

2. Description of the Related Art

A photomask used in a photolithographic step of a semiconductor device fabrication process includes a glass substrate transparent to exposure light and a patterned light-shielding or semi-translucent light-shielding thin layer on top of it.

In a semiconductor device fabrication process, a mask pattern formed on the photomask is transferred to, for example, a photoresist formed on a semiconductor substrate. Hereinafter, a pattern formed on a photomask is also referred to as a "mask pattern", data including a plurality of design patterns is also referred to as "design pattern data", pattern data for electron beam writing is also referred to as "writing pattern data", and a pattern formed on a resist is also referred to as a "resist pattern".

For example, design pattern data for fabricating a photomask is composed in a stream format known as GDSII/Stream in which a design pattern is expressed by a polygon or in a writing format known as OASIS in which a design pattern is expressed by only a rectangle and a trapezoid.

When, for example, a mask pattern is transferred to a photoresist formed on a semiconductor substrate by irradiating a photomask with exposure light, the optical proximity effect appears. Therefore, the shape of a pattern formed on the photoresist is different from that of the design pattern.

That is, in a photolithographic step of a semiconductor device fabrication process, when a mask pattern having a size substantially the same as the wavelength of exposure light is transferred to a photoresist, an interference effect of the exposure light becomes noticeable. Thus, the optical proximity effect appears that causes the dimension of a pattern formed on the photoresist to be different from that of a design pattern, which is a problem.

The optical proximity effect appears in the form of a line width reduction or the shrinkage of a terminal end portion of an isolated pattern (e.g., isolated line), which reduces the controllability of a gate line width and alignment margin. As a result, the variation in transistor characteristics of semiconductor devices increases and the production yield of chips decreases. That is, the productivity of semiconductor device fabrication significantly decreases.

As the wavelength of exposure light becomes shorter, this problem becomes significant. To accommodate a fine design rule, an automatic optical proximity effect correction (OPC) system using an optical intensity simulation base has been developed.

By correcting the optical proximity effect, a desired linewidth can be obtained when, for example, a mask pattern is transferred to a photoresist formed on a semiconductor substrate by irradiating a photomask with exposure light and the exposure light is properly focused. However, when the exposure light is not in focus, a required contrast cannot be obtained. Accordingly, the desired linewidth cannot be obtained. Since the linewidth is reduced, an open error including disconnection and poor contact may occur.

Japanese Unexamined Patent Application Publication No. 2001-100390 and Japanese Unexamined Patent Application Publication No. 2002-131882, for example, disclose methods for preventing the occurrence of such a problem.

A photomask pattern correction method discussed in Japanese Unexamined Patent Application Publication No. 2001-100390 includes a first step, a second step, and a third step. In the first step, a first pattern which is used in a photolithographic step of a semiconductor device fabrication process and which requires a precise dimension control is dimension-corrected so that the dimensions of the first pattern become the desired dimensions after transferred to a wafer. In the second step, a second pattern of the mask pattern which does not require a precise dimension control is dimension-corrected so that the dimensions of the second pattern become the desired dimensions after transferred to the wafer. In the third step, an auxiliary pattern is selectively provided for only the first pattern.

In addition, Japanese Unexamined Patent Application Publication No. 2002-131882 discloses a mask pattern correction method in which the linewidth of a pattern is increased so that the pattern is not optically isolated.

However, even when the mask pattern correction method disclosed in Japanese Unexamined Patent Application Publication No. 2001-100390 is applied, a case in which an auxiliary pattern cannot be arranged occurs due to a critical dimension design rule defining a minimum interval and a minimum line length required for generation and arrangement of the auxiliary pattern. Furthermore, even when the mask pattern correction method disclosed in Japanese Unexamined Patent Application Publication No. 2002-131882 is applied, the minimum linewidth and minimum interval of lines, in some cases, are not ensured. Consequently, it is difficult to increase the linewidth of a pattern in order not to be optically isolated.

SUMMARY OF THE INVENTION

Accordingly, in order to transfer a mask pattern in which the number of optically isolated patterns is reduced to obtain a desired linewidth onto a photoresist formed on a semiconductor substrate, there is a need for a method for correcting the mask pattern. Also, there is a need for a photomask, a method for fabricating the photomask, an electron beam writing method for fabricating the photomask, an exposure method, a semiconductor device, and a method for fabricating the semiconductor device based on the method for correcting the mask pattern.

According to a first aspect of the present invention, a method for correcting a mask pattern to be formed on a photomask used in a lithographic step of a semiconductor device fabrication process includes the steps of extracting an isolated pattern having an optically isolated portion from the mask pattern, and providing, in an adjacent pattern extending parallel to the isolated portion of the isolated pattern and having a terminal end, an extended portion extending from the terminal end next to the isolated portion of the isolated pattern along a direction in which the isolated portion of the isolated pattern extends.

According to the first aspect of the present invention, a photomask used in a lithographic step of a semiconductor device fabrication process includes a mask pattern including an isolated pattern and an adjacent pattern. The isolated pattern has an optically isolated portion, and the adjacent pattern extends parallel to the isolated portion of the isolated pattern and has a terminal end. An extended portion is provided extending from the terminal end next to the isolated portion of the isolated pattern along a direction in which the isolated portion of the isolated pattern extends.

According to a third aspect of the present invention, a photomask is formed by correcting design pattern data including a plurality of design patterns, performing electron beam writing on an electron beam resist formed on the mask blank according to an electron beam writing pattern created on the basis of the corrected design pattern data, and etching a mask blank using an etching mask formed by developing the electron beam resist. The step of correcting design pattern data includes the substeps of extracting an isolated pattern having an optically isolated portion from the mask pattern, and providing, in an adjacent pattern extending parallel to the isolated portion of the isolated pattern and having a terminal end, an extended portion extending in a direction along the isolated portion of the isolated pattern and extending from the terminal end next to the isolated portion of the isolated pattern.

According to the first aspect of the present invention, a method for fabricating a photomask includes the steps of correcting design pattern data including data of a plurality of design patterns, performing electron beam writing on an electron beam resist formed on a mask blank on the basis of the corrected design pattern data, developing the electron beam resist to form an etching mask, and etching the mask blank using the etching mask to form the photomask. The step of correcting the design pattern data includes the substeps of extracting an isolated pattern having an optically isolated portion from a mask pattern, and providing, in an adjacent pattern extending parallel to the isolated portion of the isolated pattern and having a terminal end, an extended portion extending from the terminal end next to the isolated portion of the isolated pattern along a direction in which the isolated portion of the isolated pattern extends.

According to the first aspect of the present invention, an electron beam writing method includes the steps of correcting design pattern data including data of a plurality of design patterns and performing electron beam writing on an electron beam resist formed on a base substrate on the basis of electron beam writing pattern data generated from the corrected design pattern data. The step of correcting the design pattern data includes the substeps of extracting an isolated pattern having an optically isolated portion from a mask pattern and providing, in an adjacent pattern extending parallel to the isolated portion of the isolated pattern and having a terminal end, an extended portion extending from the terminal end next to the isolated portion of the isolated pattern along a direction in which the isolated portion of the isolated pattern extends.

According to the first aspect of the present invention, an exposure method includes the steps of correcting design pattern data including data of a plurality of design patterns, performing electron beam writing on an electron beam resist formed on a mask blank on the basis of the corrected design pattern data, developing the electron beam resist to form an etching mask, etching the mask blank using the etching mask to form a photomask, and transferring a mask pattern formed on the photomask to a photoresist formed on a base substrate by irradiating the photomask with exposure light. The step of correcting the design pattern data includes the substeps of extracting an isolated pattern having an optically isolated portion from the mask pattern, and providing, in an adjacent pattern extending parallel to the isolated portion of the isolated pattern and having a terminal end, an extended portion extending from the terminal end next to the isolated portion of the isolated pattern along a direction in which the isolated portion of the isolated pattern extends.

According to the first aspect of the present invention, a method for fabricating a semiconductor device includes the steps of correcting design pattern data including data of a plurality of design patterns, performing electron beam writing on an electron beam resist formed on a mask blank on the basis of the corrected design pattern data, developing the electron beam resist to form an etching mask, etching the mask blank using the etching mask to form a photomask, transferring a mask pattern formed on the photomask to a photoresist formed on a base substrate by irradiating the photomask with exposure light, developing the photoresist to form an etching mask, and etching a base substrate using the etching mask. The step of correcting the design pattern data includes the substeps of extracting an isolated pattern having an optically isolated portion from the mask pattern and providing, in an adjacent pattern extending parallel to the isolated portion of the isolated pattern and having a terminal end, an extended portion extending from the terminal end next to the isolated portion of the isolated pattern along a direction in which the isolated portion of the isolated pattern extends.

In the method for correcting a mask pattern according to the first aspect of the present invention, a photomask according to the first aspect of the present invention, a photomask according to the third aspect of the present, invention, a method for fabricating a photomask according to the first aspect of the present invention, an electron beam writing method according to the first aspect of the present invention, an exposure method according to the first aspect of the present invention, or a method for fabricating a semiconductor device according to the first aspect of the present invention (hereinafter also collectively referred to as a "first aspect of the present invention"), the isolated portion of the isolated pattern can have a width less than or equal to a predetermined width $W_0$ and a length less than or equal to a predetermined length $L_0$ and an adjacent pattern cannot be present in an area within a distance of S from an edge of the isolated portion of the isolated pattern.

According to the first aspect of the present invention, when a predetermined space is not maintained between an extended portion provided to a first adjacent pattern and a second adjacent pattern adjacent to the first adjacent pattern, the length of the extended portion can be reduced so as to maintain the predetermined space.

In an embodiment according to the first aspect of the present invention, the isolated pattern can include an isolated portion and first and second extended portions extending from both ends of the isolated portion, the isolated portion of the isolated pattern and the first and second extended portions can have a straight line shape, the adjacent patterns can include a first adjacent pattern and a second adjacent pattern, the first adjacent pattern having a first terminal end extends parallel to the first extended portion of the isolated pattern, the second adjacent pattern having a second terminal end facing the first terminal end extends parallel to the second extended portion of the isolated pattern, and equation $\Delta L_{12} = \Delta L_{EX-1} + \Delta L_{EX-2} + C$ can be satisfied where $\Delta L_{12}$ represents a distance between the first terminal end and the second terminal end, C represents a predetermined space length, $\Delta L_{EX-1}$ represents the length of an extended portion provided to the first adjacent pattern, and $\Delta L_{EX-2}$ represents the length of an extended portion provided to the second adjacent pattern. For the sake of simplicity, this structure is referred to as a "structure 1A".

In the structure 1A, the first adjacent pattern can have a straight line shape and extends parallel to the first extended portion of the isolated pattern, and the second adjacent pattern can have a straight line shape and can extend parallel to the second extended portion of the isolated pattern. For the sake of simplicity, this structure is referred to as a "structure 1A-1".

Alternatively, in the structure 1A, the first adjacent pattern can have a straight line shape and can extend parallel to the first extended portion of the isolated pattern, and the second adjacent pattern can have an L-shape defined by a first side and a second side, the first side constituting the second adjacent pattern and having the second terminal end can extend straight and parallel to the second extended portion of the isolated pattern, and the second side constituting the second adjacent pattern can extend from the second terminal end of the first side in a direction orthogonal to the extending direction of the second extended portion of the isolated pattern and away from the second extended portion of the isolated pattern. For the sake of simplicity, this structure is referred to as a "structure 1A-2".

Alternatively, in the structure 1A, the first adjacent pattern can have an L-shape defined by a first side and a second side, the first side constituting the first adjacent pattern and having the first terminal end can extend straight and parallel to the first extended portion of the isolated pattern, and the second side constituting the first adjacent pattern can extend from the first terminal end of the first side in a direction orthogonal to the extending direction of the first extended portion of the isolated pattern and away from the first extended portion of the isolated pattern, and the second adjacent pattern can have an L-shape defined by a first side and a second side, the first side constituting the second adjacent pattern and having the second terminal end can extend straight and parallel to the second extended portion of the isolated pattern, and the second side constituting the second adjacent pattern can extend from the second terminal end of the first side in a direction orthogonal to the extending direction of the second extended portion of the isolated pattern and away from the second extended portion of the isolated pattern. For the sake of simplicity, this structure is referred to as a "structure 1A-3".

Additionally, according to the first aspect of the present invention, the straight isolated pattern can include an isolated portion having terminal ends at both ends thereof, the adjacent patterns can include a first adjacent pattern and a second adjacent pattern, the first adjacent pattern having a first terminal end can extend parallel to the isolated pattern, the second adjacent pattern having a second terminal end facing the first terminal end can extend parallel to the isolated pattern, and equation $\Delta L_{12} = \Delta L_{EX-1} + \Delta L_{EX-2} + C$ can be satisfied where $\Delta L_{12}$ represents a distance between the first terminal end and the second terminal end, C represents a predetermined space length, $\Delta L_{EX-1}$ represents the length of an extended portion provided to the first adjacent pattern, and $\Delta L_{EX-2}$ represents the length of an extended portion provided to the second adjacent pattern. For the sake of simplicity, this structure is referred to as a "structure 1B".

In the structure 1B, the first adjacent pattern can have a straight line shape and can extend parallel to the isolated pattern, and the second adjacent pattern can have a straight line shape and can extend parallel to the isolated pattern. For the sake of simplicity, this structure is referred to as a "structure 1B-1".

Alternatively, in the structure 1B, the first adjacent pattern can have a straight line shape and can extend parallel to the isolated pattern, and the second adjacent pattern can have an L-shape defined by a first side and a second side. The first side constituting the second adjacent pattern and having the second terminal end can extend straight and parallel to the isolated pattern, and the second side constituting the second adjacent pattern can extend from the second terminal end of the first side in a direction orthogonal to the extending direction of the isolated pattern and away from the isolated pattern. For the sake of simplicity, this structure is referred to as a "structure 1B-2".

Alternatively, in the structure 1B, the first adjacent pattern can have an L-shape defined by a first side and a second side. The first side constituting the first adjacent pattern and having the first terminal end can extend straight and parallel to the isolated pattern, and the second side constituting the first adjacent pattern can extend from the first terminal end of the first side in a direction orthogonal to the extending direction of the isolated pattern and away from the isolated pattern. The second adjacent pattern can have an L-shape defined by a first side and a second side. The first side constituting the second adjacent pattern and having the second terminal end can extend straight and parallel to the isolated pattern, and the second side constituting the second adjacent pattern can extend from the second terminal end of the first side in a direction orthogonal to the extending direction of the isolated pattern and away from the isolated pattern. For the sake of simplicity, this structure is referred to as a "structure 1B-3".

Additionally, according to the first aspect of the present invention, the isolated pattern can include an isolated portion having a terminal end at one side thereof and an extended portion extending from the other side of the isolated portion. The isolated portion and the extended portion of the isolated pattern can have a straight line shape, the adjacent pattern having a terminal end can extend parallel to the extended portion of the isolated pattern, and equation $\Delta L_{EX} = \Delta L \pm \alpha$ can be satisfied where $\Delta L_{EX}$ represents the length of the extended portion provided to the adjacent pattern, $\Delta L$ represents the length between the terminal end of the isolated pattern and a reference line minus the length between the terminal end of the adjacent pattern and the reference line, and $\alpha$ is a value greater than or equal to zero and less than or equal to a minimum feature size. For the sake of simplicity, this structure is referred to as a "structure 1C".

In the structure 1C, the adjacent pattern can have a straight line shape and extends parallel to the extended portion of the isolated pattern. For the sake of simplicity, this structure is referred to as a "structure 1C-1".

Alternatively, in the structure 1C, the adjacent pattern can have an L-shape defined by a first side and a second side. The first side constituting the adjacent pattern and having the terminal end can extend straight and parallel to the extended portion of the isolated pattern, and the second side constituting the adjacent pattern can extend from the terminal end of the first side in a direction orthogonal to the extending direction of the extended portion of the isolated pattern and away from the extended portion of the isolated pattern. For the sake of simplicity, this structure is referred to as a "structure 1C-2".

Additionally, according to the first aspect of the present invention, the isolated pattern can have an L-shape defined by a first side and a second side. The straight first side constituting the isolated pattern and having a terminal end can include an isolated portion having a terminal end at one side thereof and an extended portion extending from the other side of the isolated portion, and the second side constituting the isolated pattern can extend from the terminal end of the first side in a direction orthogonal to the extending direction of the first side. The adjacent pattern having a terminal end facing the second side constituting the isolated pattern can extend parallel to the extended portion of the first side constituting the isolated pattern, and equation $\Delta L_{EX} = \Delta L - C \pm \alpha$ can be satisfied where $\Delta L_{EX}$ represents the length of the extended portion provided to the adjacent pattern, $\Delta L$ represents the length between an edge of the second side constituting the isolated pattern and the terminal end of the adjacent pattern, C represents a predetermined space length, and $\alpha$ is a value greater than or equal to zero and less than or equal to a minimum feature size. For the sake of simplicity, this structure is referred to as a "structure 1D".

In the structure 1D, the adjacent pattern can have a straight line shape and can extend parallel to the extended portion of the first side constituting the isolated pattern. For the sake of simplicity, this structure is referred to as a "structure 1D-1".

Alternatively, in the structure 1D, the adjacent pattern can have an L-shape defined by a first side and a second side. The first side constituting the adjacent pattern and having the terminal end can extend straight and parallel to the extended portion of the first side constituting the isolated pattern, and the second side constituting the adjacent pattern can extend from the terminal end of the first side constituting the adjacent pattern in a direction parallel to the extending direction of the second side constituting the isolated pattern and away from the first side constituting the isolated pattern. For the sake of simplicity, this structure is referred to as a "structure 1D-2".

According to the second aspect of the present invention, a method for correcting a mask pattern to be formed on a photomask used in a lithographic step of a semiconductor device fabrication process includes the steps of extracting an isolated pattern having an optically isolated portion from the mask pattern and providing, in a straight adjacent pattern extending next to the isolated pattern in a direction orthogonal to the isolated pattern and having a terminal end and a terminal end edge extending from the terminal end, an extended portion extending from the terminal end edge next to the isolated portion of the isolated pattern along a direction in which the isolated portion of the isolated pattern extends.

According to the second aspect of the present invention, a photomask used in a lithographic step of a semiconductor device fabrication process includes a mask pattern including an isolated pattern and a straight adjacent pattern. The isolated pattern has an optically isolated portion. The adjacent pattern extends next to the isolated pattern in a direction orthogonal to the isolated pattern and has a terminal end and a terminal end edge extending from the terminal end. In the adjacent pattern, an extended portion is provided extending from the terminal end edge next to the isolated portion of the isolated pattern along a direction in which the isolated portion of the isolated pattern extends.

According to a fourth aspect of the present invention, a photomask is formed by correcting design pattern data including a plurality of design patterns, performing electron beam writing on an electron beam resist formed on a mask blank according to an electron beam writing pattern created on the basis of the corrected design pattern data, and etching the mask blank using an etching mask formed by developing the electron beam resist. The step of correcting design pattern data includes the substeps of extracting an isolated pattern having an optically isolated portion from the mask pattern and providing, in a straight adjacent pattern extending next to the isolated pattern in a direction orthogonal to the isolated pattern and having a terminal end and a terminal end edge extending from the terminal end, an extended portion extending from the terminal end edge next to the isolated portion of the isolated pattern along a direction in which the isolated portion of the isolated pattern extends.

According to the second aspect of the present invention, a method for fabricating a photomask includes the steps of correcting design pattern data including data of a plurality of design patterns, performing electron beam writing on an electron beam resist formed on a mask blank on the basis of the corrected design pattern data, developing the electron beam resist to form an etching mask, and etching the mask blank using the etching mask to form the photomask. The step of correcting the design pattern data includes the substeps of extracting an isolated pattern having an optically isolated portion from the mask pattern, and providing, in a straight adjacent pattern extending next to the isolated pattern in a direction orthogonal to the isolated pattern and having a terminal end and a terminal end edge extending from the terminal end, an extended portion extending from the terminal end edge next to the isolated portion of the isolated pattern along a direction in which the isolated portion of the isolated pattern extends.

According to the second aspect of the present invention, an electron beam writing method includes the steps of correcting design pattern data including data of a plurality of design patterns and performing electron beam writing on an electron beam resist formed on a base substrate on the basis of electron beam writing pattern data generated from the corrected design pattern data. The step of correcting the design pattern data includes the substeps of extracting an isolated pattern having an optically isolated portion from the mask pattern and providing, in a straight adjacent pattern extending next to the isolated pattern in a direction orthogonal to the isolated pattern and having a terminal end and a terminal end edge extending from the terminal end, an extended portion extending from the terminal end edge next to the isolated portion of the isolated pattern along a direction in which the isolated portion of the isolated pattern extends.

According to the second aspect of the present invention, an exposure method includes the steps of correcting design pattern data including data of a plurality of design patterns, performing electron beam writing on an electron beam resist formed on a mask blank on the basis of the corrected design pattern data, developing the electron beam resist to form an etching mask, etching the mask blank using the etching mask to form a photomask, and transferring a mask pattern formed on the photomask to a photoresist formed on a base substrate by irradiating the photomask with exposure light. The step of correcting the design pattern data includes the substeps of extracting an isolated pattern having an optically isolated portion from the mask pattern, and providing, in a straight adjacent pattern extending next to the isolated pattern in a direction orthogonal to the isolated pattern and having a terminal end and a terminal end edge extending from the terminal end, an extended portion extending from the terminal end edge next to the isolated portion of the isolated pattern along a direction in which the isolated portion of the isolated pattern extends.

According to the second aspect of the present invention, a method for fabricating a semiconductor device includes the steps of correcting design pattern data including data of a plurality of design patterns, performing electron beam writing on an electron beam resist formed on a mask blank on the basis of the corrected design pattern data, developing the electron beam resist to form an etching mask, etching the mask blank using the etching mask to form a photomask, transferring a mask pattern formed on the photomask to a photoresist formed on a base substrate by irradiating the photomask with exposure light, developing the photoresist to form an etching mask, and etching a base substrate using the etching mask. The step of correcting the design pattern data includes the substeps of extracting an isolated pattern having an optically isolated portion from the mask pattern and providing, in a straight adjacent pattern extending next to the isolated pattern in a direction orthogonal to the isolated pattern and having a terminal end and a terminal end edge extending from the terminal end, an extended portion extending from the terminal end edge next to the isolated portion of the isolated pattern along a direction in which the isolated portion of the isolated pattern extends.

In the method for correcting a mask pattern according to the second aspect of the present invention, a photomask according to the second aspect of the present invention, a photomask according to the fourth aspect of the present, invention, a method for fabricating a photomask according to the second aspect of the present invention, an electron beam writing method according to the second aspect of the present invention, an exposure method according to the second aspect of the present invention, or a method for fabricating a semiconductor device according to the second aspect of the present invention (hereinafter also collectively referred to as a "second aspect of the present invention"), the isolated portion of the isolated pattern can have a width less than or equal to a predetermined width $W_0$ and a length less than or equal to a predetermined length $L_0$ and an adjacent pattern cannot be present in an area within a distance of S from an edge of the isolated portion of the isolated pattern.

In an embodiment according to the second aspect of the present invention, the isolated pattern can include an isolated portion and first and second extended portions extending from both ends of the isolated portion. The isolated portion of the isolated pattern and the first and second extended portions can have a straight line shape. The adjacent patterns can include a first adjacent pattern and a second adjacent pattern. The straight first adjacent pattern can extend next to and perpendicular to the first extended portion of the isolated pattern and can have a first terminal end and a first terminal end edge extending from the first terminal end. The straight second adjacent pattern can extend next to and perpendicular to the second extended portion of the isolated pattern and can have a second terminal end and a second terminal end edge extending from the second terminal end and facing the first terminal end edge, and equation $\Delta L_{12} = \Delta L_{EX-1} + \Delta L_{EX-2} + C$ can be satisfied where $\Delta L_{12}$ represents a distance between the first terminal end edge and the second terminal end edge, C represents a predetermined space length, $\Delta L_{EX-1}$ represents the length of an extended portion provided to the first adjacent pattern, and $\Delta L_{EX-2}$ represents the length of an extended portion provided to the second adjacent pattern. For the sake of simplicity, this structure is referred to as a "structure 2A".

Alternatively, in an embodiment according to the second aspect of the present invention, the isolated pattern can have an L-shape defined by a first side and a second side. The straight first side constituting the isolated pattern and having a terminal end can include an isolated portion having a terminal end at one side thereof and an extended portion extending from the other side of the isolated portion, and the second side constituting the isolated pattern can extend from the terminal end of the first side in a direction orthogonal to the extending direction of the first side. The straight adjacent pattern can extend next to and perpendicular to the first side constituting the isolated pattern and can have a terminal end and a terminal end edge extending from the terminal end, and equation $\Delta L_{EX} = \Delta L - C \pm \alpha$ can be satisfied where $\Delta L_{EX}$ represents the length of an extended portion provided to the adjacent pattern, $\Delta L$ represents the length between an edge of the second side constituting the isolated pattern and the terminal end edge of the adjacent pattern, C represents a predetermined space length, and $\alpha$ is a value greater than or equal to zero and less than or equal to a minimum feature size. For the sake of simplicity, this structure is referred to as a "structure 2B".

According to the first aspect of the present invention, a semiconductor device includes an isolated pattern circuit including a pattern having an isolated portion and an adjacent pattern circuit extending parallel to the isolated portion of the isolated pattern and having a terminal end. An extended portion is provided to the adjacent pattern circuit and the extended portion extends from the terminal end next to the isolated portion of the isolated pattern along a direction in which the isolated portion of the isolated pattern extends.

According to the second aspect of the present invention, a semiconductor device includes an isolated pattern circuit including a pattern having an isolated portion and a straight adjacent pattern extending next to the isolated pattern in a direction orthogonal to the isolated pattern and having a terminal end and a terminal end edge extending from the terminal end. An extended portion is provided extending from the terminal end edge next to the isolated portion of the isolated pattern along a direction in which the isolated portion of the isolated pattern extends.

According to the third aspect of the present invention, a semiconductor device is fabricated by irradiating a photomask with exposure light, transferring a mask pattern formed in the photomask onto a photoresist formed on a base substrate, and etching the base substrate using an etching mask obtained by developing the photoresist. The photomask is formed by correcting design pattern data including a plurality of design patterns, performing electron beam writing on an electron beam resist formed on a mask blank according to an electron beam writing pattern created on the basis of the corrected design pattern data, and etching the mask blank using an etching mask formed by developing the electron beam resist. Correcting design pattern data includes the steps of extracting an isolated pattern having an optically isolated portion from the mask pattern and providing, in an adjacent pattern extending parallel to the isolated portion of the isolated pattern and having a terminal end, an extended portion extending in a direction along the isolated portion of the isolated pattern and extending from the terminal end next to the isolated portion of the isolated pattern.

According to the fourth aspect of the present invention, a semiconductor device is fabricated by irradiating a photomask with exposure light, transferring a mask pattern formed in the photomask onto a photoresist formed on a base substrate, and etching the base substrate using an etching mask obtained by developing the photoresist. The photomask is formed by correcting design pattern data including a plurality of design patterns, performing electron beam writing on an electron beam resist formed on a mask blank according to an electron beam writing pattern created on the basis of the corrected design pattern data, and etching the mask blank using an etching mask formed by developing the electron beam resist. Correcting design pattern data includes the steps of extracting an isolated pattern having an optically isolated portion from the mask pattern and providing, in a straight adjacent pattern extending next to the isolated pattern in a direction orthogonal to the isolated pattern and having a terminal end and a terminal end edge extending from the terminal end, an extended portion extending from the terminal end edge next to the isolated portion of the isolated pattern along a direction in which the isolated portion of the isolated pattern extends.

According to the first aspect or the second aspect of the present invention, an isolated pattern, which is a pattern having an optically isolated portion, is extracted. A known general-purpose graphic calculation program can automatically extract the isolated pattern using an optical simulation result or a rule base (graphic calculation) without human intervention.

If the isolated pattern includes an isolated portion having a length exceeding a predetermined length of $L_0$, a technology disclosed in, for example, Japanese Unexamined Patent Application Publication No. 2001-100390 or Japanese Unexamined Patent Application Publication No. 2002-131882 can be applied.

The photomask, for example, is achieved by forming a light-shielding thin layer or semi-translucent light-shielding thin layer composed of a metal or a metal oxide on a glass substrate, which is transparent to exposure light. The glass substrate includes a soda lime glass, a low-expansion glass, or a synthetic silica glass. Also, the light-shielding thin layer or semi-translucent light-shielding thin layer may be a single layer or a multi layer. According to the first or second aspect of the present invention, examples of the photomask include a normal photomask having a mask pattern of a light-shielding thin layer; a phase-shift mask; and a half-tone phase-shift mask having a mask pattern of a semi-translucent light-shielding thin layer. Additionally, the photomask may be a photomask (master mask) fabricated by etching a mask blank using an etching mask obtained by developing an electron beam resist. Alternatively, the photomask may be a working mask, which is copied from the master mask.

Examples of a material for forming the isolated pattern circuit and the adjacent circuit of the semiconductor device according to an embodiment of the present invention include a polycrystalline silicon doped with impurities; a metal such as aluminum alloy, tungsten, copper, or silver; a metal compound such as tungsten silicide or titanium silicide; a multi layer in which a polycrystalline silicon doped with impurities is layered on top of a metal compound such as tungsten silicide or titanium silicide; and a multi layer of a layer of a polycrystalline silicon doped with impurities, metal compound such as tungsten silicide or titanium silicide, and an insulating layer.

For the electron beam writing method, one of examples of the base substrate is a mask blank in which a light-shielding thin layer or a semi-translucent light-shielding thin layer composed of a metal or a metal compound is formed on a glass substrate composed of a soda lime glass transparent to exposure light, a low-expansion glass, or a synthetic silica glass. The light-shielding thin layer or semi-translucent light-shielding thin layer may be a single layer or a multi layer structure.

Alternatively, for the electron beam writing method, the exposure method, the semiconductor device, and the method for fabricating the semiconductor device, examples of the base substrate include a semiconductor substrate, a semi-insulating substrate, an insulating substrate, and a processed layer formed on one of these substrates. More specifically, examples of the base substrate include a polycrystalline silicon doped with impurities; a metal such as aluminum alloy, tungsten, copper, or silver; a metal compound such as tungsten silicide or titanium silicide; a multi layer in which a polycrystalline silicon doped with impurities is layered on top of a metal compound such as tungsten silicide or titanium silicide; and a multi layer of a layer of a polycrystalline silicon doped with impurities, metal compound such as tungsten silicide or titanium silicide, and an insulating layer. Here, examples of a material of the insulating layer include a well-known insulating material, such as $SiO_2$, BPSG, PSG, BSG, AsSG, SbSG, NSG, SOG, LTO (Low Temperature Oxide: low-temperature $CVD-SiO_2$), SiN, or SiON, and a multi-layer structure of these insulating materials.

To correct a proximity effect, an optical proximity effect, or both of a proximity effect and an optical proximity effect, design pattern data may be independently corrected.

According to the first or second aspect of the present invention, a pattern data correction apparatus including an arrangement/wiring tool corrects design pattern data including a plurality of design pattern. The pattern data correction apparatus includes:

(a) input means for inputting the design pattern data;

(b) correction means; and (c) output means for outputting the corrected design pattern data. The correction means extracts an isolated pattern having an optically isolated portion from the mask pattern and provides, in an adjacent pattern extending parallel to the isolated portion of the isolated pattern and having a terminal end, an extended portion extending from the terminal end next to the isolated portion of the isolated pattern along a direction in which the isolated portion of the isolated pattern extends. Alternatively, the correction means extracts an isolated pattern having an optically isolated portion from the mask pattern and provides, in a straight adjacent pattern extending next to the isolated pattern in a direction orthogonal to the isolated pattern and having a terminal end and a terminal end edge extending from the terminal end, an extended portion extending from the terminal end edge next to the isolated portion of the isolated pattern along a direction in which the isolated portion of the isolated pattern extends.

The pattern data correction apparatus may be incorporated in an apparatus for generating the design pattern data or in an electron beam writing apparatus. Alternatively, the pattern data correction apparatus may be an independent apparatus.

Here, the input means may be any means for specifying or inputting the design pattern data to the pattern data correction apparatus. Examples of the input means include a keyboard and a touch panel. When inputting design pattern data recorded on a flexible disk, a CD-ROM (compact disc-read only memory), or a DVD (digital versatile disc) into the pattern data correction apparatus, or when inputting design pattern data recorded in a different data processing apparatus into the pattern data correction apparatus, the input means may be a hard disk for receiving the design pattern data and storing it, a communications line, a LAN (local area network), or a WAN (wide area network). Additionally, when the design pattern data is input in the form of an electronic signal, the input means may be an input terminal.

The output means may be an output terminal for outputting the design pattern data corrected by using the mask pattern correction method. Alternatively, the output means may be a printer or an XY plotter for recording a corrected design pattern on a sheet of paper or a film on the basis of the corrected design pattern data.

The correction means performs the mask pattern correction method according to the first or second aspect of the present invention. The correction means can include a RAM (random access memory), a ROM (read only memory), storage means, such as an optical recording medium, and a CPU (central processing unit). The storage means stores a variety of generation programs, processing programs, mask pattern correction programs, tables, and rules.

Additionally, the pattern data correction apparatus may include design pattern data storage means for storing the input design pattern data and post-correction design pattern data storage means for storing the corrected design pattern data. These design pattern data storage means and post-correction design pattern data storage means can include, for example, a memory (e.g., a RAM) and a hard disk. Furthermore, the pattern data correction apparatus may include a light intensity simulation means composed of, for example, a CPU to perform optical proximity effect correction on a design pattern on the basis of the obtained linewidth and interval of the design pattern so that design pattern data in which the optical proximity effect is corrected can be obtained.

As described above, according to the first or second aspect of the present invention or according to a semiconductor device of one of the first to fourth aspects of the present invention, an isolated pattern, which has an optically isolated portion, is extracted from a mask pattern. Subsequently, an extended portion extending from a terminal end or a terminal end edge of an adjacent pattern is provided to the adjacent pattern. Accordingly, the number of optically isolated patterns can be reduced as many as possible. As a result, a process window in a lithographic step of a fabrication process of a semiconductor device can be expanded. That is, the process tolerance (e.g., focus tolerance) in the lithographic step can be increased.

Consequently, the problem in which necessary contrast cannot be obtained at a defocus time, a desired linewidth cannot be obtained, the linewidth is decreased, and an open error, such as disconnection and poor contact, occurs is reliably eliminated. Additionally, an isolated pattern can be automatically extracted from a mask pattern and the extended portion can be automatically added to the terminal end or terminal end edge of the adjacent pattern without human intervention.

BRIEF DESCRIPTION OF THE DRAWINGS

FIG. 1 is a flow chart illustrating a mask pattern correction method according to a first aspect or a second aspect of the present invention;

FIG. 9A is a schematic view of an arrangement of an isolated pattern and an adjacent pattern for illustrating the mask pattern correction method;

FIG. 9B is a schematic view of an arrangement of an isolated pattern and an adjacent pattern when an extended portion is provided to the adjacent pattern shown in FIG. 9A;

FIGS. 23A and 23B are schematic views of the modifications of an arrangement of an isolated pattern and an adjacent pattern when an extended portion is provided to the adjacent pattern shown in FIG. 22A;

DESCRIPTION OF THE PREFERRED EMBODIMENTS

Exemplary embodiments of the present invention are described with reference to the accompanying drawings.

First Exemplary Embodiment

A first exemplary embodiment relates to mask pattern correction methods according to first and second aspects of the present invention.

FIG. 1 is a flow chart illustrating a mask pattern correction method according to the first embodiment. TABLE-1 shows a structure identification, an arrangement of isolated pattern and an adjacent pattern, and a drawing number showing an arrangement of isolated pattern and an adjacent pattern when an extended portion is provided to the adjacent pattern.

TABLE 1

Figure 2A:
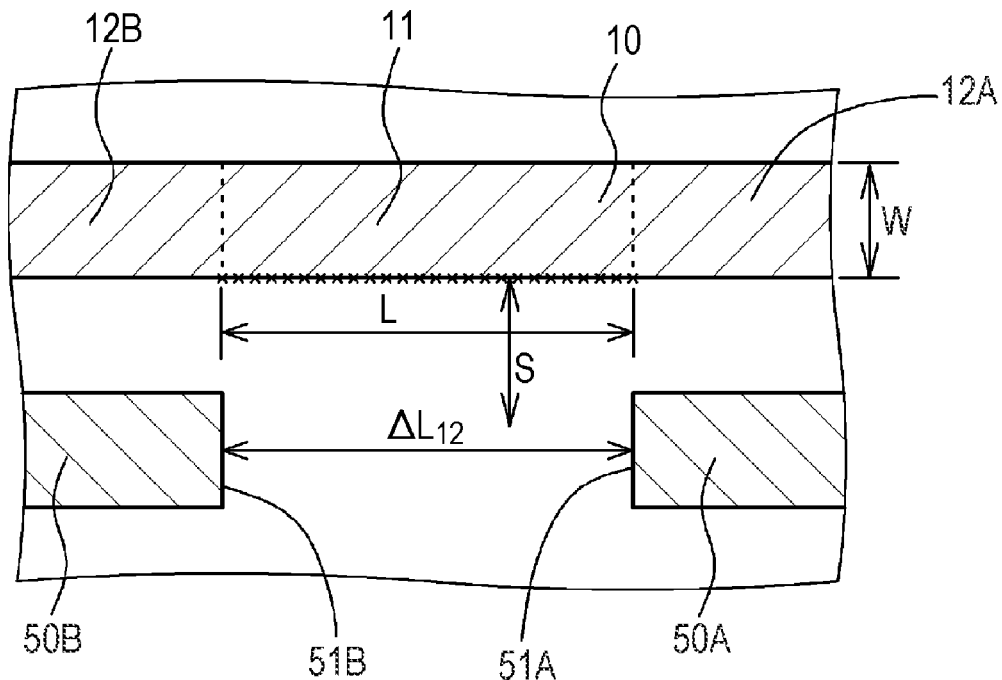
FIG. 2A is a schematic view of an arrangement of an isolated pattern and an adjacent pattern for illustrating the mask pattern correction method.
Figure 2B:
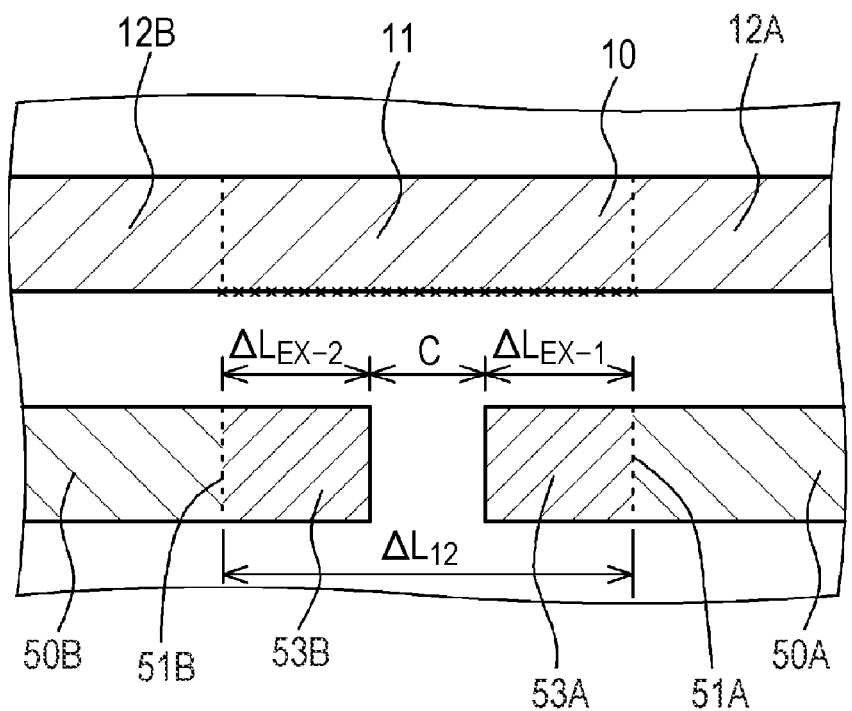
FIG. 2B is a schematic view of an arrangement of an isolated pattern and an adjacent pattern when an extended portion is provided to the adjacent pattern shown in FIG. 2A.
Figure 3A:
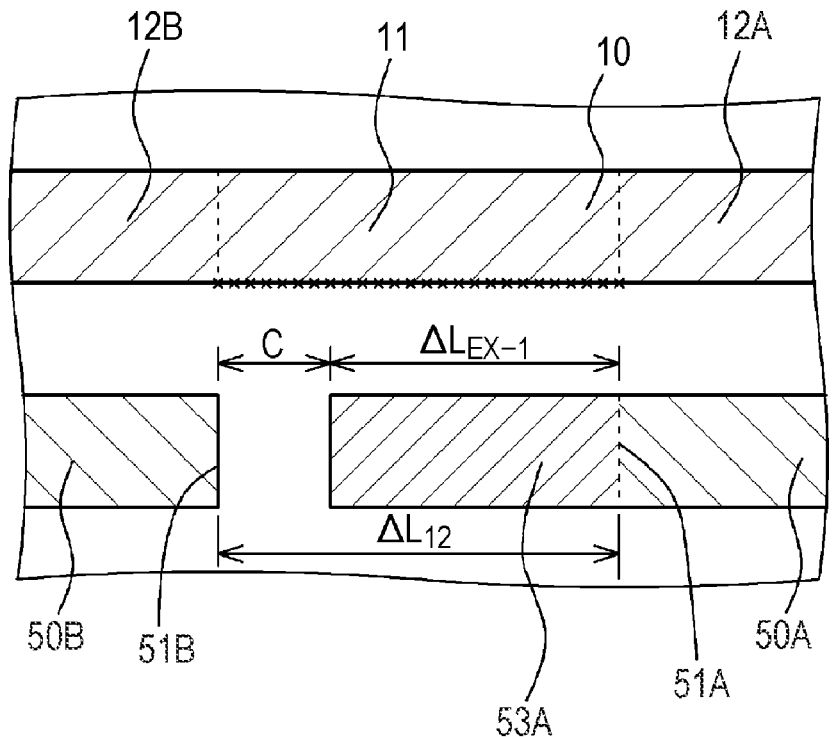
FIGS. 3A and 3B are schematic views of the modifications of an arrangement of an isolated pattern and an adjacent pattern when an extended portion is provided to the adjacent pattern shown in FIG. 2A.
Figure 3B:
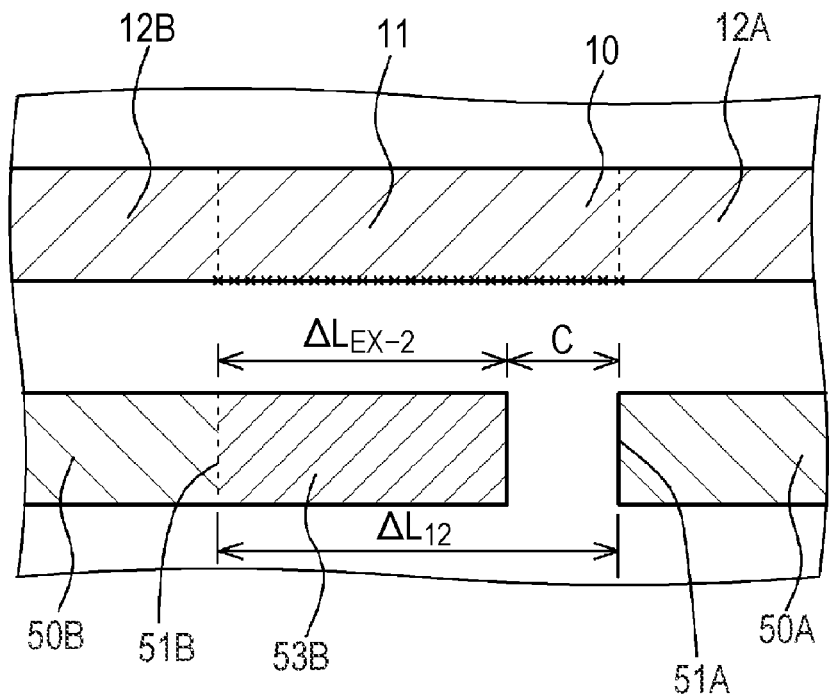
Figure 4A:
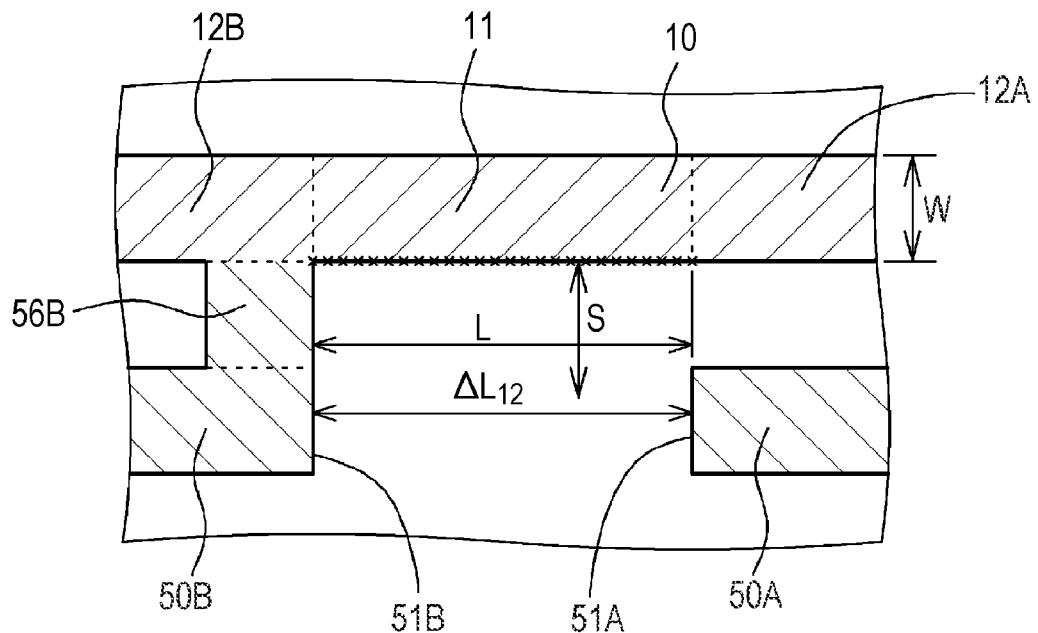
FIG. 4A is a schematic view of an arrangement of an isolated pattern and an adjacent pattern for illustrating the mask pattern correction method.
Figure 4B:
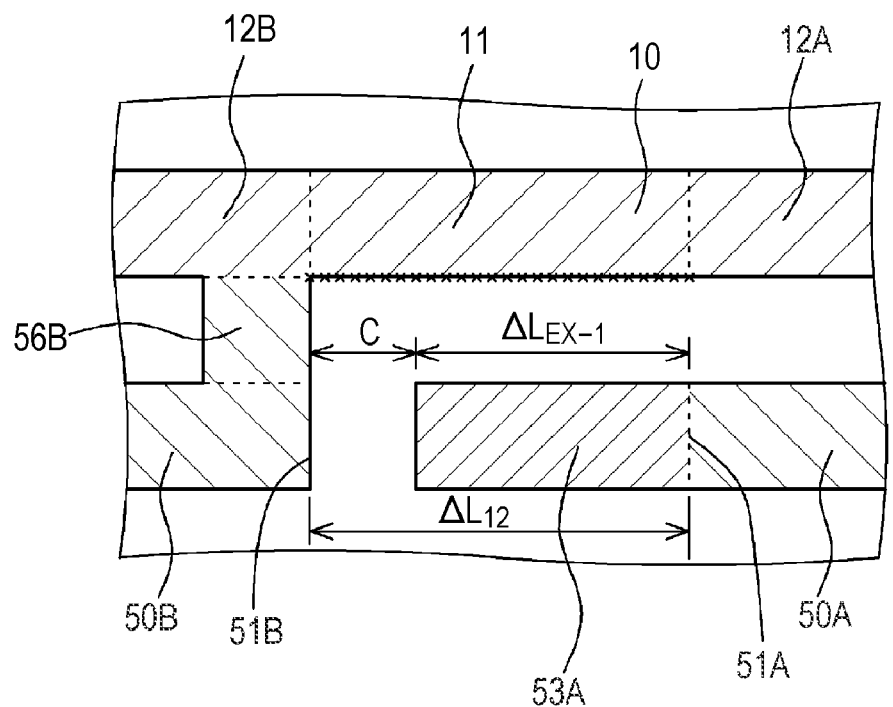
FIG. 4B is a schematic view of an arrangement of an isolated pattern and an adjacent pattern when an extended portion is provided to the adjacent pattern shown in FIG. 4A.
Figure 5A:
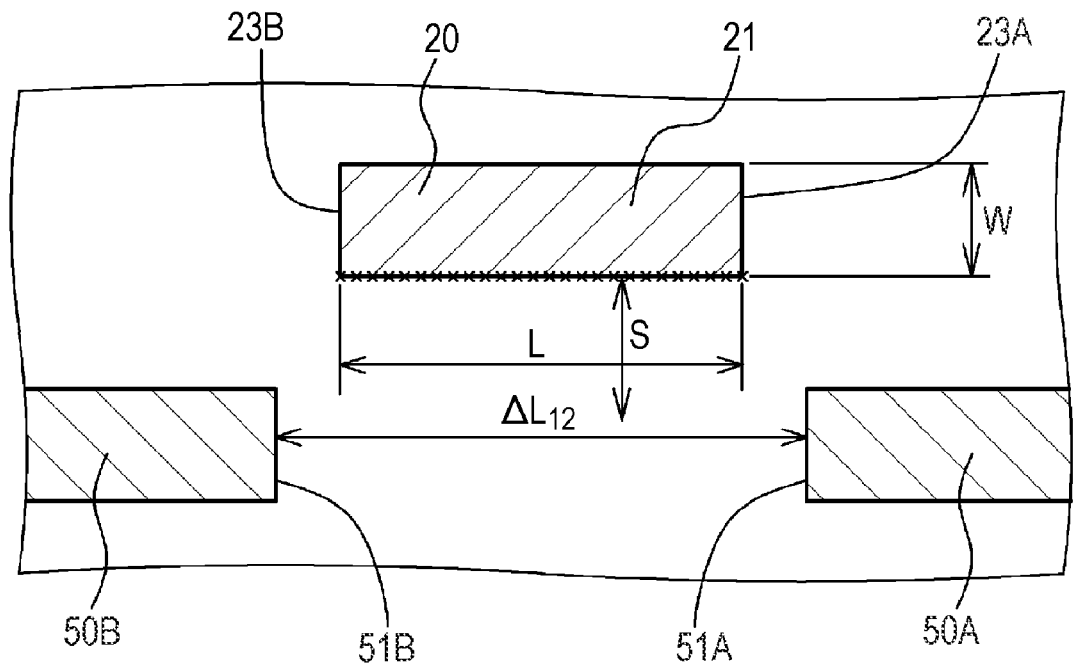
FIG. 5A is a schematic view of an arrangement of an isolated pattern and an adjacent pattern for illustrating the mask pattern correction method.
Figure 5B:
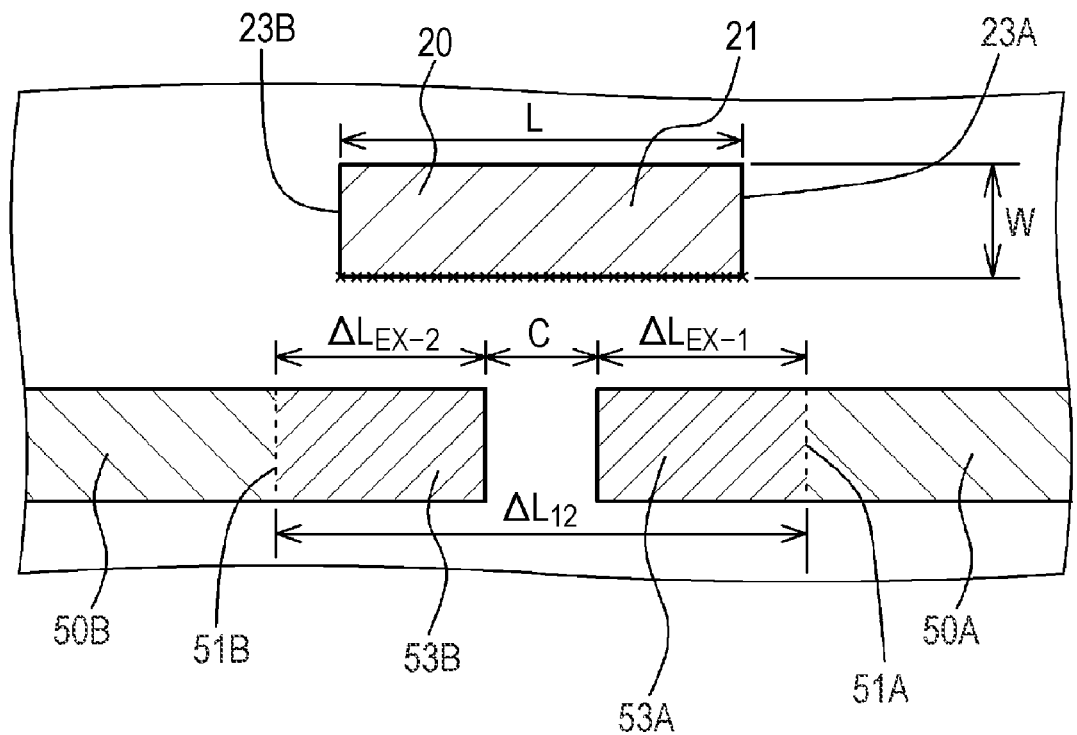
FIG. 5B is a schematic view of an arrangement of an isolated pattern and an adjacent pattern when an extended portion is provided to the adjacent pattern shown in FIG. 5A.
Figure 6A:
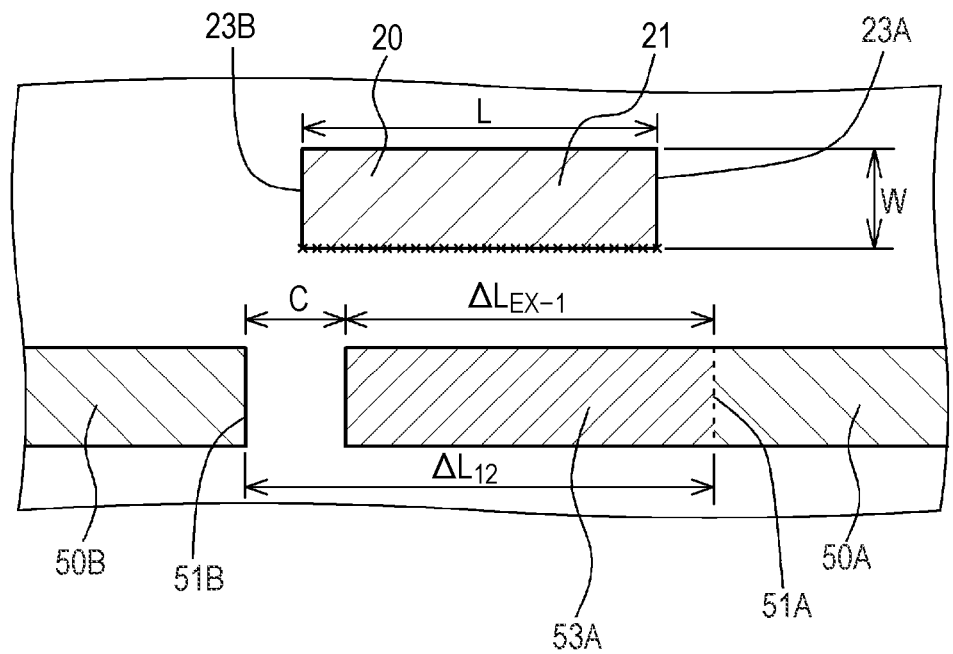
FIGS. 6A and 6B are schematic views of the modifications of an arrangement of an isolated pattern and an adjacent pattern when an extended portion is provided to the adjacent pattern shown in FIG. 5A.
Figure 6B:
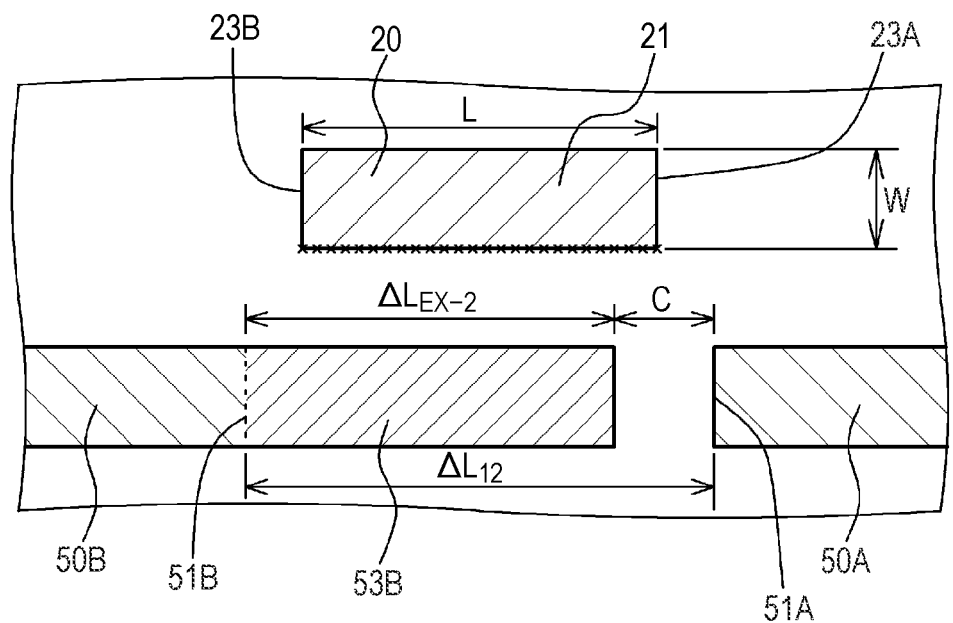
Figure 7A:
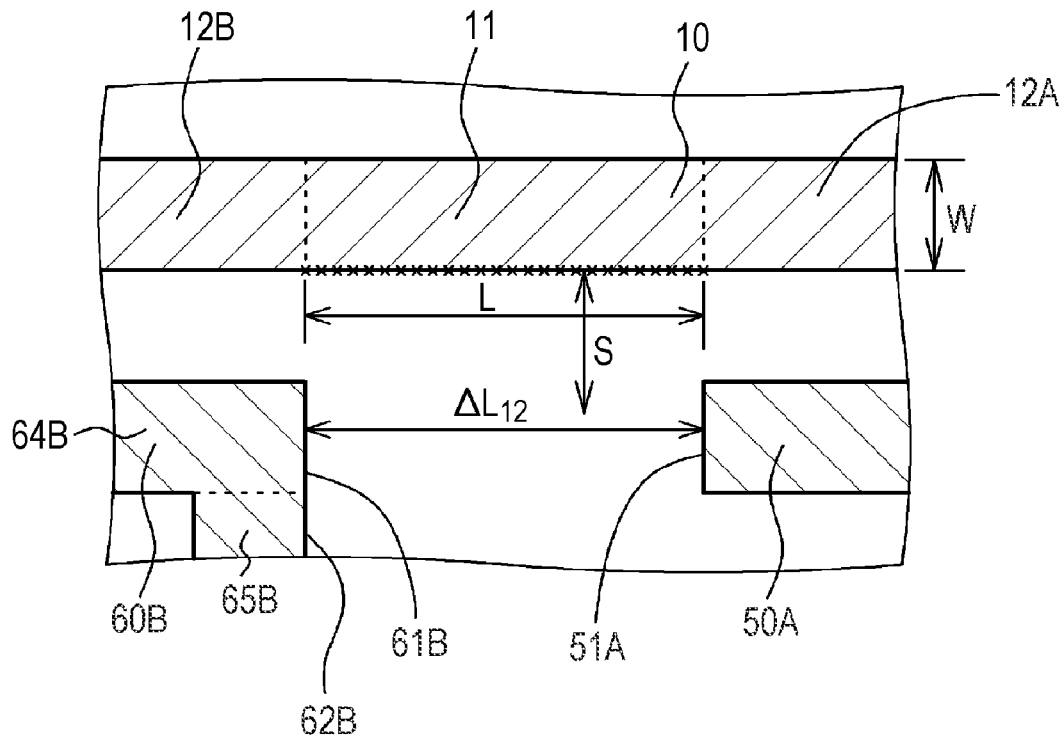
FIG. 7A is a schematic view of an arrangement of an isolated pattern and an adjacent pattern for illustrating the mask pattern correction method.
Figure 7B:
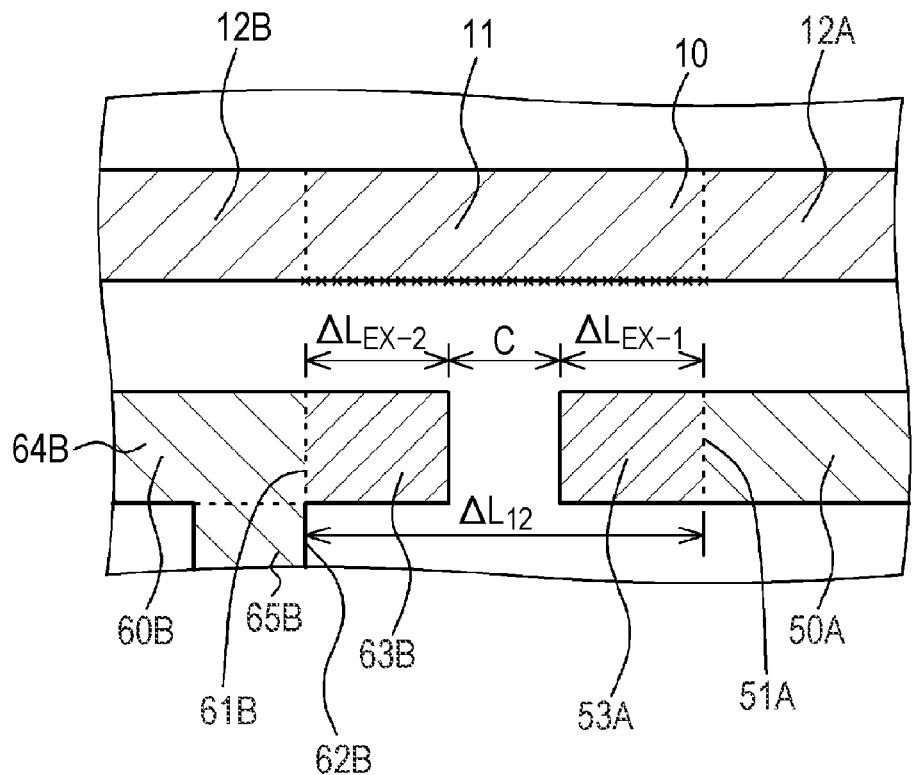
FIG. 7B is a schematic view of an arrangement of an isolated pattern and an adjacent pattern when an extended portion is provided to the adjacent pattern shown in FIG. 7A.
Figure 8A:
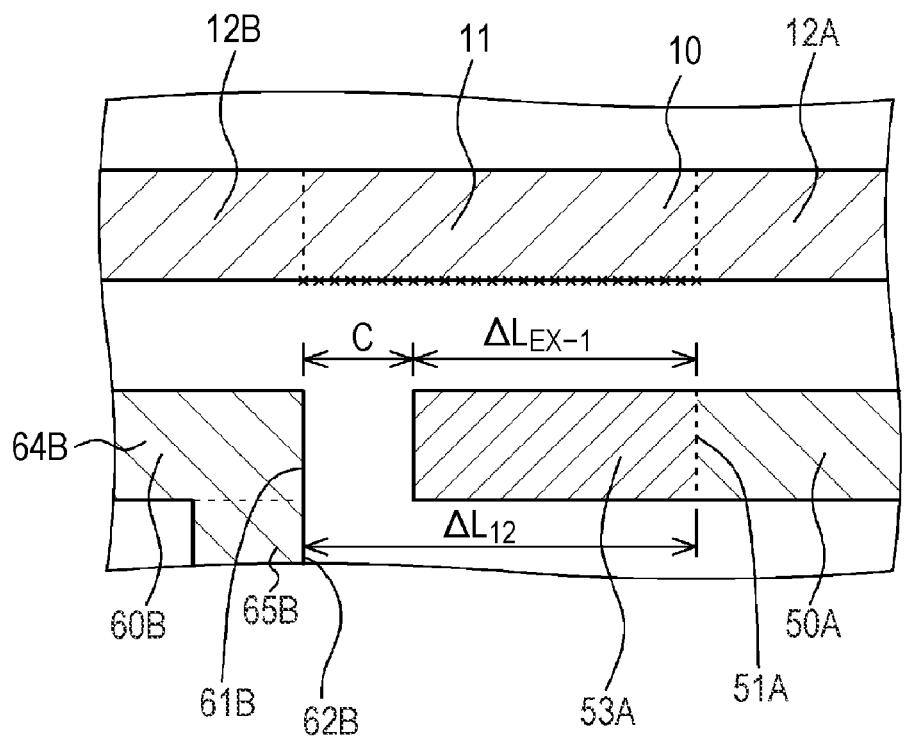
FIGS. 8A and 8B are schematic views of the modifications of an arrangement of an isolated pattern and an adjacent pattern when an extended portion is provided to the adjacent pattern shown in FIG. 7A.
Figure 8B:
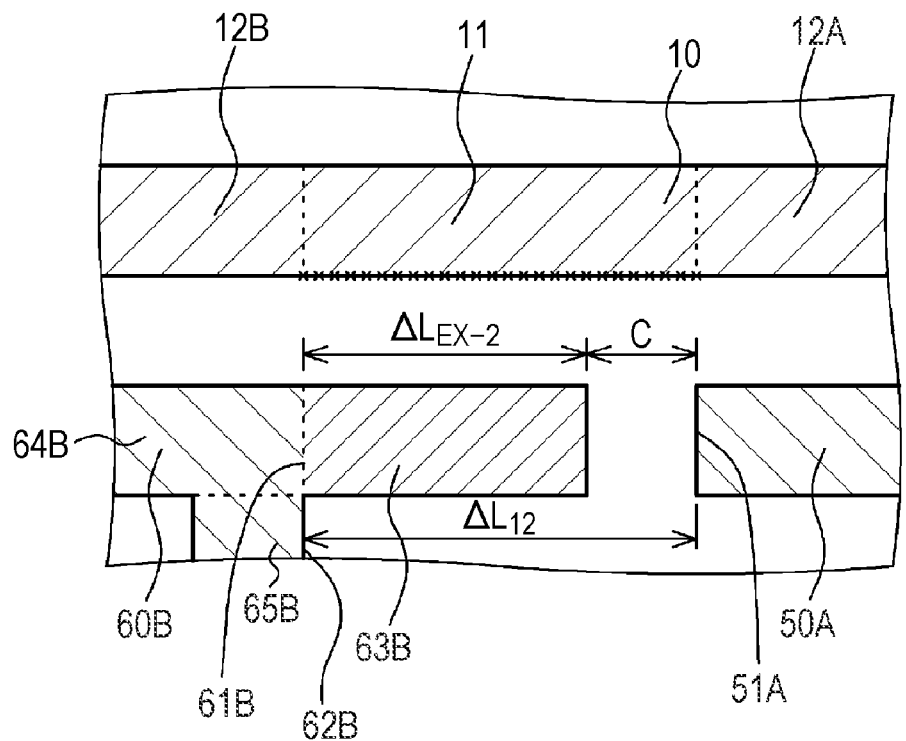
Figure 10A:
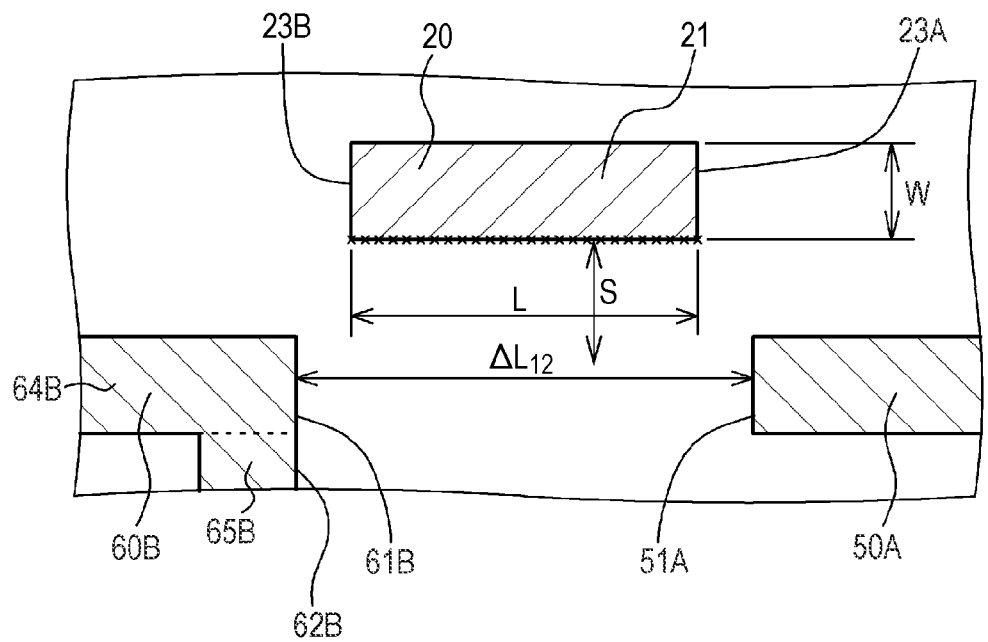
FIG. 10A is a schematic view of an arrangement of an isolated pattern and an adjacent pattern for illustrating the mask pattern correction method.
Figure 10B:
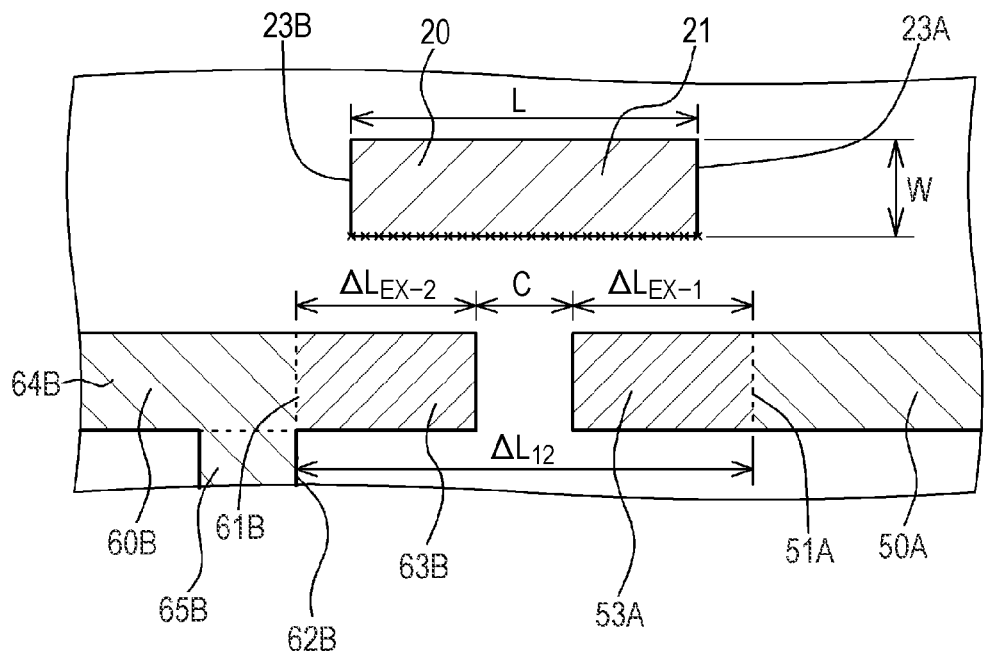
FIG. 10B is a schematic view of an arrangement of an isolated pattern and an adjacent pattern when an extended portion is provided to the adjacent pattern shown in FIG. 10A.
Figure 11A:
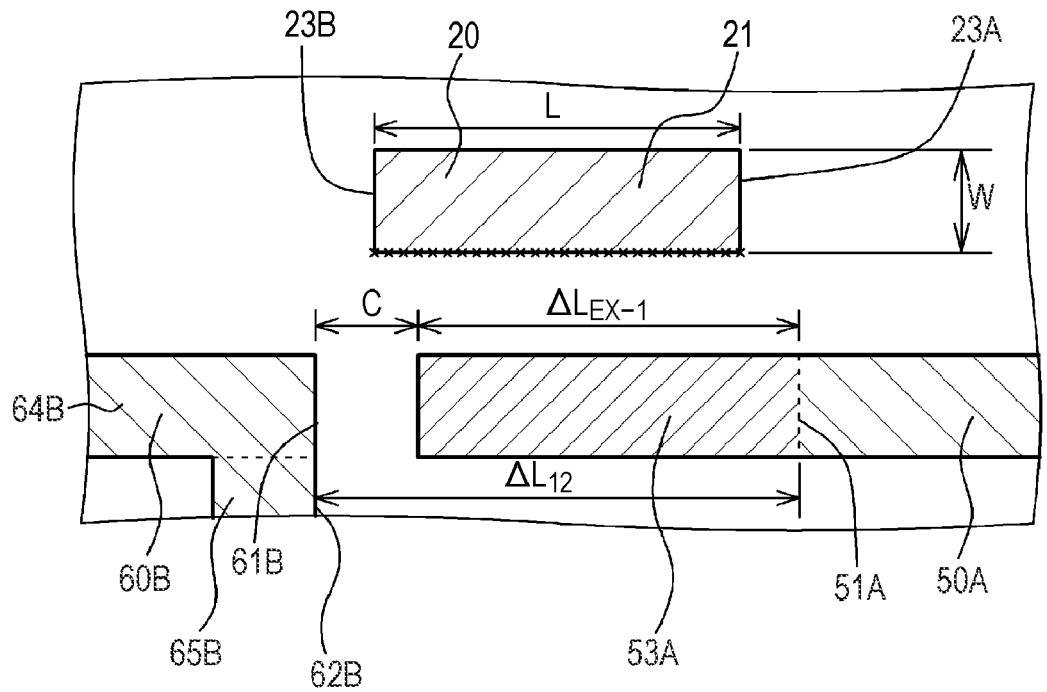
FIGS. 11A and 11B are schematic views of the modifications of an arrangement of an isolated pattern and an adjacent pattern when an extended portion is provided to the adjacent pattern shown in FIG. 10A.
Figure 11B:
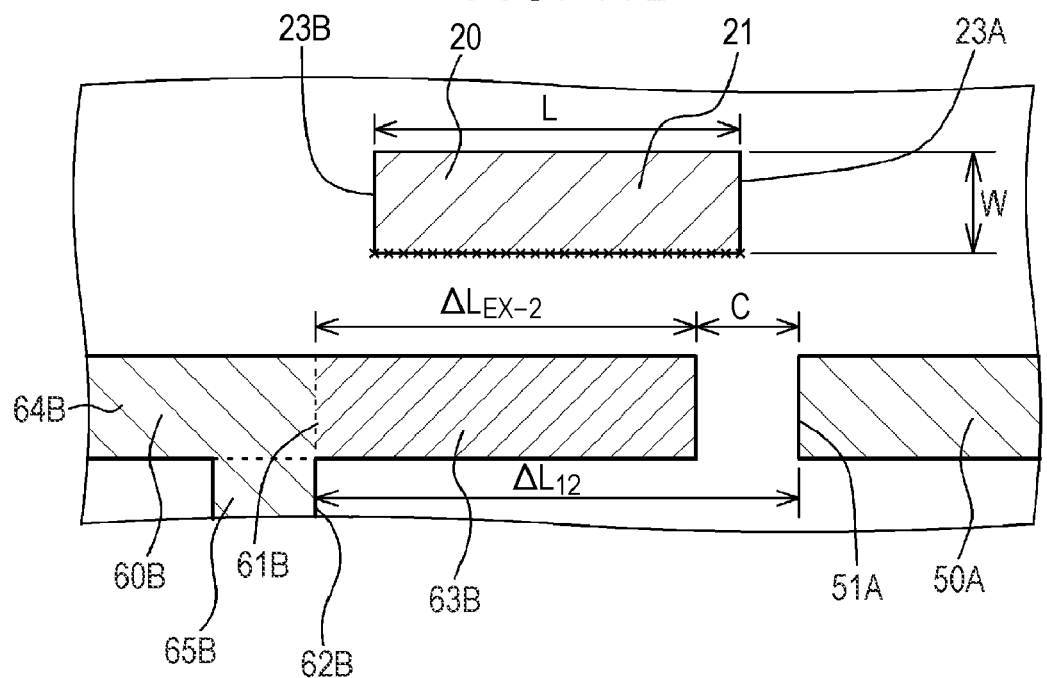
Figure 12A:
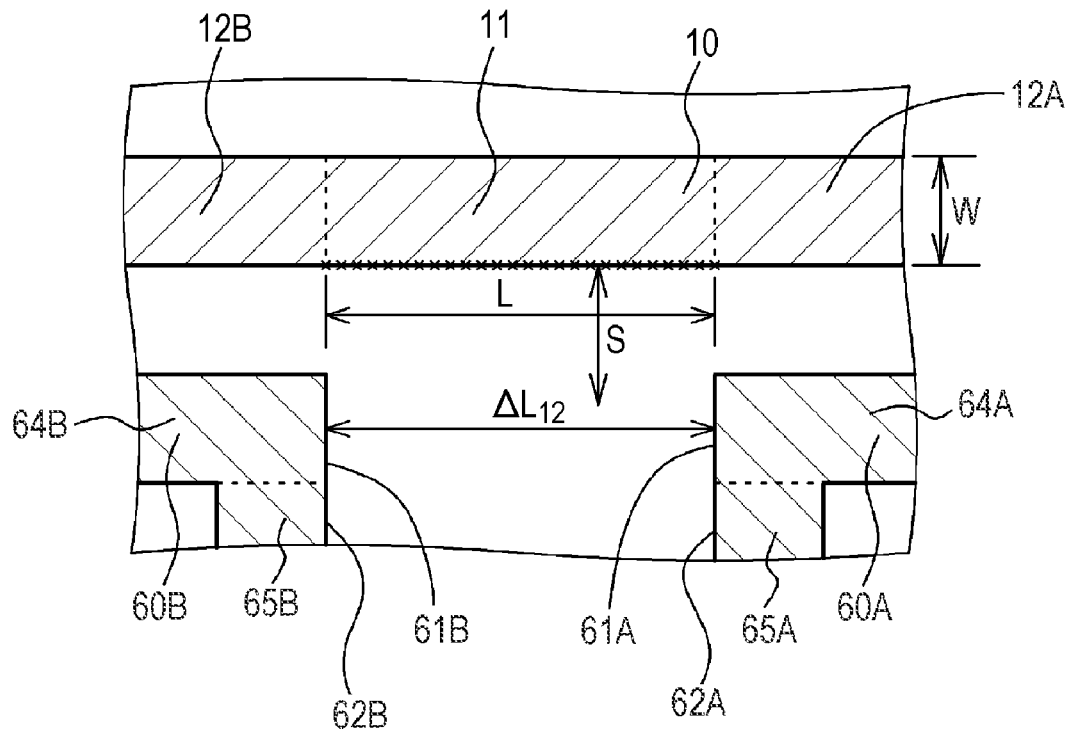
FIG. 12A is a schematic view of an arrangement of an isolated pattern and an adjacent pattern for illustrating the mask pattern correction method.
Figure 12B:
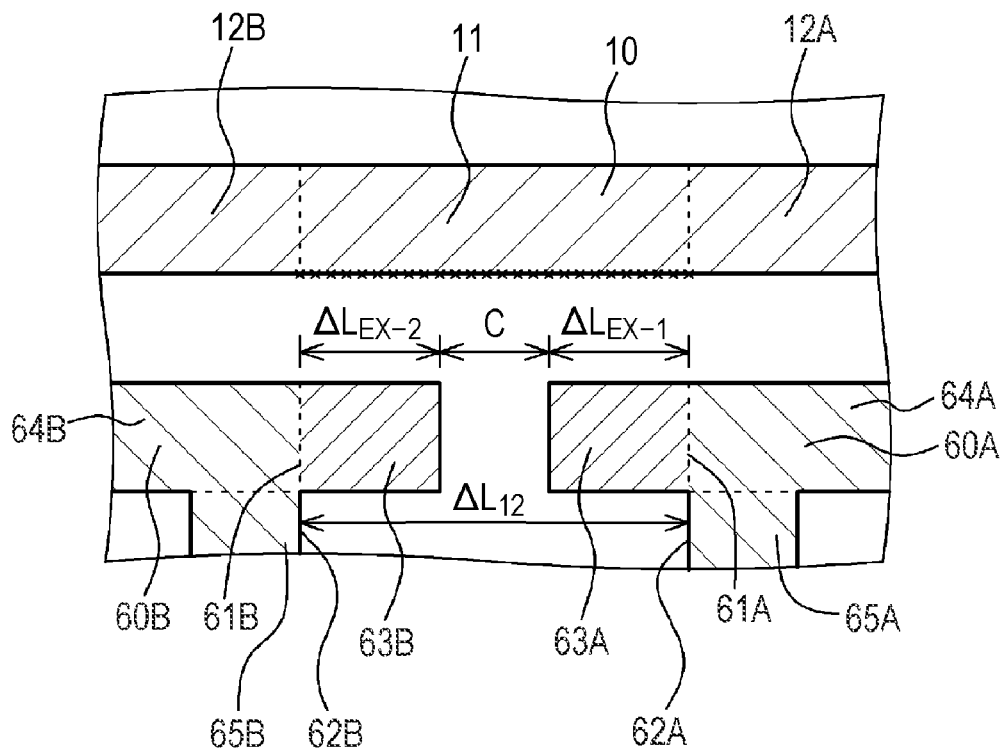
FIG. 12B is a schematic view of an arrangement of an isolated pattern and an adjacent pattern when an extended portion is provided to the adjacent pattern shown in FIG. 12A.
Figure 13A:
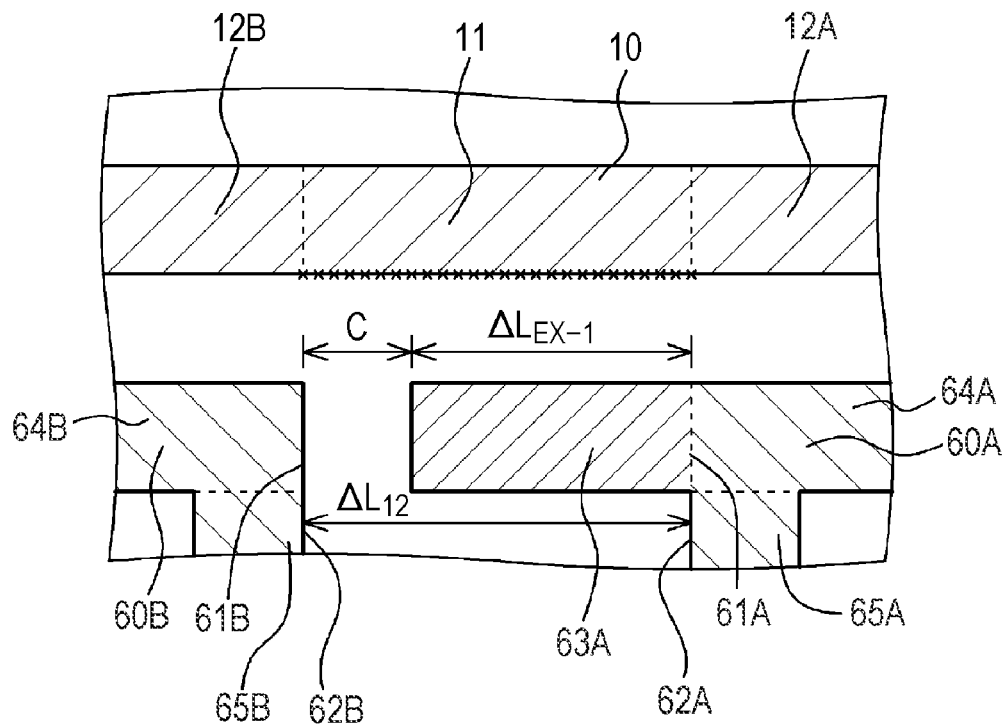
FIGS. 13A and 13B are schematic views of the modifications of an arrangement of an isolated pattern and an adjacent pattern when an extended portion is provided to the adjacent pattern shown in FIG. 12A.
Figure 13B:
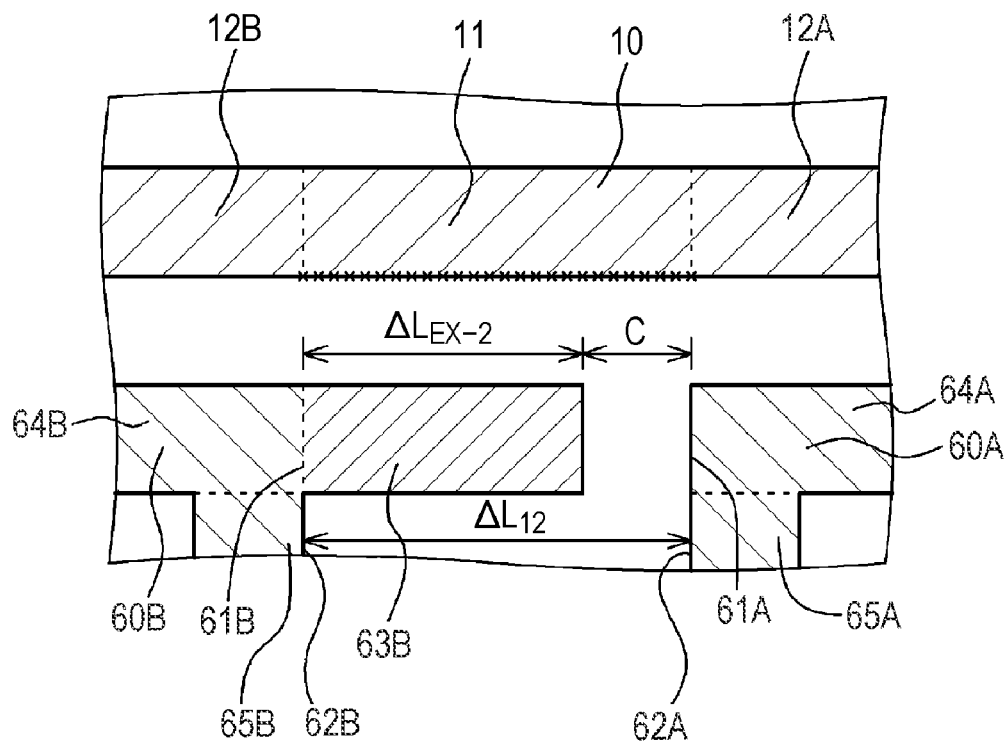
Figure 14A:
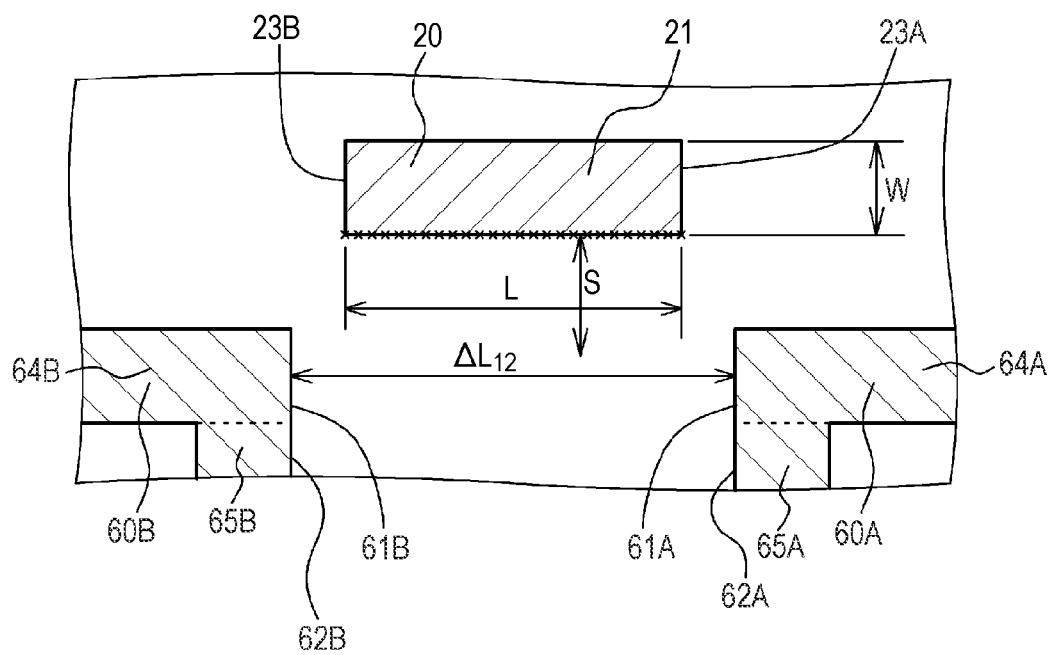
FIG. 14A is a schematic view of an arrangement of an isolated pattern and an adjacent pattern for illustrating the mask pattern correction method.
Figure 14B:
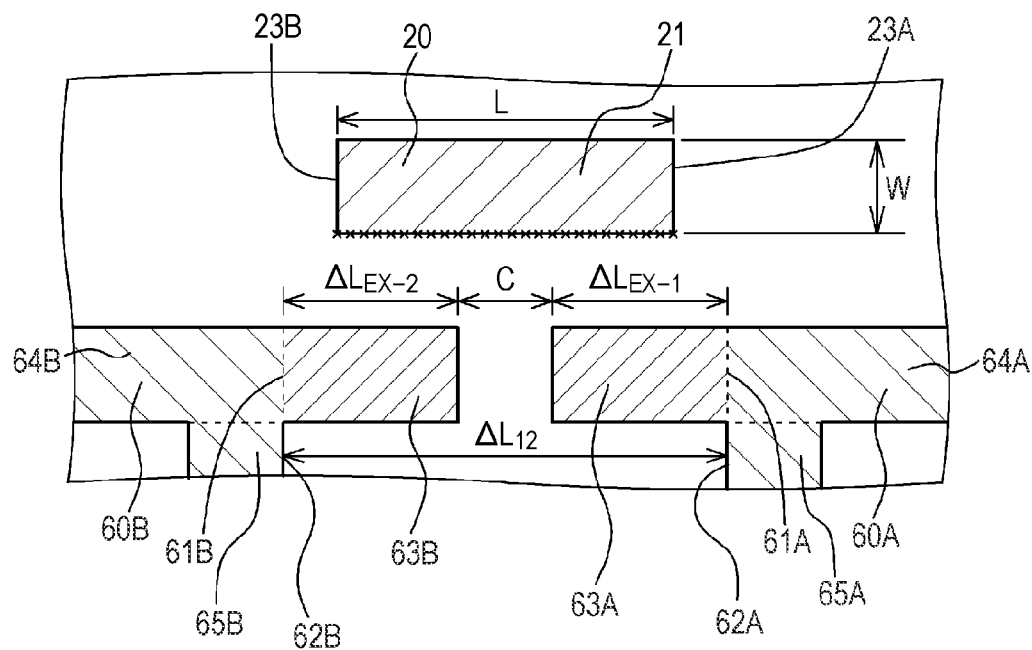
FIG. 14B is a schematic view of an arrangement of an isolated pattern and an adjacent pattern when an extended portion is provided to the adjacent pattern shown in FIG. 14A.
Figure 15A:
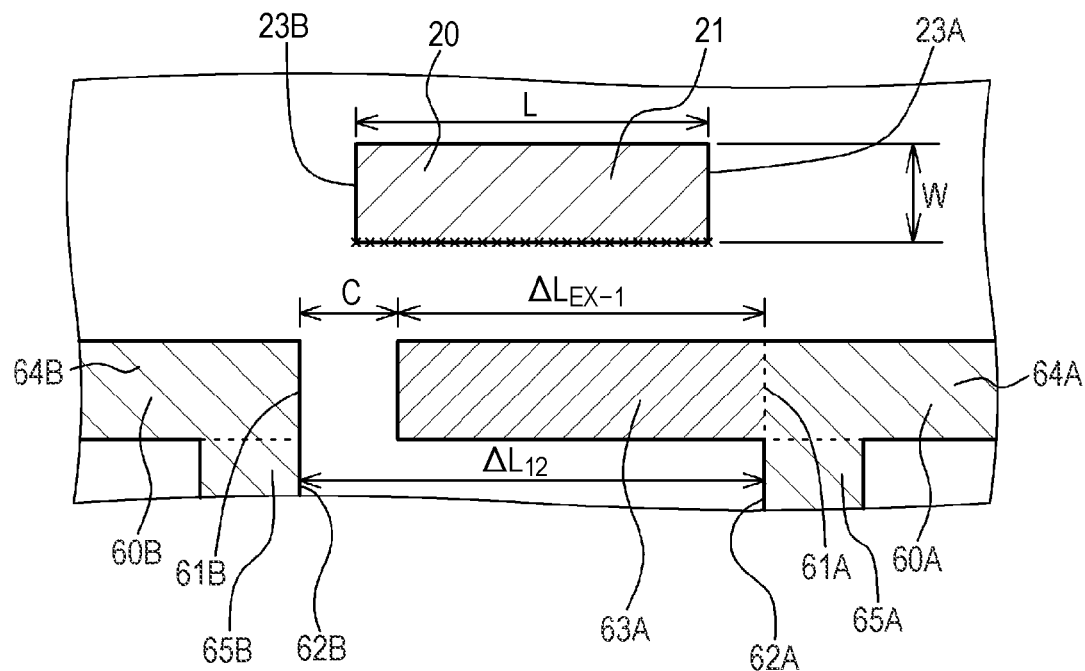
FIGS. 15A and 15B are schematic views of the modifications of an arrangement of an isolated pattern and an adjacent pattern when an extended portion is provided to the adjacent pattern shown in FIG. 14A.
Figure 15B:
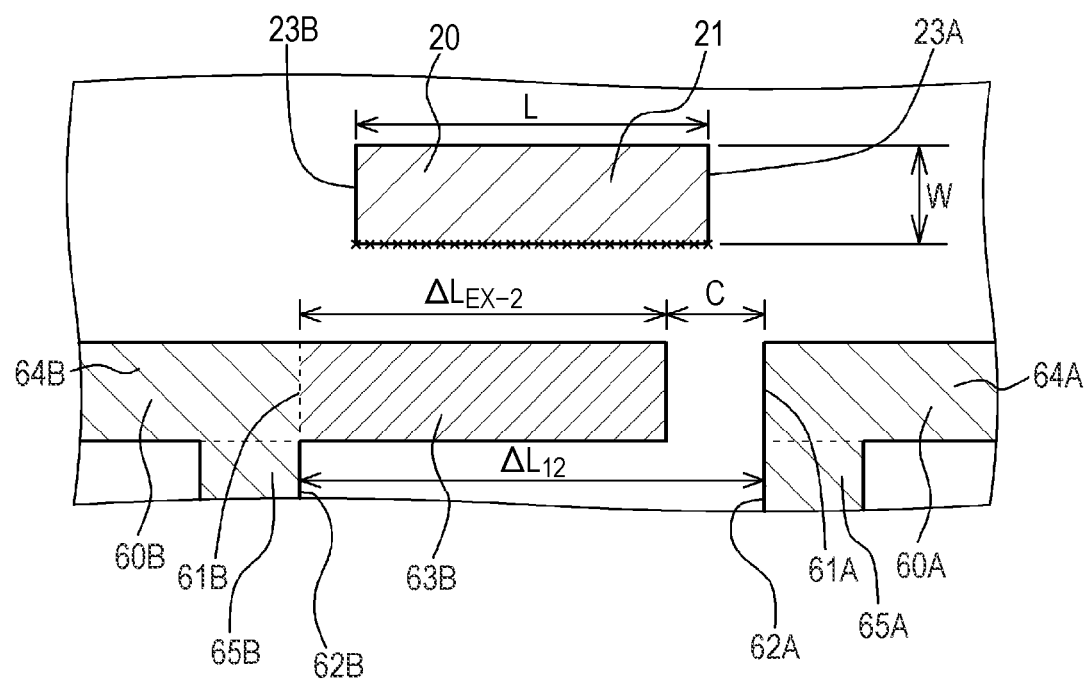
Figure 16A:
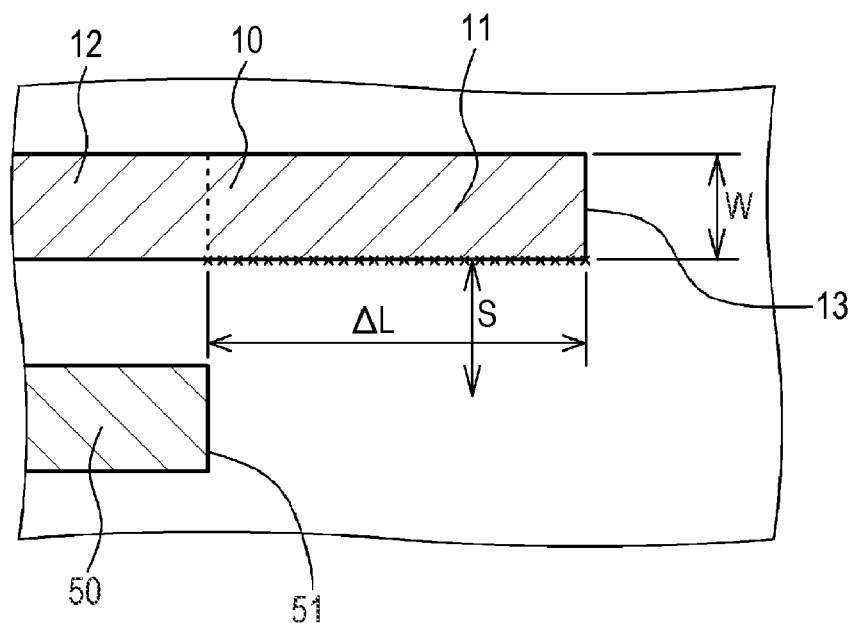
FIG. 16A is a schematic view of an arrangement of an isolated pattern and an adjacent pattern for illustrating the mask pattern correction method.
Figure 16B:
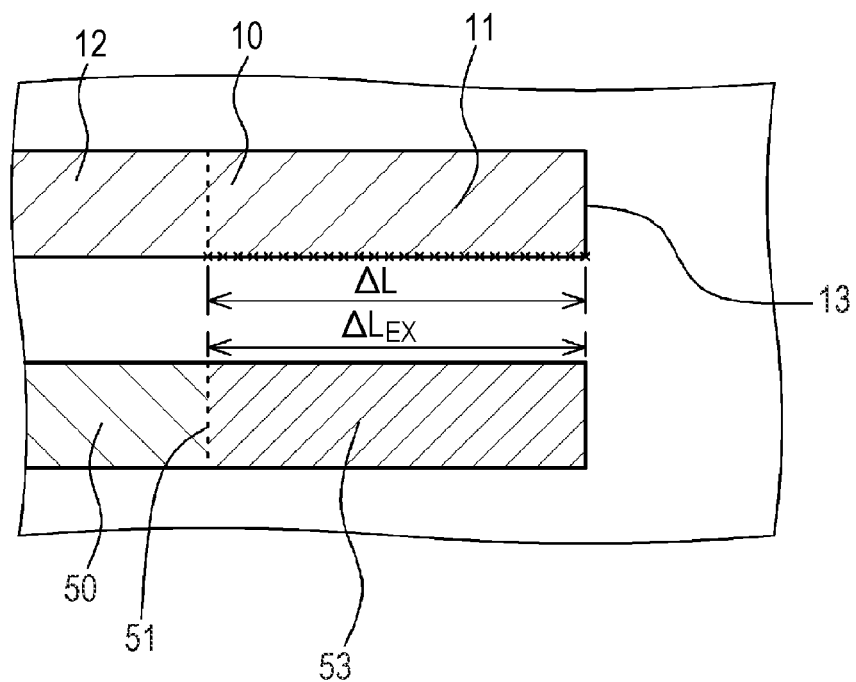
FIG. 16B is a schematic view of an arrangement of an isolated pattern and an adjacent pattern when an extended portion is provided to the adjacent pattern shown in FIG. 16A.
Figure 17A:
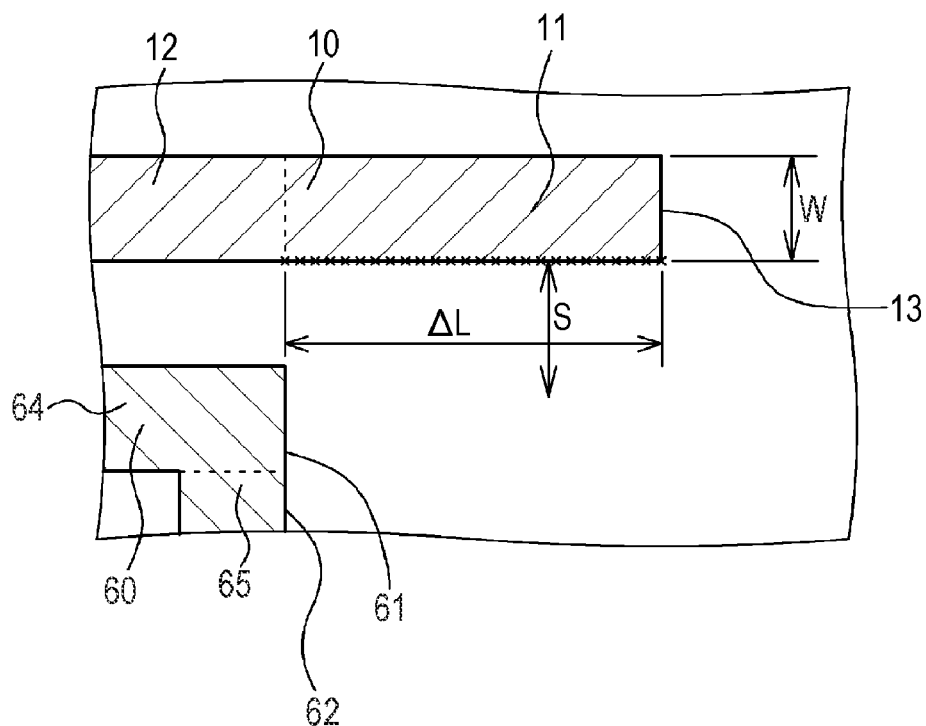
FIG. 17A is a schematic view of an arrangement of an isolated pattern and an adjacent pattern for illustrating the mask pattern correction method.
Figure 17B:
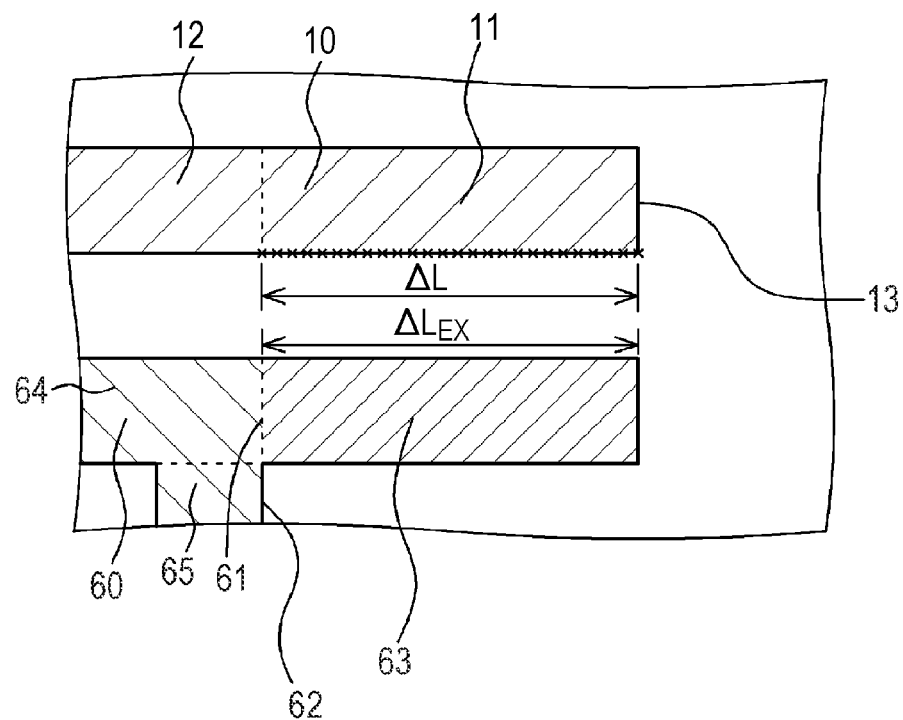
FIG. 17B is a schematic view of an arrangement of an isolated pattern and an adjacent pattern when an extended portion is provided to the adjacent pattern shown in FIG. 17A.
Figure 18A:
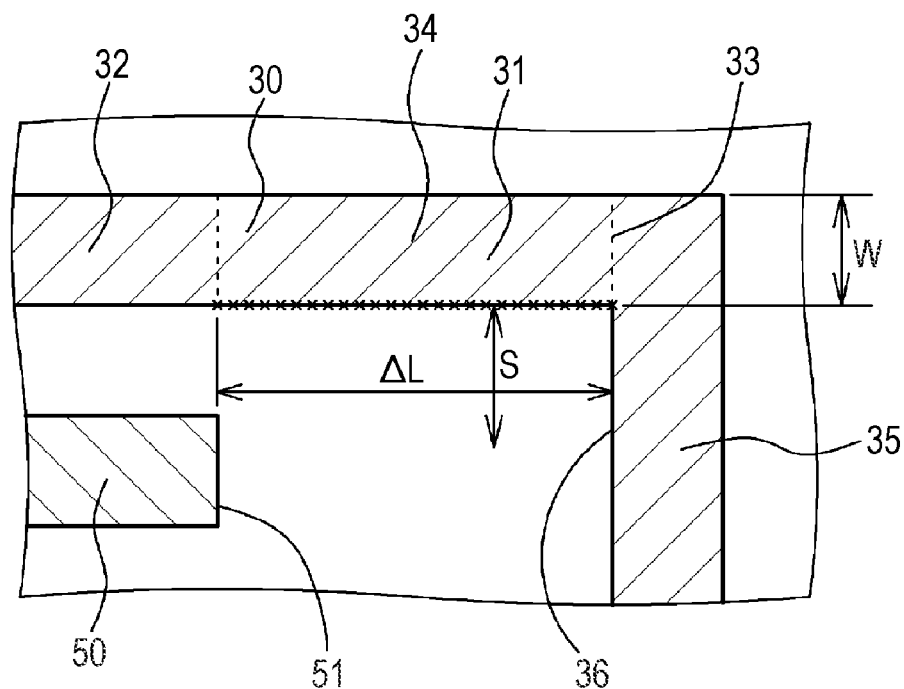
FIG. 18A is a schematic view of an arrangement of an isolated pattern and an adjacent pattern for illustrating the mask pattern correction method.
Figure 18B:
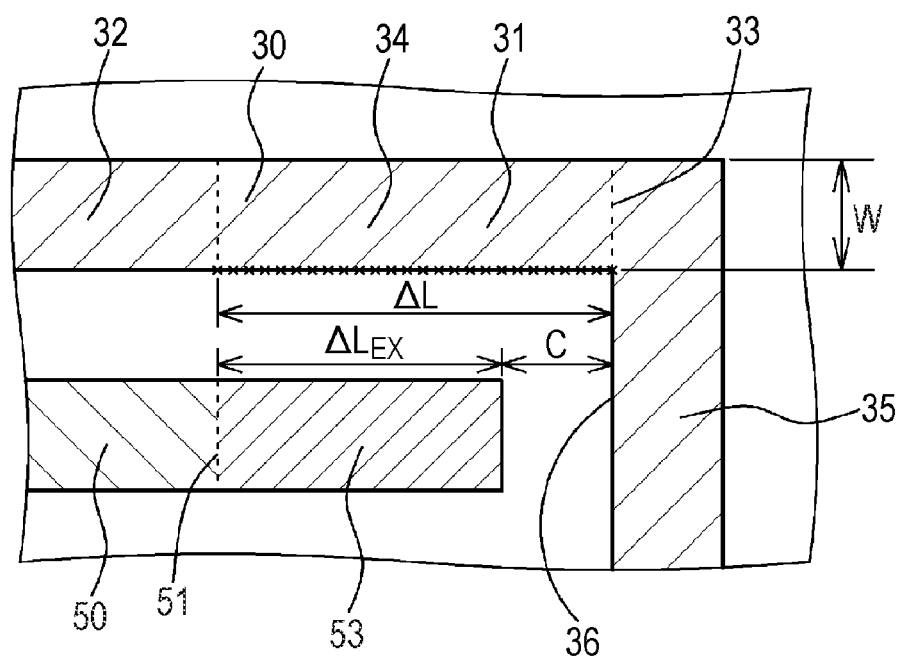
FIG. 18B is a schematic view of an arrangement of an isolated pattern and an adjacent pattern when an extended portion is provided to the adjacent pattern shown in FIG. 18A.
Figure 19A:
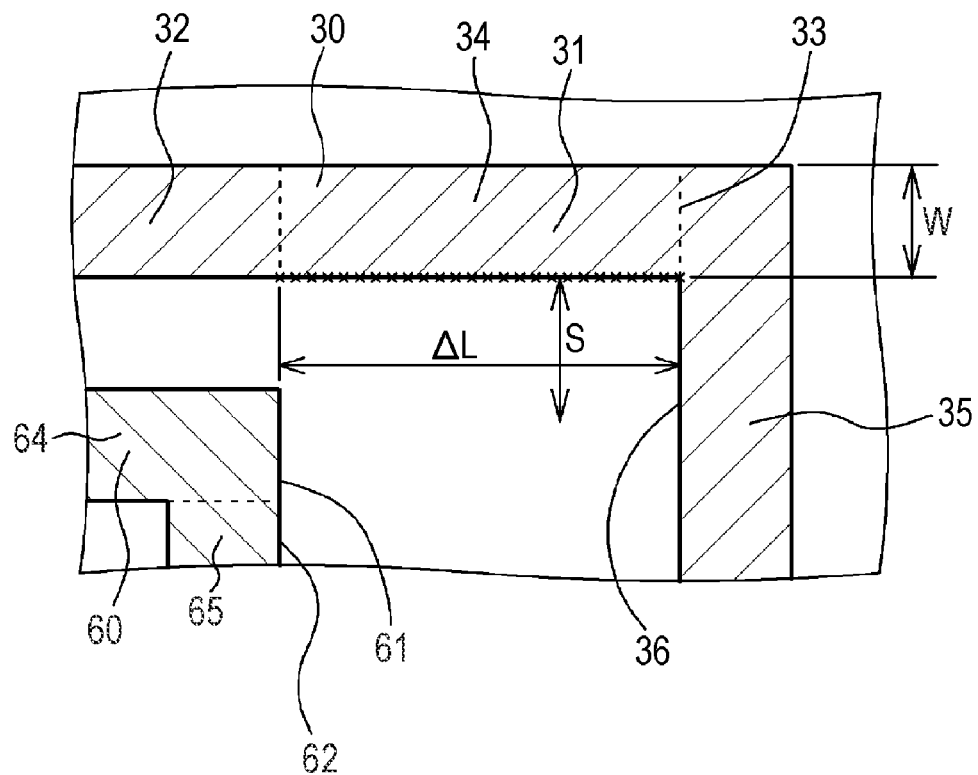
FIG. 19A is a schematic view of an arrangement of an isolated pattern and an adjacent pattern for illustrating the mask pattern correction method.
Figure 19B:
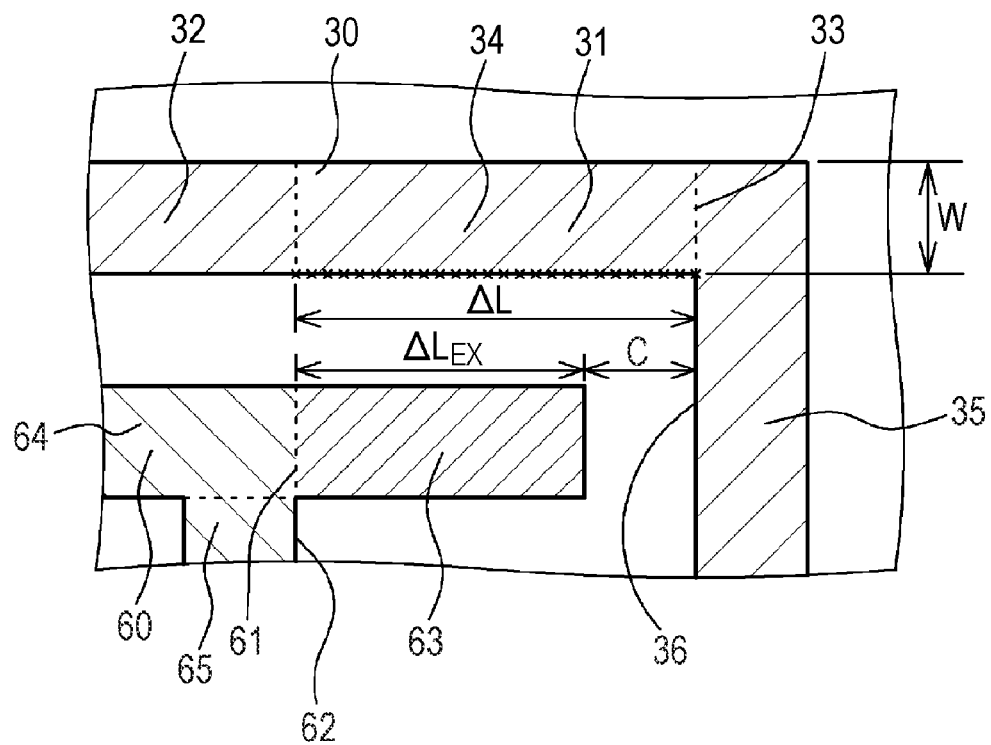
FIG. 19B is a schematic view of an arrangement of an isolated pattern and an adjacent pattern when an extended portion is provided to the adjacent pattern shown in FIG. 19A.
Figure 20A:
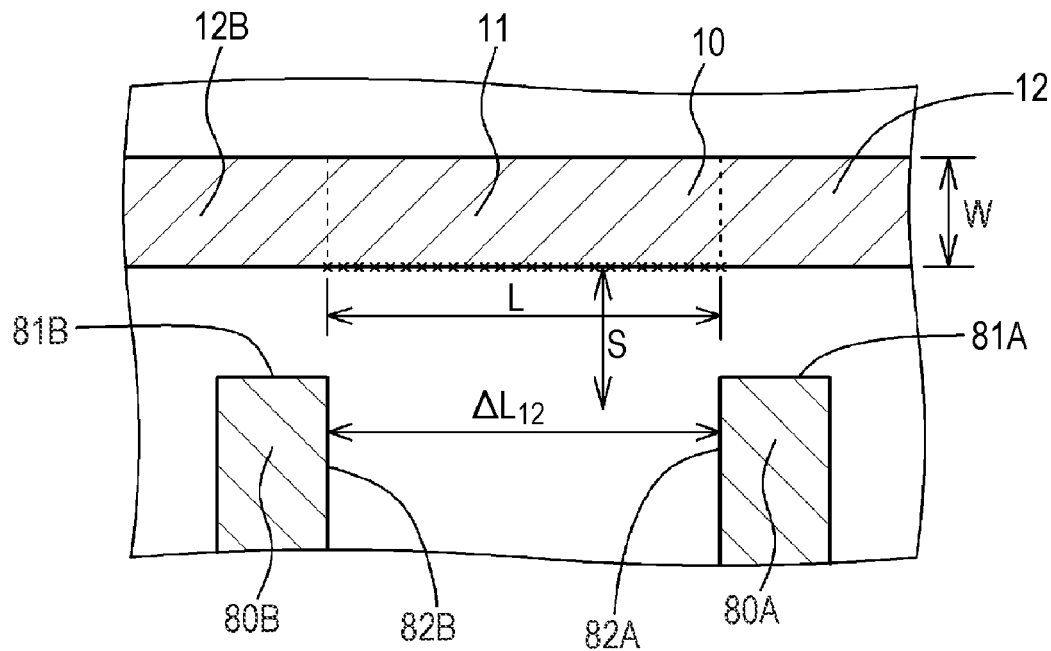
FIG. 20A is a schematic view of an arrangement of an isolated pattern and an adjacent pattern for illustrating the mask pattern correction method.
Figure 20B:
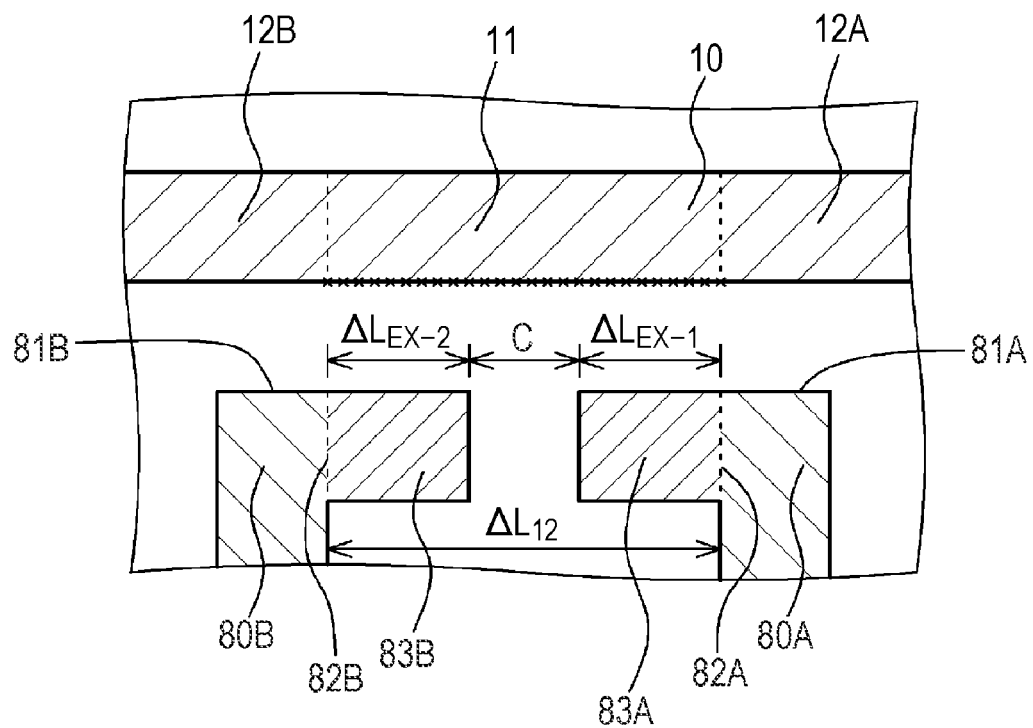
FIG. 20B is a schematic view of an arrangement of an isolated pattern and an adjacent pattern when an extended portion is provided to the adjacent pattern shown in FIG. 20A.
Figure 21A:
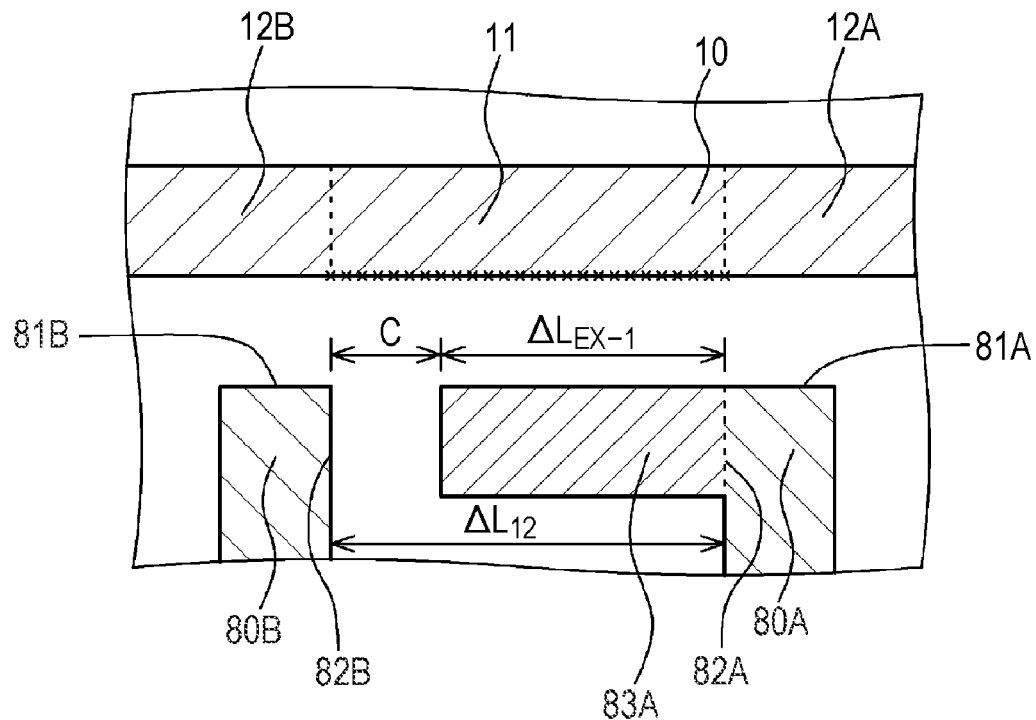
FIGS. 21A and 21B are schematic views of the modifications of an arrangement of an isolated pattern and an adjacent pattern when an extended portion is provided to the adjacent pattern shown in FIG. 20A.
Figure 21B:
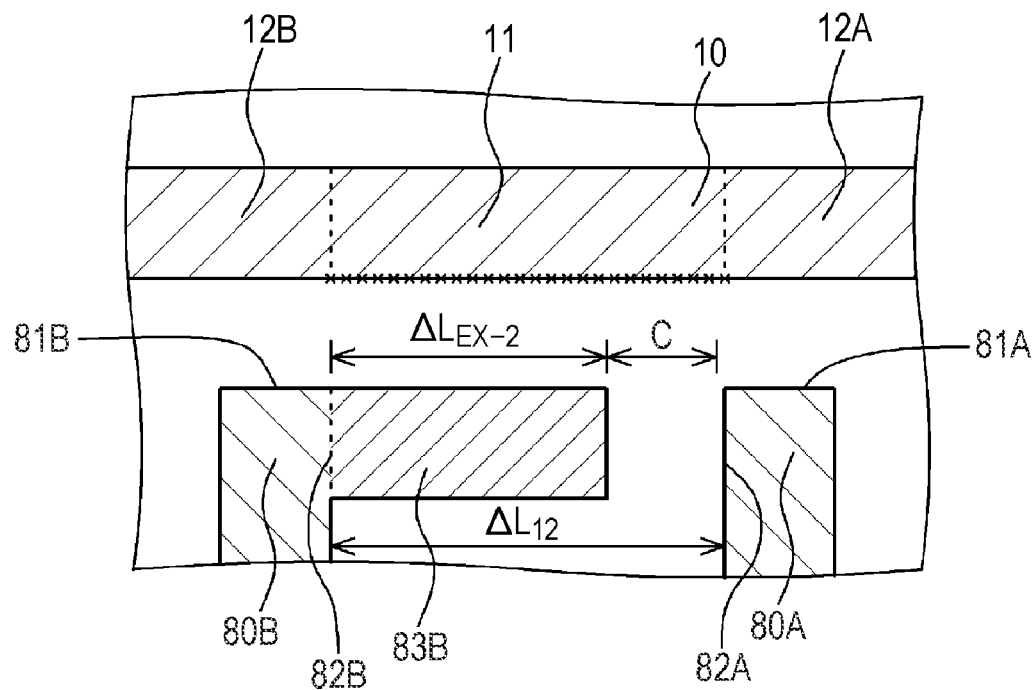
Figure 22A:
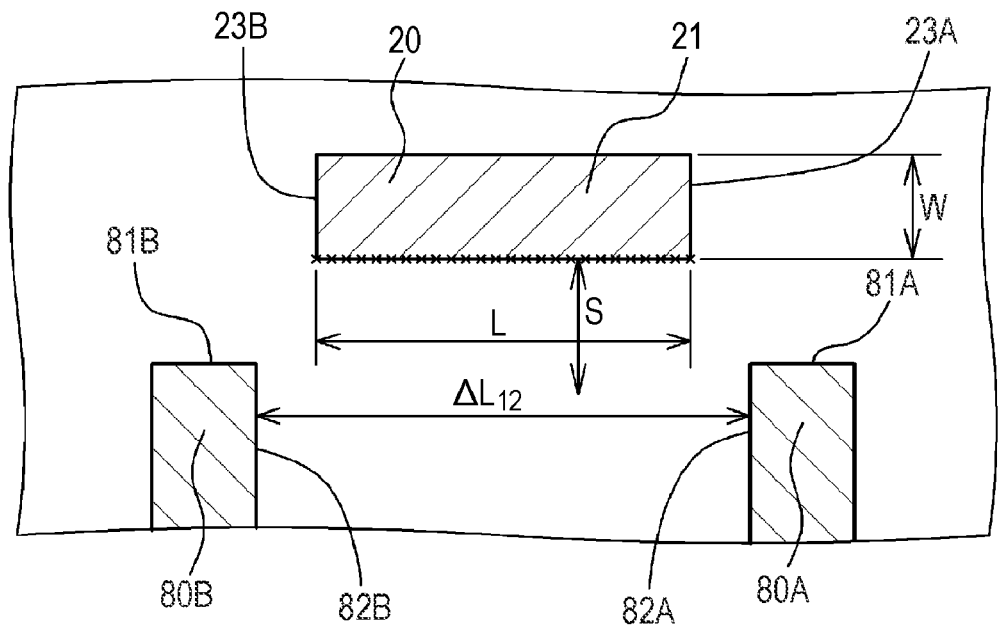
FIG. 22A is a schematic view of an arrangement of an isolated pattern and an adjacent pattern for illustrating the mask pattern correction method.
Figure 22B:
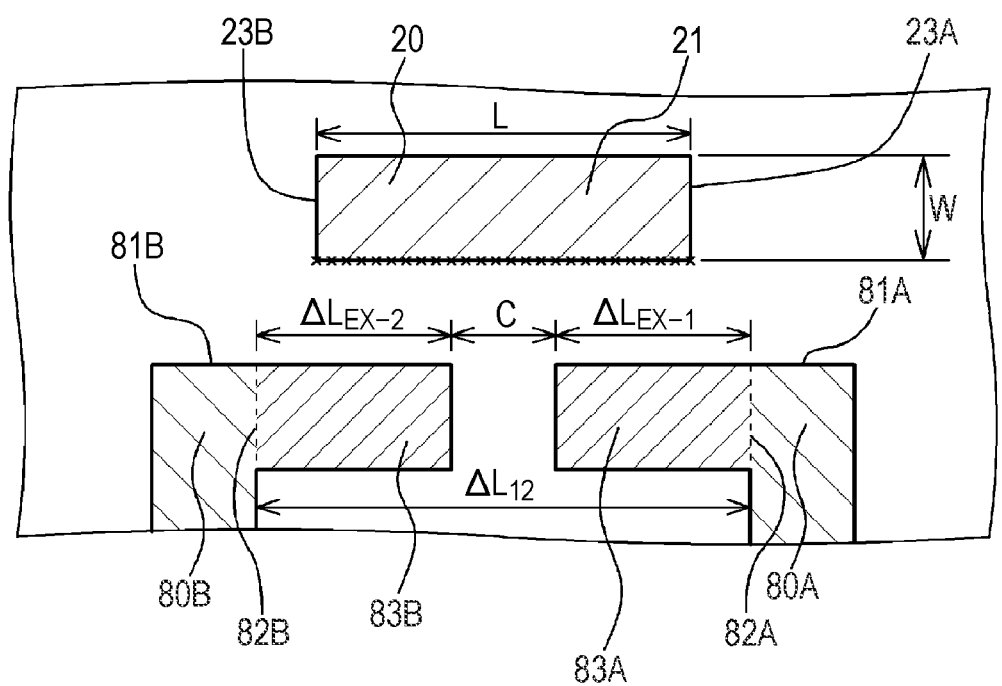
FIG. 22B is a schematic view of an arrangement of an isolated pattern and an adjacent pattern when an extended portion is provided to the adjacent pattern shown in FIG. 22A.
Figure 24A:
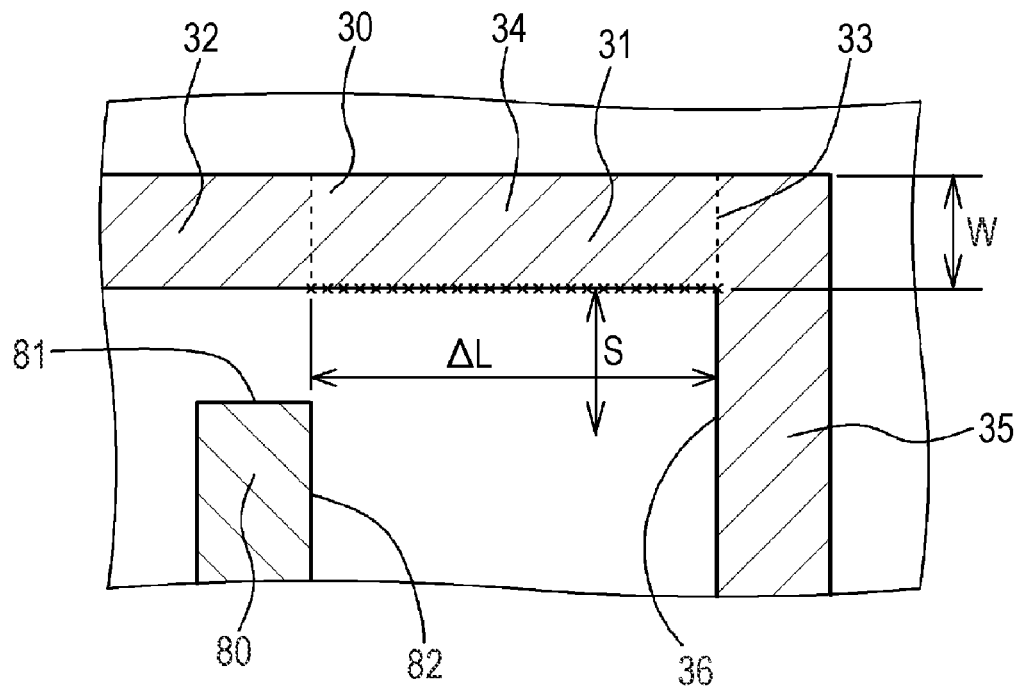
FIG. 24A is a schematic view of an arrangement of an isolated pattern and an adjacent pattern for illustrating the mask pattern correction method.
Figure 24B:
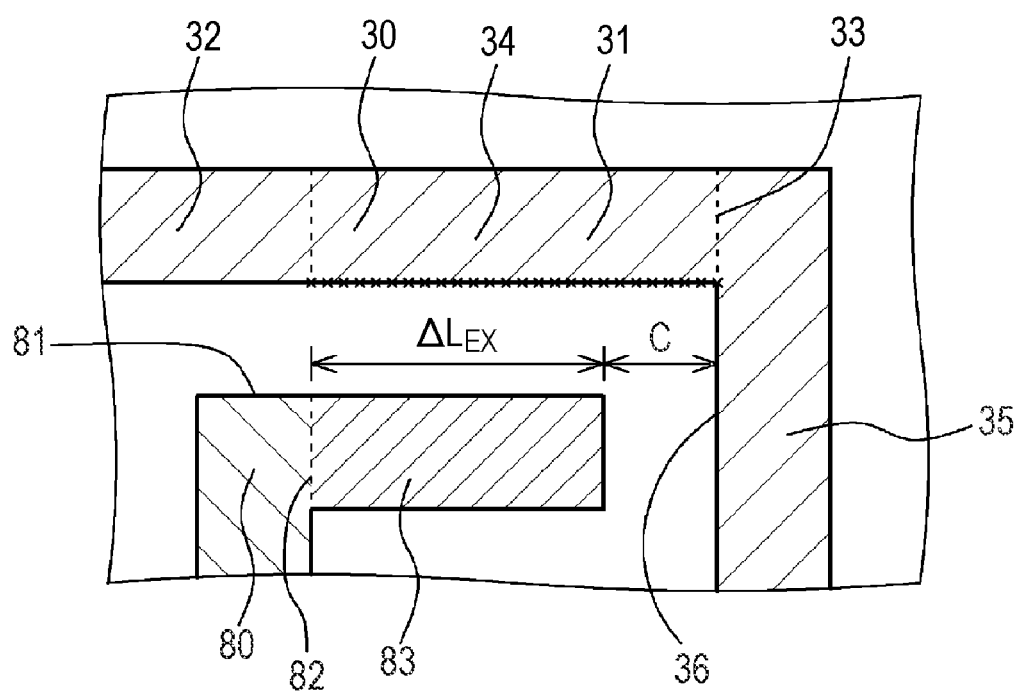
FIG. 24B is a schematic view of an arrangement of an isolated pattern and an adjacent pattern when an extended portion is provided to the adjacent pattern shown in FIG. 24A.
Figure 25A:
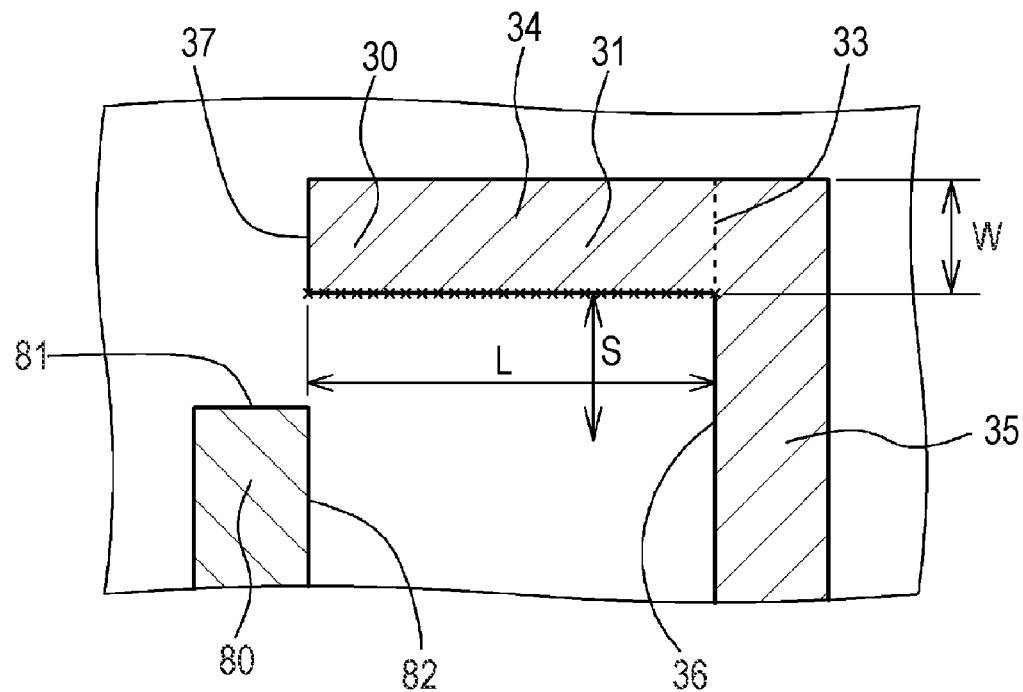
FIG. 25A is a schematic view of an arrangement of an isolated pattern and an adjacent pattern for illustrating the mask pattern correction method.
Figure 25B:
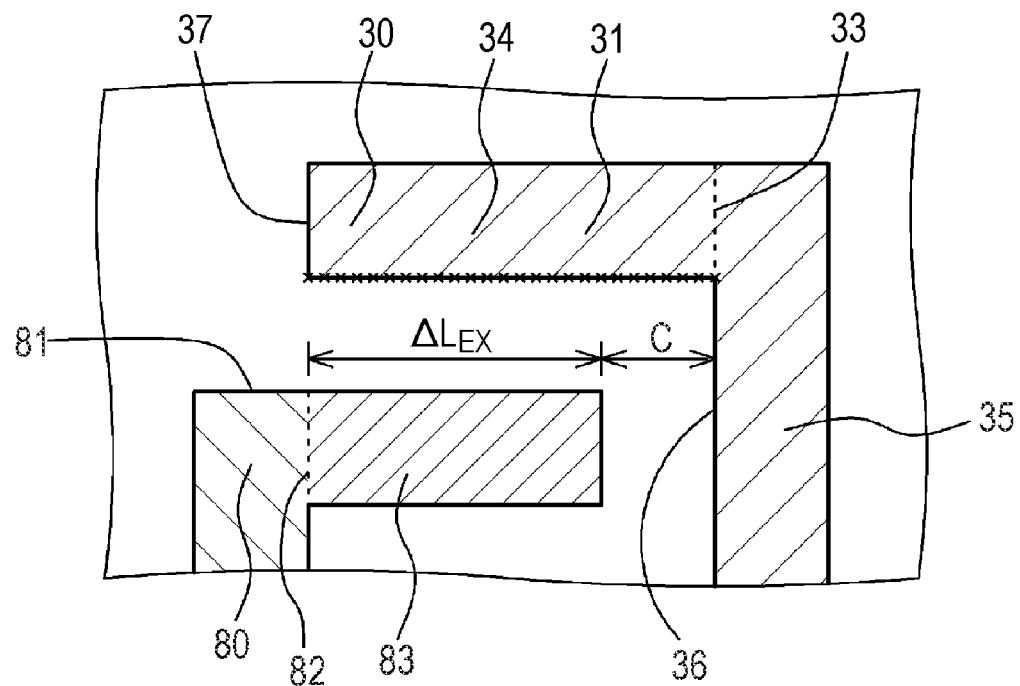
FIG. 25B is a schematic view of an arrangement of an isolated pattern and an adjacent pattern when an extended portion is provided to the adjacent pattern shown in FIG. 25A.

| Structure ID | Arrangement of isolated pattern & adjacent pattern | Arrangement of isolated pattern & adjacent pattern having extended portions | | |
|---|---|---|---|---|
| Mask pattern correction method according to a first aspect of the present invention | | | | |
| 1A-1 | FIG. 2A | FIG. 2B | FIG. 3A | FIG. 3B |
| 1A-1 | FIG. 4A | FIG. 4B | | |
| 1B-1 | FIG. 5A | FIG. 5B | FIG. 6A | FIG. 6B |
| 1A-2 | FIG. 7A | FIG. 7B | FIG. 8A | FIG. 8B |
| 1A-2 | FIG. 9A | FIG. 9B | | |
| 1B-2 | FIG. 10A | FIG. 10B | FIG. 11A | FIG. 11B |
| 1A-3 | FIG. 12A | FIG. 12B | FIG. 13A | FIG. 13B |
| 1B-3 | FIG. 14A | FIG. 14B | FIG. 15A | FIG. 15B |
| 1C-1 | FIG. 16A | FIG. 16B | | |
| 1C-2 | FIG. 17A | FIG. 17B | | |
| 1D-1 | FIG. 18A | FIG. 18B | | |
| 1D-2 | FIG. 19A | FIG. 19B | | |
| Mask pattern correction method according to a second aspect of the present invention | | | | |
| 2A | FIG. 20A | FIG. 20B | FIG. 21A | FIG. 21B |
| 2A | FIG. 22A | FIG. 22B | FIG. 23A | FIG. 23B |
| 2B | FIG. 24A | FIG. 24B | | |
| 2B | FIG. 25A | FIG. 25B | | |

According to the first embodiment, a method for correcting a mask pattern to be formed on a photomask used in a photolithographic step of a semiconductor device fabrication process is described. In this method, an isolated pattern, which has an optically isolated portion, is extracted from a mask pattern. Subsequently, in an adjacent pattern extending parallel to the isolated portion of the isolated pattern and having a terminal end, an extended portion extending from the terminal end is provided next to the isolated portion of the isolated pattern in the direction in which the isolated portion of the isolated pattern extends. Alternatively, an isolated pattern, which has an isolated portion optically isolated, is extracted from a mask pattern again. Thereafter, in a straight adjacent pattern extending perpendicular to the isolated pattern and having a terminal end and a terminal end edge extending from the terminal end, an extended portion extending from the terminal end edge is provided next to the isolated portion of the isolated pattern in the direction in which the isolated portion of the isolated pattern extends.

In the first embodiment, the isolated portion of the isolated pattern has a width of W, which is less than or equal to a predetermined width $W_0$, and has a length of L, which is less than or equal to a predetermined length $L_0$. In the area within a distance of S from the edge of the isolated portion (an edge with "x"s in the drawing), no adjacent pattern is present. In the first embodiment, 90-nm design rules are employed. The predetermined width $W_0$ is 120 nm, the predetermined length $L_0$ is 360 nm, and the distance S is 120 nm. However, the predetermined width $W_0$, the predetermined length $L_0$, and the distance S are not limited to these values. Additionally, in the first embodiment, a predetermined space length C is determined to be 130 nm. Here, the predetermined space length C is 1.2 times a critical dimension. However, the predetermined space length C is not limited to this value.

A pattern data correction apparatus (including an arrangement and wiring tool) suitable for performing the correction method according to the first embodiment corrects design pattern data including a plurality of design patterns. The pattern data correction apparatus includes:
(a) input means for inputting design pattern data;
(b) correction means; and
(c) output means for outputting the corrected design pattern data.

The correction means extracts an isolated pattern, which has an optically isolated portion, from the mask pattern. Subsequently, in an adjacent pattern extending parallel to the isolated portion of the isolated pattern and having a terminal end, an extended portion extending from the terminal end is provided next to the isolated portion of the isolated pattern in the direction in which the isolated portion of the isolated pattern extends.

Alternatively, an isolated pattern, which has an isolated portion optically isolated, is extracted from a mask pattern again. Thereafter, in a straight adjacent pattern extending perpendicular to the isolated pattern and having a terminal end and a terminal end edge extending from the terminal end, an extended portion extending from the terminal end edge is provided next to the isolated portion of the isolated pattern in the direction in which the isolated portion of the isolated pattern extends. Here, input means, correction means, and output means function as described above.

The mask pattern correction method according to the first embodiment is described in more detail below with reference to FIGS. 1 to 29. During a mask pattern design stage, the mask pattern correction method according to the first embodiment is performed by using the pattern data correction apparatus (an arrangement and wiring tool). Alternatively, during a photomask fabrication stage, the mask pattern correction method according to the first embodiment is performed before or after the OPC is performed.

Step-100

Firstly, the predetermined width $W_0$, the predetermined length $L_0$, and the distance S are input to the pattern data correction apparatus as design pattern data. The mask pattern data obtained from an optical simulation or a rule base is further input to the pattern data correction apparatus as design pattern data. For example, the predetermined width $W_0$, the predetermined length $L_0$, and the distance S can be input from a keyboard of the pattern data correction apparatus serving as input means. The mask pattern data can be input from a computer storing the optical simulation or the rule base via a local area network (LAN) or a wide area network (WAN) serving as input means.

Step-110

Subsequently, correction means extracts an isolated pattern 10, which is a pattern including an optically isolated portion 11, from a mask pattern stored in storage means of the correction means. A known general-purpose graphic calculation program can perform this extraction. In the first embodiment, a mask pattern having a width W less than or equal to the predetermined width $W_0$ and a length L less than or equal to the predetermined length $L_0$ and having no adjacent pattern within the distance S from the edge of the mask pattern (an edge with "x"s in the drawing) is defined as the isolated pattern 10. Additionally, the portion of the isolated pattern 10 satisfying these conditions is defined as an isolated portion 11. More specifically, an edge of a mask pattern having a width W less than or equal to the predetermined width $W_0$ is extracted. It is then determined whether another mask pattern is present within the distance S from the edge to determine whether or not the mask pattern having this edge is an isolated pattern. If another mask pattern is not present within the distance S from outside the edge and if the length L of the edge is less than or equal to the predetermined length $L_0$, the mask pattern is defined as the isolated pattern 10. The portion having this edge of the isolated pattern 10 is further defined as the isolated portion 11.

Step-120

Figure 26A:
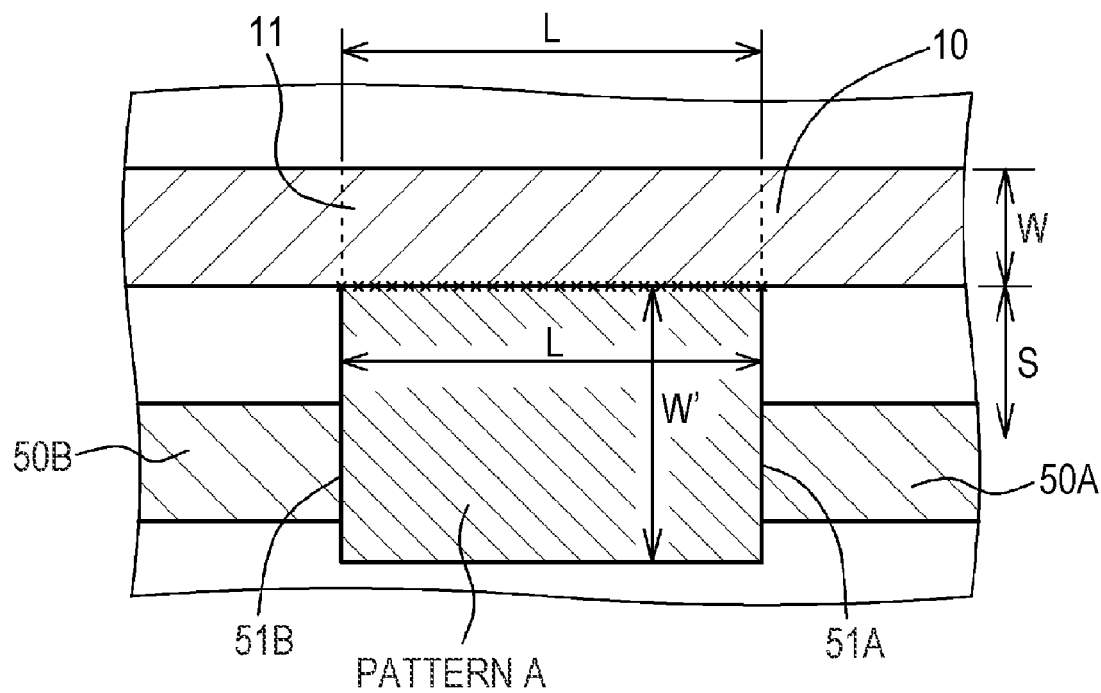
FIGS. 26A and 26B are diagrams illustrating the procedure to provide an extended portion to an adjacent pattern according to the mask pattern correction method.
Figure 26B:
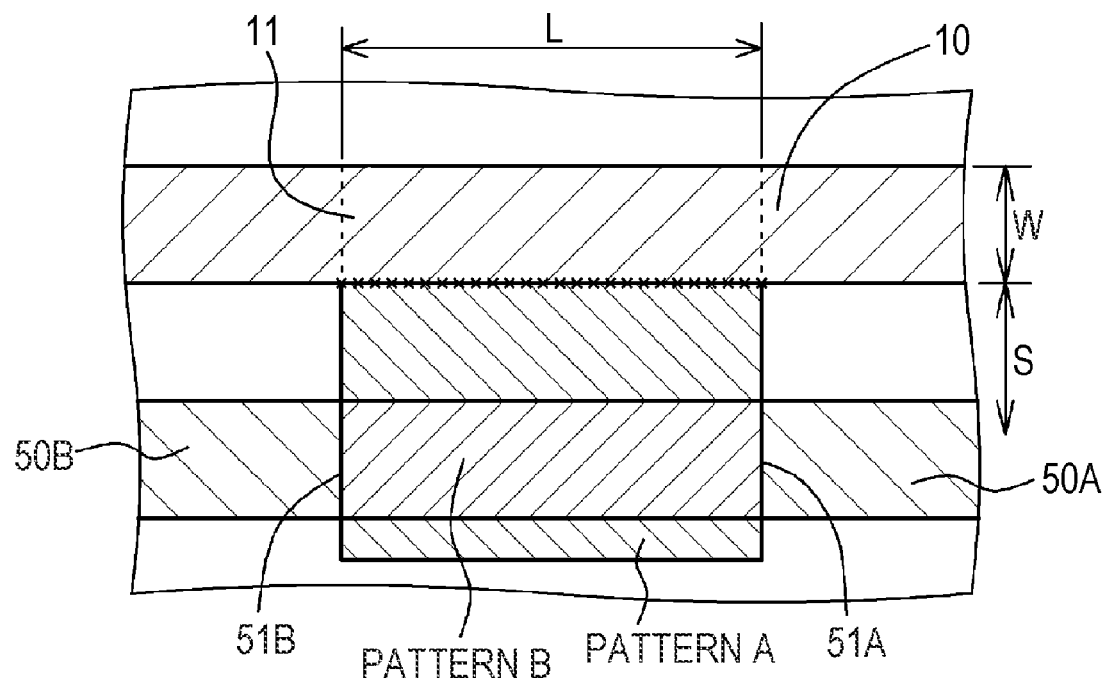
Figure 27:
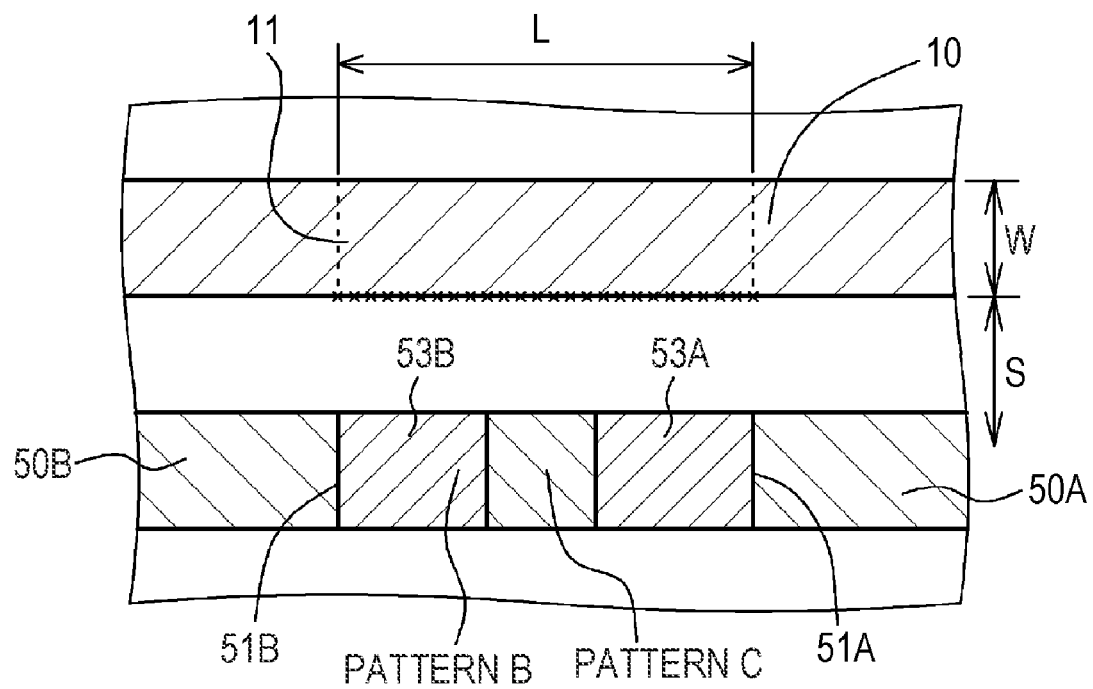
FIG. 27 is a continuation of the diagram of FIG. 26B.
Figure 28A:
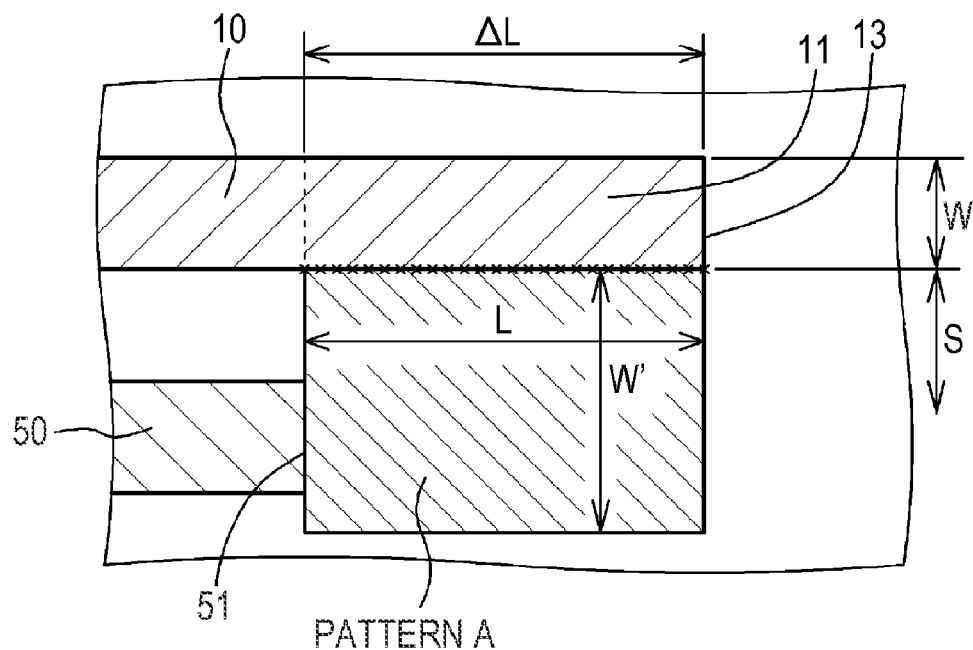
FIGS. 28A and 28B are diagrams illustrating the procedure to provide an extended portion to an adjacent pattern according to the mask pattern correction method.
Figure 28B:
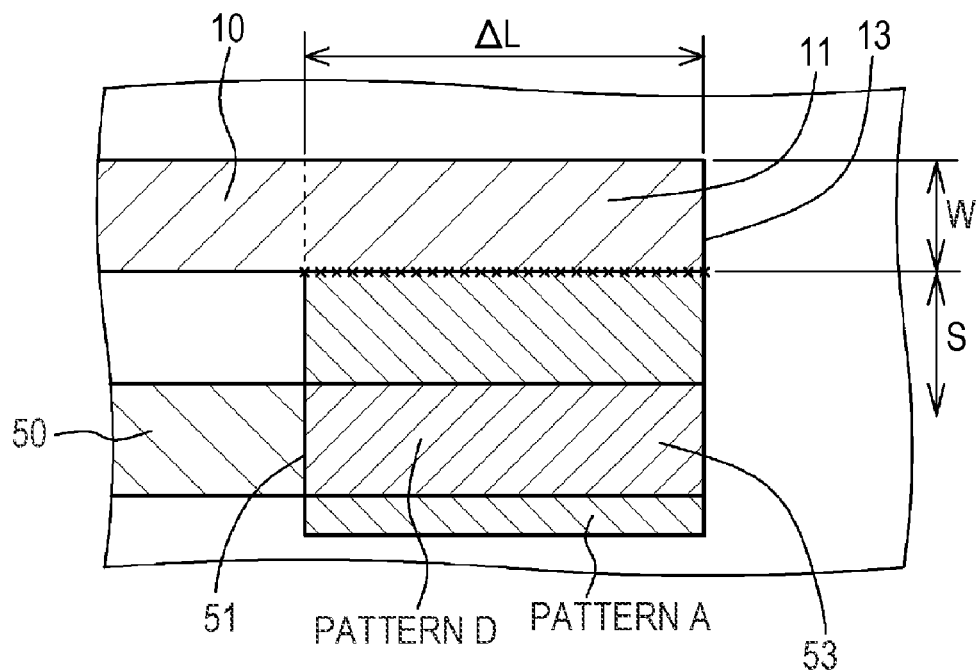

Subsequently, the correction means extracts a mask pattern adjacent to the isolated portion 11 of the isolated pattern 10 as an adjacent pattern. More specifically, as will be described below, for example, for the isolated pattern 10, adjacent patterns 50, 50A, and 50B shown in FIGS. 2A and 16A, a pattern A having a length of L and a width of W' is generated from the edge of the isolated portion 11 of the isolated pattern 10. If the pattern A is in contact with the two adjacent patterns (see FIG. 26A), the "Structure 1A", "Structure 1B", or "Structure 2A" is performed. If the pattern A is in contact with only one adjacent pattern (see FIG. 28A), the "Structure 1C", "Structure 1D", or "Structure 2B" is performed. More specifically, for example, in the example shown in FIG. 2A, as shown in FIG. 26B, a pattern B having a width greater than or equal to the minimum line width is generated from terminal ends 51A and 51B of the adjacent patterns of 50A and 50B in contact with the pattern A. Thereafter, a pattern C having the minimum space length is generated at a middle section of the pattern B. Areas of the pattern B that do not overlap the pattern C are defined as extended portions 53A and 53B (see FIGS. 2B and 27). In contrast, in the example shown in FIG. 16A, as shown in FIG. 28B, a pattern D having a width greater than or equal to the minimum line width is generated from a terminal end 51 of the adjacent pattern 50 in contact with the pattern A. An area of the pattern D that overlaps the pattern A is defined as an extended portion 53 (see FIGS. 16B and 29).

Step-130

Figure 29A:
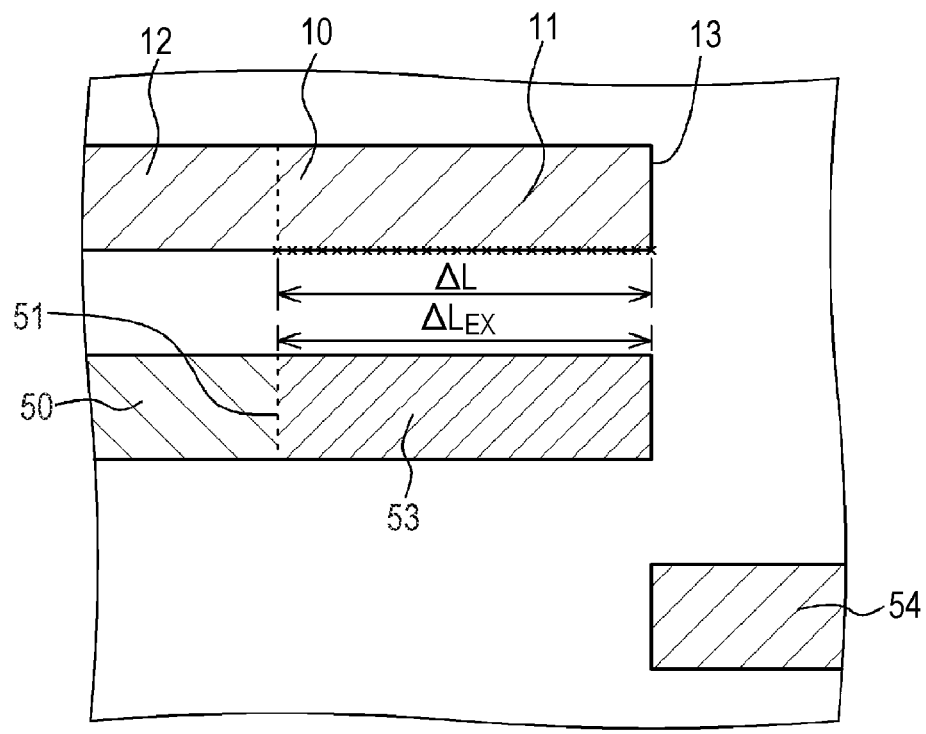
FIGS. 29A and 29B are diagrams illustrating a procedure when a predetermined space cannot be maintained between an extended portion provided to a first adjacent pattern and a second adjacent pattern adjacent to the first adjacent pattern.
Figure 29B:
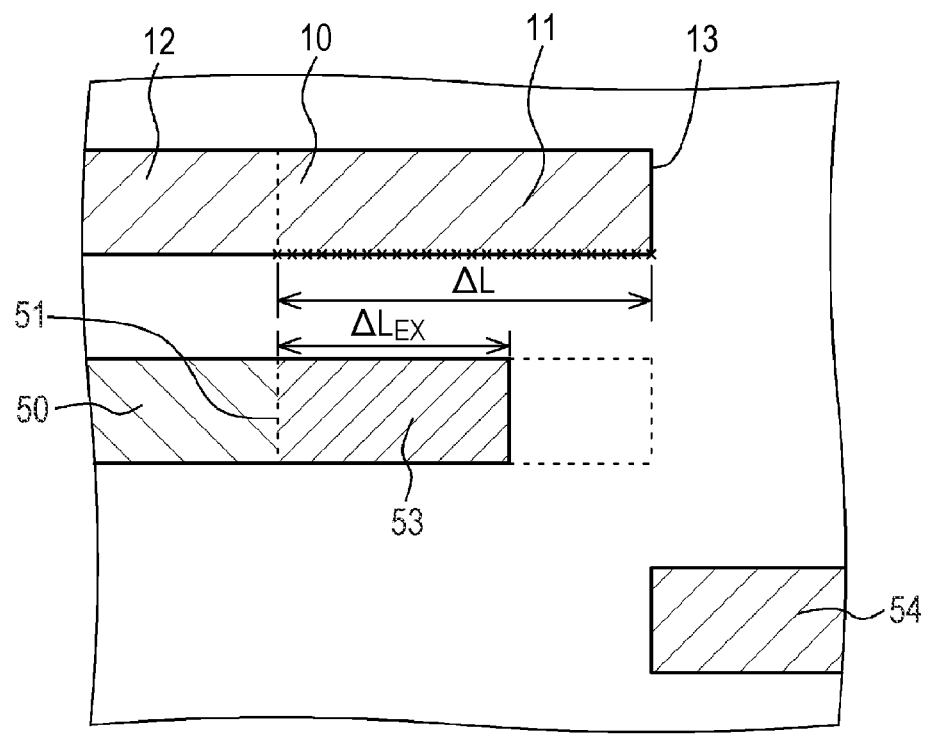

Subsequently, for example, as shown in FIG. 29A, if a predetermined space (e.g., a predetermined space length C described below) is not ensured between an extended portion 53 provided to an adjacent pattern 50 and an adjacent pattern 54 adjacent to the adjacent pattern 50, the length of the extended portion 53 is reduced in order to ensure the predetermined space (see FIG. 29B). Additionally, if the extended portion is not rectangular, some partial areas of the extended portion are removed so that the extended portion becomes rectangular. In this case, it is noted that the partial areas are removed such that the minimum feature size is ensured.

Step-140

For example, as shown in FIG. 20B, if the addition of the extended portions generates a new edge (space between peaks), the extended portion that does not satisfy the following conditions is removed: the length of the extended portion $\Delta L_{EX-1} \geq$ (the minimum feature size) or the length of the extended portion $\Delta L_{EX-2} \geq$ (the minimum feature size).

Step-150

Subsequently, it is determined whether the extraction of an isolated pattern is completed. If the extraction of an isolated pattern is not completed, steps STEP-110 through STEP-140 are repeated until the extraction of an isolated pattern is completed. However, if the extraction of an isolated pattern is completed, the correction of the mask pattern is completed.

Step-160

Electron beam writing pattern data is generated from the corrected design pattern data. A method for generating the electron beam writing pattern data depends on whether an employed electron beam exposure system is of a raster scanning type or a vector scanning type. In any cases, a well-known method can be adopted. That is, for example, the corrected design pattern data of a writing format is converted to electron beam deflecting data (corresponding to electron beam writing pattern data) by an electron beam exposure system. The electron beam exposure system emits electron beams that form the same shape as the design pattern data by changing an aperture.

When writing pattern data for design pattern data of a stream format is generated, the design pattern data, for example, is transformed into a bitmap. The mask pattern correction method according to the first aspect or the second aspect of the present invention is performed on the basis of the bitmap data to correct the mask pattern, thereby obtaining design pattern data for the corrected mask pattern. An optical proximity effect correction may be further performed on the design pattern data to obtain design pattern data subjected to the optical proximity effect correction. Since the obtained design pattern data is of a stream format, the design pattern data of this format is converted to, for example, a writing format using a well-known method. Thereafter, the writing pattern data is generated from the corrected design pattern data of the writing format.

Specific examples of an arrangement of an isolated pattern and its adjacent pattern and an arrangement of the isolated pattern and its adjacent pattern provided with an extended portion are described with reference to FIGS. 2 through 25.

Examples shown in FIGS. 2A, 4A, 7A, 9A, and 12A relate to the "Structure 1A". In these examples, the isolated pattern 10 includes the isolated portion 11 and a first extended portion 12A and a second extended portion 12B extending from both ends of the isolated portion 11.

Here, the isolated portion 11 of the isolated pattern 10, the first extended portion 12A, and the second extended portion 12B are linear. The adjacent patterns include the first adjacent patterns 50A and 60A and the second adjacent patterns 50B and 60B. The first adjacent patterns 50A and 60A have the terminal ends 51A and 61A, respectively. The first adjacent patterns 50A and 60A extend parallel to the first extended portion 12A of the isolated pattern 10. In contrast, the second adjacent patterns 50B and 60B have second terminal ends 51B and 61B, which respectively face the first terminal ends 51A and 61A. The second adjacent patterns 50B and 60B extend parallel to the second extended portion 12B of the isolated pattern 10. In this structure, the following equation is obtained:

$$\Delta L_{12} = \Delta L_{EX-1} + \Delta L_{EX-2} + C \qquad (1)$$

where $\Delta L_{12}$ is the distance between the first terminal end 51A and the second terminal end 51B or the distance between the first terminal end 61A and the second terminal end 61B, C is a predetermined space length, $\Delta L_{EX-1}$ is the length of the extended portion 53A provided to the first adjacent pattern 50A or the length of the extended portion 63A provided to the first adjacent pattern 60A, and $\Delta L_{EX-2}$ is the length of the extended portion 53B provided to the second adjacent pattern 50B or the length of the extended portion 63B provided to the second adjacent pattern 60B. It is noted that $\Delta L_{EX-1}$ and $\Delta L_{EX-2}$ may be determined to be any values if these values satisfy equation (1).

Here, the examples shown in FIGS. 2A and 4A relate to the "Structure 1A-1". In these examples, the first adjacent pattern 50A extends straight and parallel to the first extended portion 12A of the isolated pattern 10, whereas the second adjacent pattern 50B extends straight and parallel to the second extended portion 12B of the isolated pattern 10. In the example shown in FIG. 4A, the second adjacent pattern 50B is connected to the second extended portion 12B via a connecting portion 56B.

In the example shown in FIG. 2B, the extended portion 53A extending from the first terminal end 51A of the first adjacent pattern 50A is provided. Also, the extended portion 53B extending from the second terminal end 51B of the second adjacent pattern 50B is provided, and $\Delta L_{EX-1} = \Delta L_{EX-2}$. In contrast, in the examples shown in FIGS. 3A and 4B, the extended portion 53A extending from the first terminal end 51A of the first adjacent pattern 50A is provided. However, the extended portion 53B extending from the second terminal end 51B of the second adjacent pattern 50B is not provided, and therefore, $\Delta L_{EX-2} = 0$. In addition, in the example shown in FIG. 3B, the extended portion 53A extending from the first terminal end 51A of the first adjacent pattern 50A is not provided. However, the extended portion 53B extending from the second terminal end 51B of the second adjacent pattern 50B is provided, and therefore, $\Delta L_{EX-1} = 0$.

The examples shown in FIGS. 7A and 9A relate to the "Structure 1A-2". In these examples, the first adjacent pattern 50A extends straight and parallel to the first extended portion 12A of the isolated pattern 10. In contrast, the second adjacent pattern 60B has an L-shape consisting of a first side 64B and a second side 65B. Here, the first side 64B is a part of the second adjacent pattern 60B and includes the second terminal end 61B. The first side 64B extends straight and parallel to the second extended portion 12B of the isolated pattern 10.

The second side 65B, which is a part of the second adjacent pattern 60B, extends from the second terminal end 61B of the first side 64B in a direction orthogonal to an extending direction of the second extended portion 12B of the isolated pattern 10 and away from the second extended portion 12B of the isolated pattern 10. In the example shown in FIG. 9A, the first adjacent pattern 50A is connected to the first extended portion 12A via a connecting portion 56A.

In the example shown in FIG. 7B, the extended portion 53A extending from the first terminal end 51A of the first adjacent pattern 50A is provided. Also, the extended portion 63B extending from the second terminal end 61B of the second adjacent pattern 60B is provided, and $\Delta L_{EX-1}=\Delta L_{EX-2}$. In contrast, in the example shown in FIG. 8A, the extended portion 53A extending from the first terminal end 51A of the first adjacent pattern 50A is provided. However, the extended portion 63B extending from the second terminal end 61B of the second adjacent pattern 60B is not provided, and therefore, $\Delta L_{EX-2}=0$. Furthermore, in the examples shown in FIGS. 8B and 9B, the extended portion 53A extending from the first terminal end 51A of the first adjacent pattern 50A is not provided. However, the extended portion 63B extending from the second terminal end 61B of the second adjacent pattern 60B are provided, and $\Delta L_{EX-1}=0$.

The example shown in FIG. 12A relates to the "Structure 1A-3". In this example, the first adjacent pattern 60A has an L-shape consisting of a first side 64A and a second side 65A. Here, the first side 64A, which is a part of the first adjacent pattern 60A and includes the first terminal end 61A, extends straight and parallel to the first extended portion 12A of the isolated pattern 10.

The second side 65A, which is a part of the first adjacent pattern 60A, extends from the first terminal end 61A of the first side 64A in a direction orthogonal to an extending direction of the first extended portion 12A of the isolated pattern 10 and away from the first extended portion 12A of the isolated pattern 10.

The second adjacent pattern 60B has an L-shape consisting of the first side 64B and the second side 65B. Here, the first side 64B, which is a part of the second adjacent pattern 60B and includes the second terminal end 61B, extends straight and parallel to the second extended portion 12B of the isolated pattern 10. Additionally, the second side 65B, which is a part of the second adjacent pattern 60B, extends from the second terminal end 61B of the first side 64B in a direction orthogonal to an extending direction of the second extended portion 12B of the isolated pattern 10 and away from the second extended portion 12B of the isolated pattern 10.

In the example shown in FIG. 12B, the extended portion 63A extending from the first terminal end 61A of the first adjacent pattern 60A is provided. Also, the extended portion 63B extending from the second terminal end 61B of the second adjacent pattern 60B is provided, and $\Delta L_{EX-1}=\Delta L_{EX-2}$.

In contrast, in the example shown in FIG. 13A, the extended portion 63A extending from the first terminal end 61A of the first adjacent pattern 60A is provided. However, the extended portion 63B extending from the second terminal end 61B of the second adjacent pattern 60B is not provided, and therefore, $\Delta L_{EX-2}=0$. Furthermore, in the example shown in FIG. 13B, the extended portion 63A extending from the first terminal end 61A of the first adjacent pattern 60A is not provided. However, the extended portion 63B extending from the second terminal end 61B of the second adjacent pattern 60B is provided, and therefore, $\Delta L_{EX-1}=0$.

The examples in FIGS. 5A, 10A, and 14A relate to the "Structure 1B". In these examples, a straight isolated pattern 20 includes an isolated portion 21 having terminal ends 23A and 23B at both ends thereof. Adjacent patterns include first adjacent patterns 50A and 60A and second adjacent patterns 50B and 60B. The first adjacent patterns 50A and 60A having the respective first terminal ends 51A and 61A extend parallel to the isolated pattern 20. The second adjacent patterns 50B and 60B have second terminal ends 51B and 61B, which respectively face the first terminal ends 51A and 61A. The second adjacent patterns 50B and 60B extend parallel to the isolated pattern 20.

In this structure, the following equation is obtained:

$$\Delta L_{12}=\Delta L_{EX-1}+\Delta L_{EX-2}+C \qquad (1)$$

where $\Delta L_{12}$ is the distance between the first terminal end 51A and the second terminal end 51B or the distance between the first terminal end 61A and the second terminal end 61B, C is a predetermined space length, $\Delta L_{EX-1}$ is the length of the extended portion 53A provided to the first adjacent pattern 50A or the length of the extended portion 63A provided to the first adjacent pattern 60A, and $\Delta L_{EX-2}$ is the length of the extended portion 53B provided to the second adjacent pattern 50B or the length of the extended portion 63B provided to the second adjacent pattern 60B. It is noted that $\Delta L_{EX-1}$ and $\Delta L_{EX-2}$ may be determined to be any values if these values satisfy equation (1).

The example shown in FIG. 5A relates to the "Structure 1B-1". In this example, the first adjacent pattern 50A extends straight and parallel to the isolated pattern 20. The second adjacent pattern 50B also extends straight and parallel to the isolated pattern 20.

In an example shown in FIG. 5B, the extended portion 53A extending from the first terminal end 51A of the first adjacent pattern 50A is provided. Also, the extended portion 53B extending from the second terminal end 51B of the second adjacent pattern 50B is provided, and $\Delta L_{EX-1}=\Delta L_{EX-2}$. In contrast, in an example shown in FIG. 6A, the extended portion 53A extending from the first terminal end 51A of the first adjacent pattern 50A is provided. However, the extended portion 53B extending from the second terminal end 51B of the second adjacent pattern 50B is not provided, and therefore, $\Delta L_{EX-2}=0$. Furthermore, in an example shown in FIG. 6B, the extended portion 53A extending from the first terminal end 51A of the first adjacent pattern 50A is not provided. However, the extended portion 53B extending from the second terminal end 51B of the second adjacent pattern 50B is provided, and therefore, $\Delta L_{EX-1}=0$.

The example shown in FIG. 10A relates to the "Structure 1B-2". In this example, the first adjacent pattern 50A extends straight and parallel to the isolated pattern 20, whereas the second adjacent pattern 60B has an L-shape consisting of the first side 64B and the second side 65B. Here, the first side 64B, which is a part of the second adjacent pattern 60B and includes the second terminal end 61B, extends straight and parallel to the isolated pattern 20. Additionally, the second side 65B, which is a part of the second adjacent pattern 60B, extends from the second terminal end 61B of the first side 64B in a direction orthogonal to an extending direction of the isolated pattern 20 and away from the isolated pattern 20.

In the example shown in FIG. 10B, the extended portion 53A extending from the first terminal end 51A of the first adjacent pattern 50A is provided. Also, the extended portion 63B extending from the second terminal end 61B of the second adjacent pattern 60B is provided, and $\Delta L_{EX-1}=\Delta L_{EX-2}$. In contrast, in the example shown in FIG. 11A, the extended portion 53A extending from the first terminal end 51A of the first adjacent pattern 50A is provided. However, the extended portion 63B extending from the second terminal end 61B of the second adjacent pattern 60B is not provided, and therefore, $\Delta L_{EX-2}=0$. Furthermore, in the example shown in FIG. 11B, the extended portion 53A extending from the first terminal end 51A of the first adjacent pattern 50A is not provided. However, the extended portion 63B extending from the second terminal end 61B of the second adjacent pattern 60B is provided, and therefore, $\Delta L_{EX-1}=0$.

Still furthermore, an example shown in FIG. 14A relates to the "Structure 1B-3". In this example, the first adjacent pattern 60A has an L-shape consisting of the first side 64A and the second side 65A. Here, the first side 64A, which is a part of the first adjacent pattern 60A and includes the first terminal end 61A, extends straight and parallel to the isolated pattern 20. In contrast, the second side 65A, which is a part of the first adjacent pattern 60A, extends from the first terminal end 61A of the first side 64A in a direction orthogonal to an extending direction of the isolated pattern 20 and away from the isolated pattern 20. The second adjacent pattern 60B has an L-shape consisting of the first side 64B and the second side 65B.

The first side 64B, which is a part of the second adjacent pattern 60B and includes the second terminal end 61B, extends straight and parallel to the isolated pattern 20. In contrast, the second side 65B, which is a part of the second adjacent pattern 60B, extends from the second terminal end 61B of the first side 64B in a direction orthogonal to an extending direction of the isolated pattern 20 and away from the isolated pattern 20.

In an example shown in FIG. 14B, the extended portion 63A extending from the first terminal end 61A of the first adjacent pattern 60A is provided. Also, the extended portion 63B extending from the second terminal end 61B of the second adjacent pattern 60B is provided, and $\Delta L_{EX-1} = \Delta L_{EX-2}$. In contrast, in an example shown in FIG. 15A, the extended portion 63A extending from the first terminal end 61A of the first adjacent pattern 60A is provided. However, the extended portion 63B extending from the second terminal end 61B of the second adjacent pattern 60B is not provided, and therefore, $\Delta L_{EX-2} = 0$.

Furthermore, in an example shown in FIG. 15B, the extended portion 63A extending from the first terminal end 61A of the first adjacent pattern 60A is not provided. However, the extended portion 63B extending from the second terminal end 61B of the second adjacent pattern 60B is provided, and therefore, $\Delta L_{EX-1} = 0$.

The examples shown in FIGS. 16A and 17A relate to the "Structure 1C". In these examples, the isolated pattern 10 includes an isolated portion 11 whose one end is a terminal end 13 and an extended portion 12 extending from the other end of the isolated portion 11. The isolated portion 11 and the extended portion 12 of the isolated pattern 10 are linear. The adjacent pattern 50 having the terminal end 51 extends parallel to the extended portion 12 of the isolated pattern 10.

In this structure, the length $\Delta L_{EX}$ of the extended portion 53 provided to the adjacent pattern 50 is expressed as:

$$L_{EX} = \Delta L \pm \alpha \tag{2}$$

where $\Delta L$ is the length between the terminal end 13 of the isolated pattern 10 and a reference line (not shown) minus the length between the terminal end 51 of the adjacent pattern 50 and the reference line. It is desirable that the value of $\alpha$ is zero (0). However, if the value of $\alpha$ is less than about the minimum feature size, the optical proximity effect correction can be provided.

The example shown in FIG. 16A relates to the "Structure 1C-1". In this example, the adjacent pattern 50 also extends straight and parallel to the extended portion 12 of the isolated pattern 10. In an example shown in FIG. 16B, the extended portion 53 extending from the terminal end 51 of the adjacent pattern 50 is provided. Additionally, the example shown in FIG. 17A relates to the "Structure 1C-2". In this example, an adjacent pattern 60 has an L-shape consisting of a first side 64 and a second side 65.

Here, the first side 64, which is a part of the adjacent pattern 60 and includes a terminal end 61, extends straight and parallel to the extended portion 12 of the isolated pattern 10, whereas the second side 65, which is a part of the adjacent pattern 60, extends from the terminal end 61 of the first side 64 in a direction orthogonal to an extending direction of the extended portion 12 of the isolated pattern 10 and away from the extended portion 12 of the isolated pattern 10. In an example shown in FIG. 17B, an extended portion 63 extending from the terminal end 61 of the adjacent pattern 60 is provided.

The examples shown in FIGS. 18A and 19A relate to the "structure 1D". In these examples, an isolated pattern 30 has an L-shape consisting of a first side 34 and a second side 35. Here, the first side 34, which is a part of the isolated pattern 30 and includes a terminal end 33, extends linearly. The first side 34 includes an isolated portion 31 whose one end is the terminal end 33 and an extended portion 32 extending from the other end of the isolated portion 31.

In contrast, the second side 35, which is a part of the isolated pattern 30, extends from the terminal end 33 of the first side 34, which is a part of the isolated pattern 30, in a direction orthogonal to an extending direction of the first side 34. Additionally, the adjacent pattern 50 having the terminal end 51, which faces the second side 35 of the isolated pattern 30, extends parallel to the extended portion 32 of the first side 34, which is a part of the isolated pattern 30. In this structure, a length $\Delta L_{EX}$ of the extended portion 53 provided to the adjacent pattern 50 is expressed as:

$$\Delta L_{EX} = \Delta L - C \pm \alpha \tag{3}$$

where $\Delta L$ is a distance between an edge 36 of the second side 35 of the isolated pattern 30 and the terminal end 51 of the adjacent pattern 50, and C is a predetermined space length. It is desirable that the value of $\alpha$ is zero (0). However, if the value of $\alpha$ is less than about the minimum feature size, the optical proximity effect correction can be provided.

The example shown in FIG. 18A relates to the "Structure 1D-1". In this example, the adjacent pattern 50 extends straight and parallel to the extended portion 32 of the first side 34, which is a part of the isolated pattern 30. In an example shown in FIG. 18B, the extended portion 53 extending from the terminal end 51 of the adjacent pattern 50 is provided. Additionally, the example shown in FIG. 19A relates to the "Structure 1D-2".

In this example, an adjacent pattern 60 has an L-shape consisting of a first side 64 and a second side 65. The first side 64, which is a part of the adjacent pattern 60 and includes the terminal end 61, extends straight and parallel to the extended portion 32 of the first side 34, which is a part of the isolated pattern 30.

The second side 65, which is a part of the adjacent pattern 60, extends from the terminal end 61 of the first side 64, which is also a part of the adjacent pattern 60, parallel to an extending direction of the second side 35 of the isolated pattern 30 away from the first side 34 of the isolated pattern 30. In an example shown in FIG. 19B, the extended portion 63 extending from the terminal end 61 of the adjacent pattern 60 is provided.

Examples shown in FIGS. 20A and 22A relate to the "Structure 2A". In the example shown in FIG. 20A, the isolated pattern 10 includes the isolated portion 11, and the first extended portion 12A and the second extended portion 12B extending from both ends of the isolated portion 11. The isolated portion 11 of the isolated pattern 10, the first extended portion 12A, and the second extended portion 12B extend linearly.

The adjacent patterns include a first adjacent pattern 80A and a second adjacent pattern 80B. The straight first adjacent pattern 80A extends next to the first extended portion 12A of the isolated pattern 10 and extends perpendicular to the first extended portion 12A. The first adjacent pattern 80A includes a first terminal end 81A and a first terminal end edge 82A extending from the first terminal end 81A. In contrast, the straight second adjacent pattern 80B extends next to the second extended portion 12B of the isolated pattern 10 and extends perpendicular to the second extended portion 12B. The second adjacent pattern 80B includes a second terminal end 81B and a second terminal end edge 82B extending from the second terminal end 81B. The second terminal end edge 82B faces the first terminal end edge 82A.

In the example shown in FIG. 22A, the straight isolated pattern 20 includes an isolated portion 21 having terminal ends 23A and 23B at both ends thereof. In contrast, the adjacent patterns include a first adjacent pattern 80A and a second adjacent pattern 80B. The straight first adjacent pattern 80A extends next to the isolated pattern 10 in a direction perpendicular to the isolated pattern 10. The first adjacent pattern 80A includes a first terminal end 81A and a first terminal end edge 82A extending from the first terminal end 81A. The straight second adjacent pattern 80B extends next to the isolated pattern 10 in a direction perpendicular to the isolated pattern 10. The second adjacent pattern 80B includes a second terminal end 81B and a second terminal end edge 82B extending from the second terminal end 81B. The second terminal end edge 82B faces the first terminal end edge 82A.

In each example of this structure, the following equation is obtained:

$$\Delta L_{12} = \Delta L_{EX-1} + \Delta L_{EX-2} + C \quad (1)$$

where $\Delta L_{12}$ represents the distance between the first terminal end edge 82A and the second terminal end edge 82B, C represents a predetermined space length, $\Delta L_{EX-1}$ represents the length of an extended portion 83A provided to the first adjacent pattern 80A, and $\Delta L_{EX-2}$ represents the length of an extended portion 83B provided to the second adjacent pattern 80B. It is noted that $\Delta L_{EX-1}$ and $\Delta L_{EX-2}$ may be determined to be any values if these values satisfy equation (1).

In examples shown in FIGS. 20B and 22B, the extended portion 83A extending from the first terminal end edge 82A of the first adjacent pattern 80A is provided. Also, the extended portion 83B extending from the second terminal end edge 82B of the second adjacent pattern 80B is provided, and $\Delta L_{EX-1} = \Delta L_{EX-2}$. In contrast, in the examples shown in FIGS. 21A and 23A, the extended portion 83A extending from the first terminal end edge 82A of the first adjacent pattern 80A is provided. However, the extended portion 83B extending from the second terminal end edge 82B of the second adjacent pattern 80B is not provided, and therefore, $\Delta L_{EX-2} = 0$.

Furthermore, in examples shown in FIGS. 21B and 23B, the extended portion 83A extending from the first terminal end edge 82A of the first adjacent pattern 80A is not provided. However, the extended portion 83B extending from the second terminal end edge 82B of the second adjacent pattern 80B is provided, and therefore, $\Delta L_{EX-1} = 0$.

Examples shown in FIGS. 24A and 25A relate to the "Structure 2B". In the example shown in FIG. 24A, an isolated pattern 30 has an L-shape consisting of a first side 34 and a second side 35. Here, the first side 34, which is a part of the isolated pattern 30 and includes a terminal end 33, extends linearly. The first side 34 includes an isolated portion 31 whose one end is the terminal end 33 and an extended portion 32 extending from the other end of the isolated portion 31.

In contrast, the second side 35, which is a part of the isolated pattern 30, extends from the terminal end 33 of the first side 34, which is a part of the isolated pattern 30, in a direction orthogonal to an extending direction of the first side 34. Additionally, a straight adjacent pattern 80 extends next to the first side 34 of the isolated pattern 30 in a direction perpendicular to the first side 34. The straight adjacent pattern 80 includes a terminal end 81 and a terminal end edge 82 extending from the terminal end 81.

In the example shown in FIG. 25A, an isolated pattern 30 has an L-shape consisting of a first side 34 and a second side 35. Here, the first side 34, which is a part of the isolated pattern 30 and includes a terminal end 33, extends linearly. The first side 34 includes an isolated portion 31 having the terminal end 33 and a terminal end 37 at both ends thereof. In contrast, the second side 35, which is a part of the isolated pattern 30, extends from the terminal end 33 of the first side 34, which is a part of the isolated pattern 30, in a direction orthogonal to an extending direction of the first side 34. Additionally, the straight adjacent pattern 80 extends next to the first side 34 of the isolated pattern 30 in a direction perpendicular to the first side 34. The adjacent pattern 80 includes the terminal end 81 and the terminal end edge 82 extending from the terminal end 81.

In each example of this structure, a length $\Delta L_{EX}$ of the extended portion 83 provided to the adjacent pattern 80 is expressed as:

$$\Delta L_{EX} = \Delta L - C \pm \alpha \quad (3)$$

where $\Delta L$ represents a distance between an edge 36 of the second side 35 of the isolated pattern 30 and the terminal end edge 82 of the adjacent pattern 80, and C is a predetermined space length. Here, it is desirable that the value of $\alpha$ is zero (0). However, if the value of $\alpha$ is less than about the minimum feature size, the optical proximity effect correction can be provided.

In many cases, contact holes or via holes (none are shown) are formed or to be formed in the vicinity of the terminal ends of the adjacent patterns shown in FIGS. 2 through 25.

In general, if the line width of the isolated pattern having contact holes or via holes is reduced, an open error such as disconnection and poor contact occurs. According to the first embodiment, the occurrence of the open error can be reliably prevented even when a required contrast cannot be obtained at a defocus time.

Second Exemplary Embodiment

A second embodiment relates to an electron beam writing method according to a first aspect or a second aspect of the present invention, a photomask according to first to fourth aspects of the present invention, and a method for fabricating a photomask according to the first or second aspect of the present invention.

That is, in the electron beam writing method according to the second embodiment, for example, design pattern data including a plurality of design pattern data for fabricating a semiconductor device is corrected. Thereafter, electron beam writing is performed on an electron beam resist formed on a base substrate on the basis of the corrected design pattern data. In the second embodiment, the base substrate is a mask blank. In terms of the photomask and the method for fabricating the photomask, the mask blank is etched by using an etching mask obtained by developing the electron beam resist. It is noted that the design pattern data is corrected using the method for correcting a mask pattern according to the first or second aspect of the present invention described in the first embodiment.

Alternatively, a photomask used in the second embodiment is a photomask used in a lithographic step of a semiconductor device fabrication process. In the photomask, a mask pattern including an isolated pattern, which is a pattern having an optically isolated portion, is formed. Subsequently, in an adjacent pattern extending parallel to the isolated portion of the isolated pattern and having a terminal end, an extended portion extending from the terminal end is provided next to the isolated portion of the isolated pattern in the direction in which the isolated portion of the isolated pattern extends. Alternatively, in a straight adjacent pattern extending perpendicular to the isolated pattern and having a terminal end and a terminal end edge extending from the terminal end, an extended portion extending from the terminal end edge is provided next to the isolated portion of the isolated pattern in the direction in which the isolated portion of the isolated pattern extends.

Figure 30A:
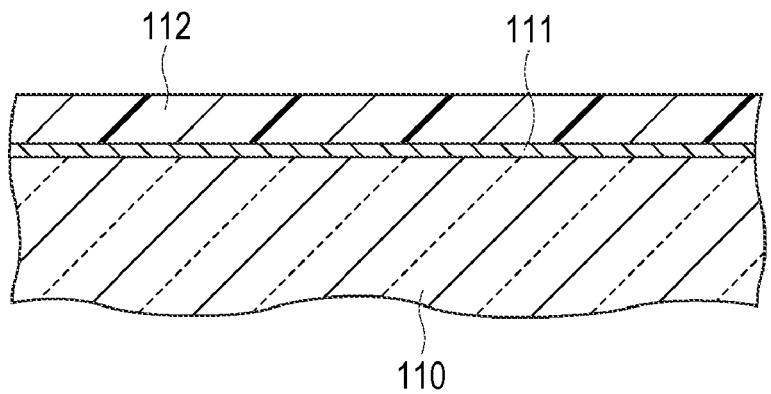
FIGS. 30A-D are schematic side views partly in section of a mask blank according to a second embodiment of the present invention.
Figure 30B:
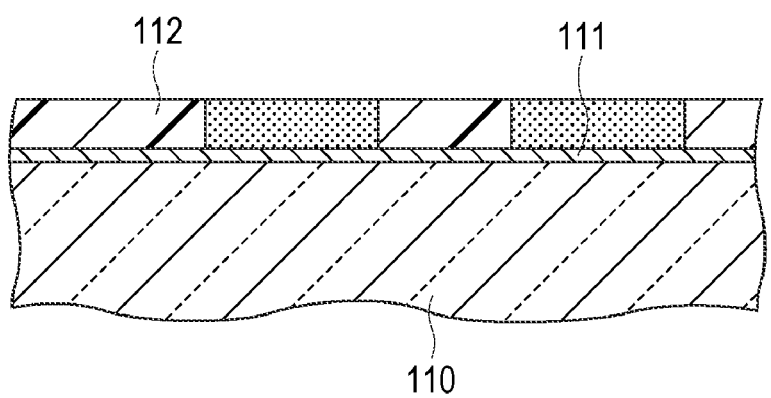

More specifically, in the second embodiment, as shown by a schematic partial sectional view in FIG. 30A, the mask blank is employed, as a base substrate, that includes a glass substrate 110 which is transparent to exposure light and which has a metallic light-shielding thin film 111 on the surface thereof. However, the base substrate is not limited to such a mask blank. Thereafter, a positive electron beam resist 112, for example, is applied to the light-shielding thin film 111. Electron beam writing is then performed on the electron beam resist 112 on the basis of electron beam writing pattern data generated in the same manner as described in the first embodiment. FIG. 30B illustrates the photomask in this stage, in which areas marked with dots in the electron beam resist 112 represent areas written by an electron beam.

Figure 30C:
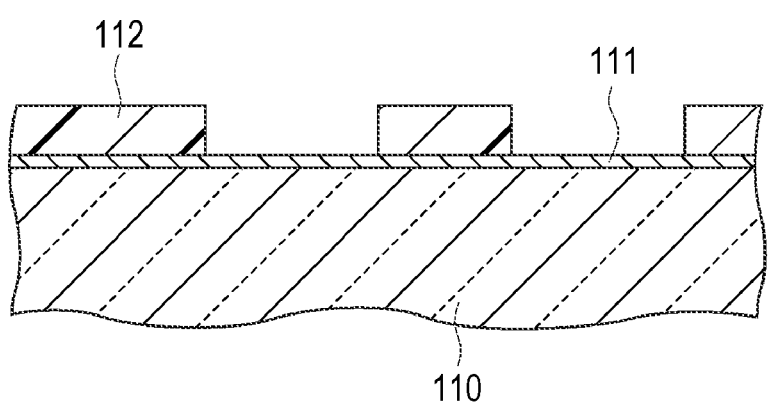
Figure 30D:
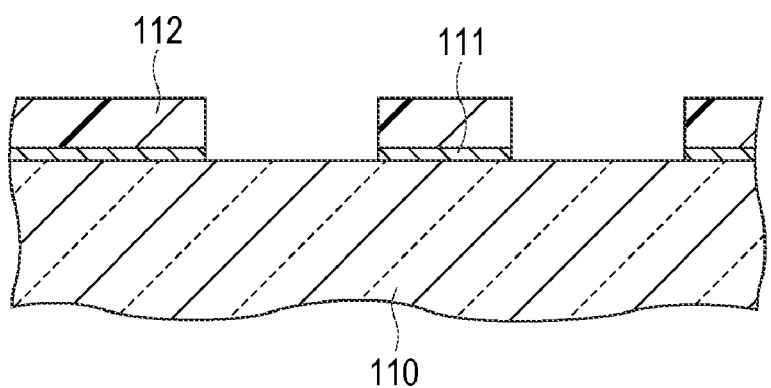

After the electron beam resist 112 is developed (see FIG. 30C), the pattered electron beam resist 112 is used as an etching mask to etch the mask blank (i.e., the light-shielding thin film 111). Thus, a photomask (master mask) having the structure shown in FIG. 30D can be fabricated.

Third Exemplary Embodiment

Figure 31A:
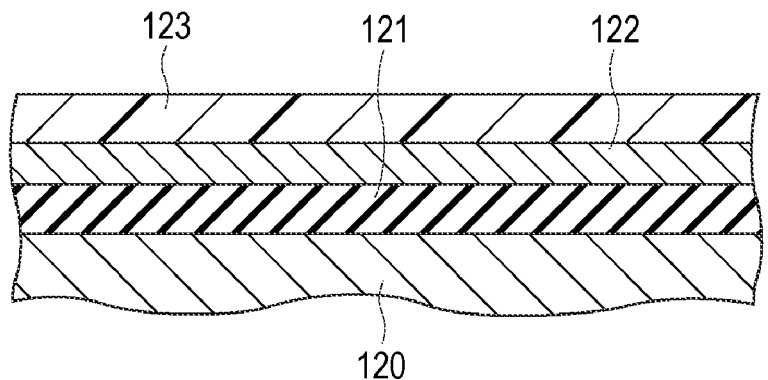
FIGS. 31A-D are schematic side views partly in section of a semiconductor substrate according to a third embodiment of the present invention.

A third embodiment also relates to an electron beam writing method according to a first aspect or a second aspect of the present invention. In particular, the second embodiment relates to an electron beam writing method in which an electron beam is directly emitted to write on the electron beam resist formed on a base substrate, such as a semiconductor substrate. In the third embodiment, as shown by a schematic partial sectional view in FIG. 31A, the base substrate is formed from a metallic layer 122 of an aluminum alloy formed over a semiconductor substrate 120. However, the structure of the base substrate is not limited to such a structure. It is noted that an insulating interlayer 121 is formed over the semiconductor substrate 120.

Figure 31B:
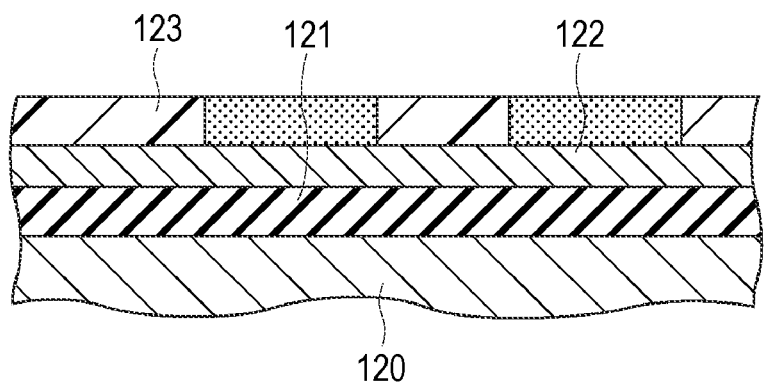

In an electron beam writing method according to the third embodiment, for example, design pattern data including a plurality of design pattern data for fabricating a semiconductor device is corrected. Thereafter, electron beam writing is performed on an electron beam resist 123 formed on the metallic layer 122 serving as a base substrate on the basis of electron beam writing pattern data generated from the corrected design pattern data. FIG. 31B illustrates the photomask in this stage, in which areas marked with dots in the electron beam resist 123 represent areas written by an electron beam. It is noted that the design pattern data is corrected using the method for correcting a mask pattern according to the first or second aspect of the present invention described in the first embodiment.

Figure 31C:
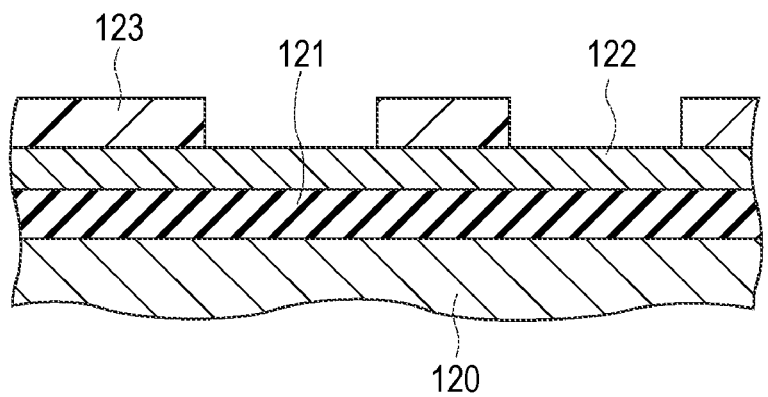
Figure 31D:
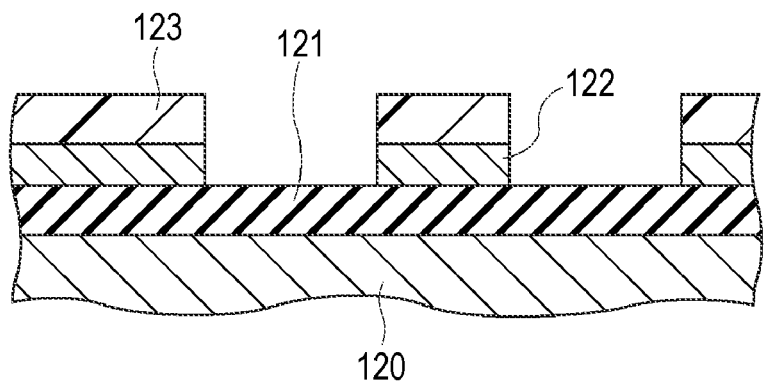

After the electron beam resist 123 is developed (see FIG. 31C), the pattered electron beam resist 123 is used as an etching mask to etch a base substrate (i.e., the metallic layer 122). Thus, the structure shown in FIG. 31D can be fabricated.

Fourth Exemplary Embodiment

A fourth embodiment relates to an exposure method according to the first aspect or the second aspect of the present invention, a semiconductor device according to the first to fourth aspects of the present invention, and a method for fabricating the semiconductor device according to the first and second aspects of the present invention. That is, in the exposure method according to the fourth embodiment, for example, design pattern data including a plurality of design pattern data for fabricating a semiconductor device is corrected. Thereafter, electron beam writing is performed on an electron beam resist formed on a mask blank on the basis of electron beam writing pattern data generated from the corrected design pattern data.

After the electron beam resist is developed to form an etching mask, the mask blank is etched using the etching mask to form a photomask. By emitting exposure light to the photomask, a mask pattern formed in the photomask is transferred to a photoresist formed on the base substrate. In terms of the semiconductor device and the method for fabricating the semiconductor device, after the mask pattern formed in the photomask is transferred to the photoresist formed on the base substrate, the base substrate is etched by using an etching mask obtained by developing the photoresist. It is noted that the design pattern data is corrected using the method for correcting a mask pattern according to the first or second aspect of the present invention described in the first embodiment.

Alternatively, in a semiconductor device according to the fourth embodiment, an isolated pattern circuit, which is a pattern including an isolated portion, and an adjacent pattern circuit which extends parallel to the isolated portion of the isolated pattern and which has a terminal end are formed. An extended portion extending from the terminal end next to the isolated portion of the isolated pattern in a direction in which the isolated portion of the isolated pattern extends is provided to the adjacent pattern circuit.

Alternatively, in a semiconductor device according to the fourth embodiment, an isolated pattern circuit, which is a pattern including an isolated portion, and an adjacent pattern circuit which extends next to the isolated pattern in a direction perpendicular to the isolated pattern and which has a terminal end and a terminal end edge extending from the terminal end are formed. An extended portion extending from the terminal end edge next to the isolated portion of the isolated pattern in a direction in which the isolated portion of the isolated pattern extends is provided to the adjacent pattern circuit.

Figure 32A:
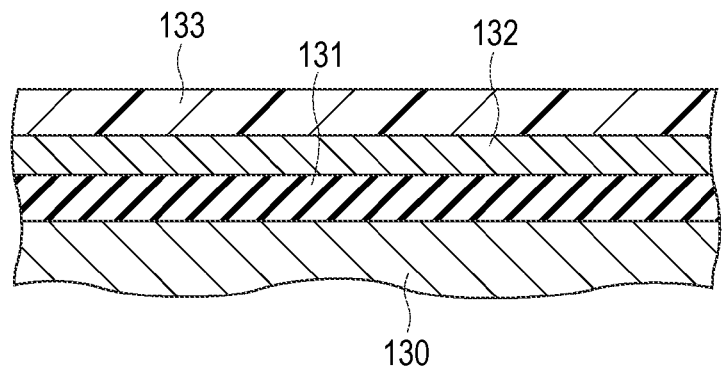
FIGS. 32A-C are schematic side views partly in section of a semiconductor substrate according to a fourth embodiment of the present invention.

More specifically, according to the fourth embodiment, as shown by a schematic partial sectional view in FIG. 32A, the base substrate is formed from a metallic layer 132 of an aluminum alloy formed over a semiconductor substrate 130. However, the structure of the base substrate is not limited to such a structure. Additionally, an insulating interlayer 131 is formed over the semiconductor substrate 130. Thereafter, a positive photoresist 133, for example, is applied to the metallic layer 132. Electron beam writing is performed on an electron beam resist formed on a mask blank on the basis of electron beam writing pattern data generated in the same manner as described in the first embodiment. The electron beam resist is developed to form an etching mask. By etching the mask blank using the etching mask, a photomask 134 is fabricated.

Figure 32B:
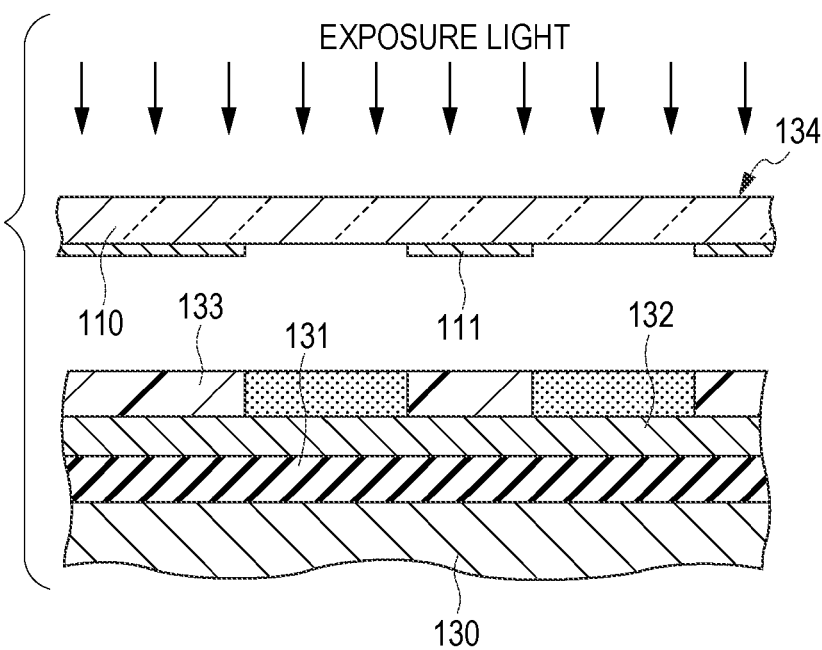

By emitting exposure light to the photomask 134, a mask pattern formed in the photomask 134 is transferred to the photoresist 133 formed on the metallic layer 132, which is a base substrate. FIG. 32B illustrates the photoresist in this stage, in which areas marked with dots in the photoresist 133 represent areas where the pattern is transferred.

Figure 32C:
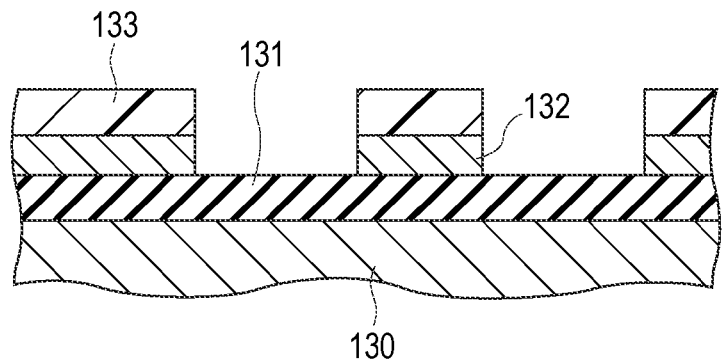

After the photoresist 133 is developed, the base substrate (the metallic layer 132) is etched using the patterned photoresist 133 as an etching mask. Thus, a semiconductor device having the structure shown in FIG. 32C can be fabricated.

In many cases, contact holes and via holes (none are shown) are formed in the vicinity of the terminal ends of the adjacent patterns shown in FIGS. 2 through 25. Accordingly, in the adjacent pattern circuit obtained by transferring such terminal ends of the adjacent pattern to the photoresist and etching the base substrate using this photoresist as an etching mask, if the extended portion is not provided to the adjacent pattern in the mask pattern, as in the known technology schematically shown in FIG. 34, the relationship between a distance $LL_2$ between the edge of the contact hole or the via hole and the terminal end of the adjacent pattern and a predetermined width $W_0$ is shown in the following table TABLE-2. In FIGS. 33 through 36, the isolated pattern circuit and the adjacent pattern circuit are shown by cross hatchings. Additionally, for the sake of simplicity, the contact hole or the via hole is schematically designated as a square and the terminal end of the adjacent pattern is designated as a rectangle. In practice, the contact hole, the via hole, and the terminal end of the adjacent pattern have a circular or arch shape.

Figure 33:
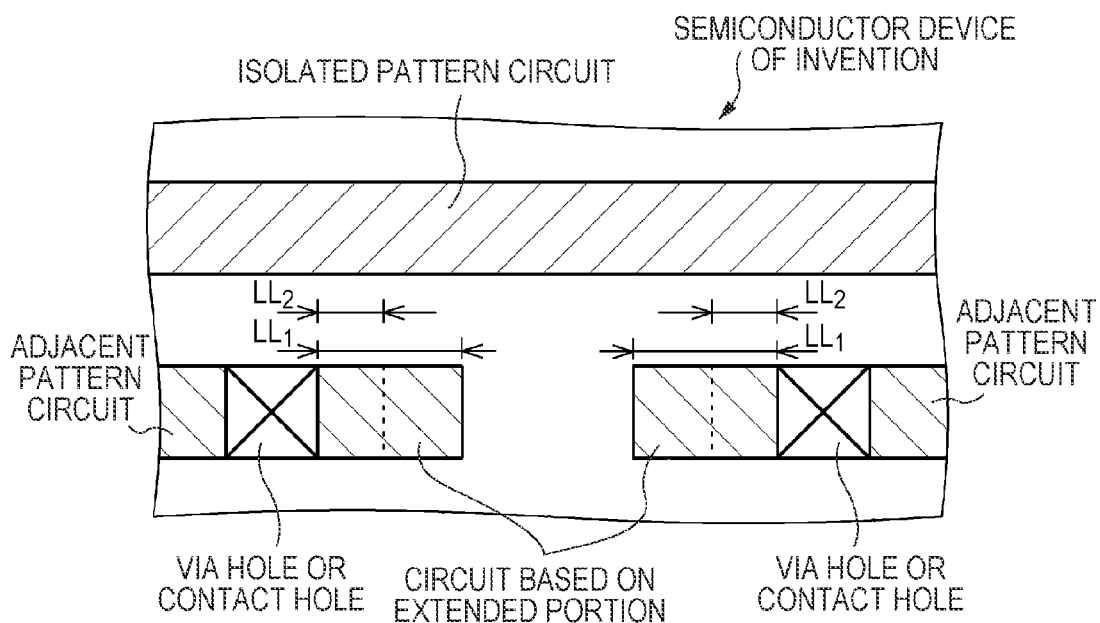
FIG. 33 is a schematic view of an arrangement of an isolated pattern and an adjacent pattern in a semiconductor device according to an embodiment of the present invention.
Figure 34:
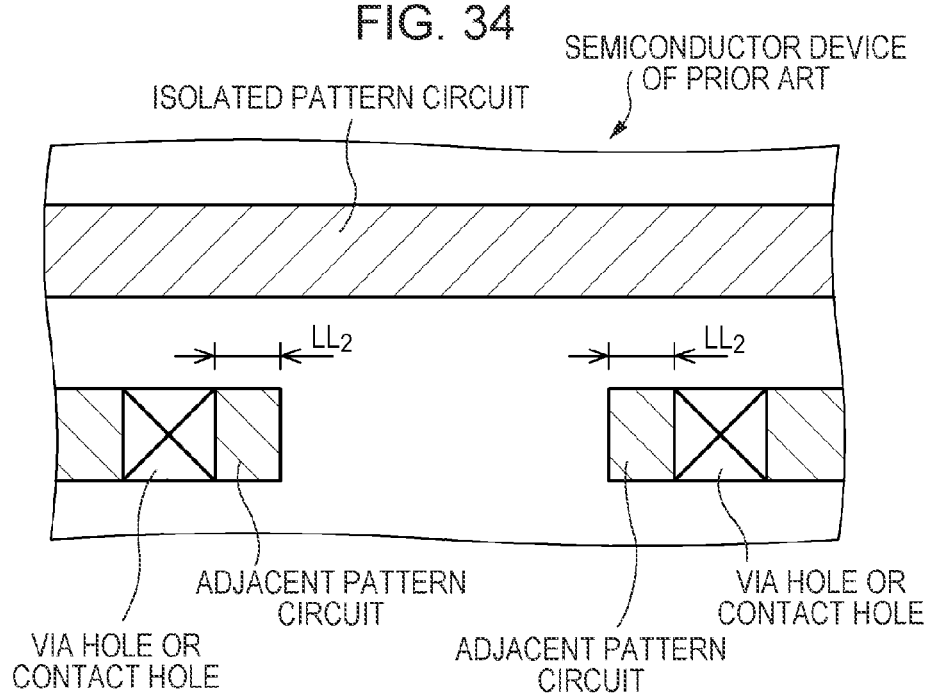
FIG. 34 is a schematic view of an arrangement of an isolated pattern and an adjacent pattern in a known semiconductor device.

In the fourth embodiment, as shown in FIG. 2B, the extended portions 53A and 53B, for example, are provided to the adjacent patterns 50A and 50B. Accordingly, as schematically shown in FIG. 33, the relationship between a distance $LL_1$ between the edge of the contact hole or the via hole and the terminal end of the adjacent pattern and a predetermined width $W_0$ is shown in the following table

TABLE 2

| Predetermined width $W_0$ | Distance $LL_1$ | Distance $LL_2$ |
| --- | --- | --- |
| 110 nm | minimum 110 nm | about 50 nm |
| 120 nm | minimum 120 nm | about 60 nm |
| 140 nm | minimum 140 nm | about 70 nm |

In other words, when the distance $LL_1$ is determined for the predetermined width $W_0$ as $LL_1 = K \cdot W_0$, the value K can be greater than or equal to 1, and more preferably greater than or equal to 2. If this condition is satisfied, it can be said that an extended portion is provided to the adjacent pattern in a master pattern. Still, in other words, if a relationship between the distance $LL_1$ between the edge of the contact hole or the via hole and the terminal end of the adjacent pattern and a design rule satisfies the relationship shown in the following table TABLE-3, it can be said that an extended portion is provided to the adjacent pattern in a master pattern.

TABLE 3

| Design Rule | Distance $LL_0$ |
| --- | --- |
| 65 nm | minimum 80 nm |
| 90 nm | minimum 110 nm |

Here, in an adjacent pattern circuit in a semiconductor device obtained on the basis of the adjacent pattern 50A shown in FIG. 3A, the adjacent pattern 50B shown in FIG. 3B, the adjacent pattern 50A shown in FIG. 4B, the adjacent pattern 50A shown in FIG. 6A, the adjacent pattern 50B shown in FIG. 6B, the adjacent pattern 50A shown in FIG. 8A, and the adjacent pattern 50A shown in FIG. 11A, if a distance LL between the edge of the contact hole or the via hole and the terminal end of the adjacent pattern is greater than or equal to $LL_0$ or if the distance LL is greater than or equal to $LL_1$, it can be said that an extended portion is provided to the adjacent pattern in a master pattern.

Figure 35:
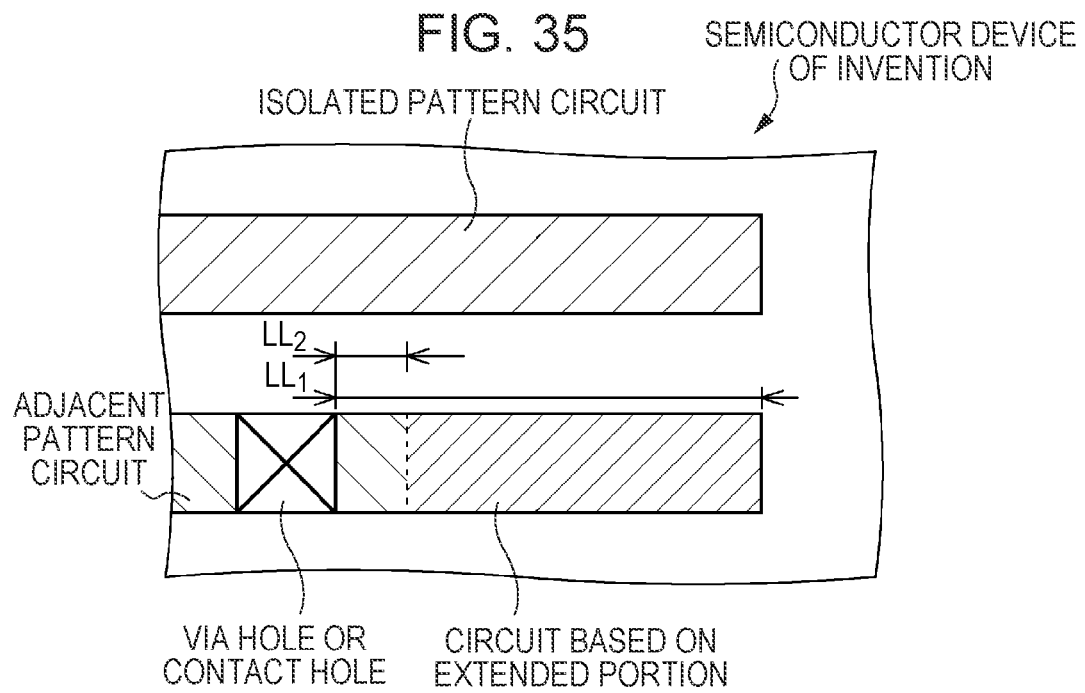
FIG. 35 is a schematic view of an arrangement of an isolated pattern and an adjacent pattern in a semiconductor device according to an embodiment of the present invention.

Additionally, in the fourth embodiment, for example, as shown in FIG. 16B, the extended portion 53 is provided to the adjacent pattern 50 of the master pattern. Accordingly, as schematically shown in FIG. 35, the relationship between a distance $LL_1$ between the edge of the contact hole or the via hole and the terminal end of the adjacent pattern and the predetermined width $W_0$ is identical to, for example, that shown in the table TABLE-2. In other words, if the value K in the equation $LL_1 = K \cdot W_0$, where $W_0$ is a predetermined width, satisfies the above-described values, it can be said that an extended portion is provided to the adjacent pattern in a master pattern. Still, in other words, if the relationship between the distance $LL_0$ between the edge of the contact hole or the via hole and the terminal end of the adjacent pattern and a design rule satisfies the relationship shown in TABLE-3, it can be said that an extended portion is provided to the adjacent pattern in a master pattern. This is the same for the example shown in FIG. 18B.

Figure 36:
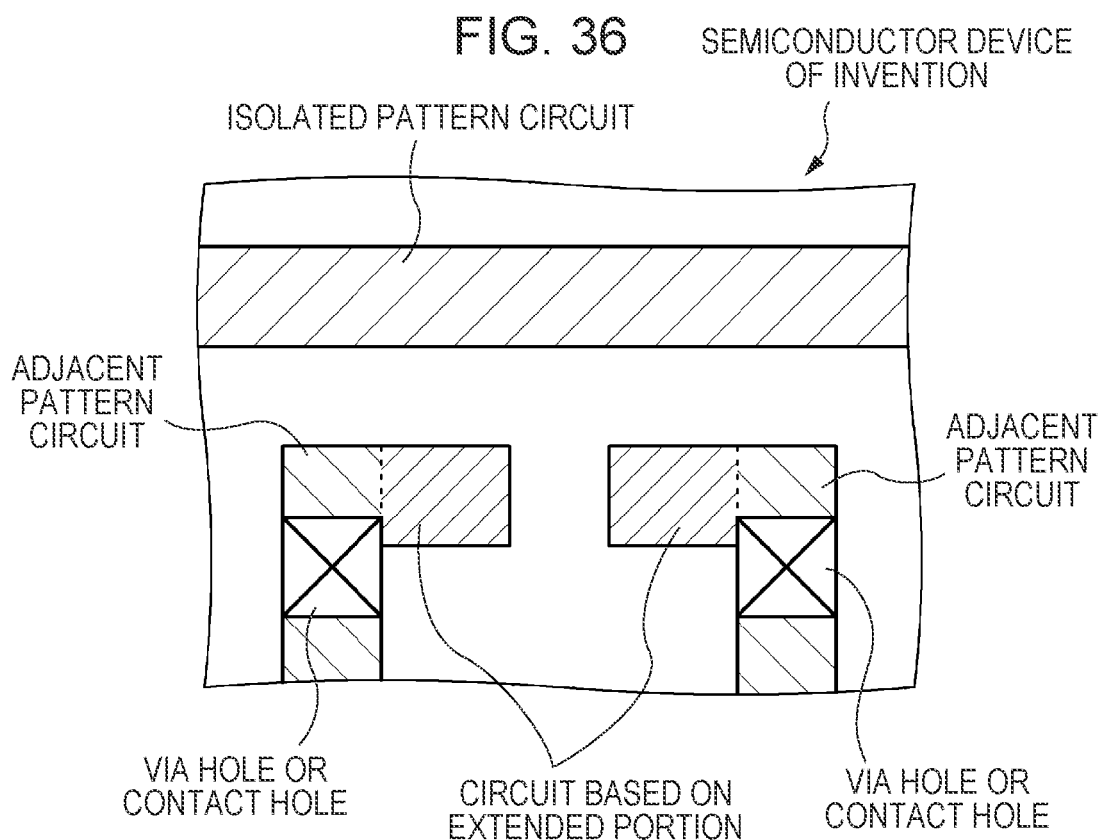
FIG. 36 is a schematic view of an arrangement of an isolated pattern and an adjacent pattern in a semiconductor device according to an embodiment of the present invention.

Furthermore, for example, as shown in FIG. 20B, when the extended portions 83A and 83B are provided to the adjacent patterns 80A and 80B in the mask pattern, it can be said that this operation executes the second aspect of the present invention, since no adjacent pattern circuit of a known semiconductor device has a portion corresponding to the extended portion 83A or 83B. FIG. 36 schematically illustrates the isolated pattern circuit and the adjacent pattern circuit in such a semiconductor device according to the embodiments of the present invention.

An adjacent pattern circuit in the known semiconductor device does not include portions corresponding to the extended portions 63, 63A, and 63B shown in the adjacent pattern circuits in the semiconductor device obtained on the basis of the following adjacent patterns: the adjacent pattern 60B shown in FIG. 7B, the adjacent pattern 60B shown in FIG. 8B, the adjacent pattern 60B shown in FIG. 9B, the adjacent pattern 60B shown in FIG. 10B, the adjacent pattern 60B shown in FIG. 11B, the adjacent patterns 60A and 60B shown in FIG. 12B, the adjacent pattern 60A shown in FIG. 13A, the adjacent pattern 60B shown in FIG. 13B, the adjacent patterns 60A and 60B shown in FIG. 14B, the adjacent pattern 60A shown in FIG. 15A, the adjacent pattern 60B shown in FIG. 15B, the adjacent pattern 60 shown in FIG. 17B, and the adjacent pattern 60 shown in FIG. 19B. Accordingly, it can be said that this operation executes the first aspect of the present invention. Furthermore, an adjacent pattern circuit in the known semiconductor device does not include portions corresponding to the extended portions 83, 83A, and 83B shown in the adjacent pattern circuits in the semiconductor device obtained on the basis of the following adjacent patterns: the adjacent pattern 80A shown in FIG. 21A, the second adjacent pattern 80B shown in FIG. 21B, the adjacent patterns 80A and 80B shown in FIG. 22B, the adjacent pattern 80A shown in FIG. 23A, the adjacent pattern 80B shown in FIG. 23B, the adjacent pattern 80 shown in FIG. 24B, and the adjacent pattern 80 shown in FIG. 25B. Accordingly, it can be said that this operation executes the second aspect of the present invention.

While the preferred embodiment of the invention has been illustrated and described, as noted above, many changes can be made without departing from the spirit and scope of the invention. The materials and conditions in the above-described embodiments are only examples, and therefore, can be changed as needed. In addition, the order of steps in the mask pattern correction method according to the first and second aspects of the present invention described in the first embodiment can be changed. For example, electron beam writing pattern data may be generated from design pattern data while correcting the design pattern data, and electron beam writing may be performed on the basis of the electron beam writing pattern data.

It should be understood by those skilled in the art that various modifications, combinations, sub-combinations and alterations may occur depending on design requirements and other factors insofar as they are within the scope of the appended claims or the equivalents thereof.

What is claimed is:

1. A method for fabricating a semiconductor device, comprising the steps of:
    correcting design pattern data including data of a plurality of design patterns;
    performing electron beam writing on an electron beam resist formed on a mask blank on the basis of the corrected design pattern data;
    developing the electron beam resist to form an etching mask;
    etching the mask blank using the etching mask to form a photomask;
    transferring a mask pattern formed on the photomask to a photoresist formed on a base substrate by irradiating the photomask with exposure light;
    developing the photoresist to form an etching mask; and
    etching a base substrate using the etching mask;
    wherein correcting the design pattern data includes the steps of:
    extracting an isolated pattern having an optically isolated portion from the mask pattern; and
    providing, in an adjacent pattern extending parallel to the isolated portion of the isolated pattern and having a terminal end, an extended portion extending from the terminal end next to the isolated portion of the isolated pattern along a direction in which the isolated portion of the isolated pattern extends.

2. A method for fabricating a semiconductor device, comprising the steps of:
    correcting design pattern data including data of a plurality of design patterns;
    performing electron beam writing on an electron beam resist formed on a mask blank on the basis of the corrected design pattern data;
    developing the electron beam resist to form an etching mask;
    etching the mask blank using the etching mask to form a photomask;
    transferring a mask pattern formed on the photomask to a photoresist formed on a base substrate by irradiating the photomask with exposure light;
    developing the photoresist to form an etching mask; and
    etching a base substrate using the etching mask;
    wherein correcting the design pattern data includes the steps of:
    extracting an isolated pattern having an optically isolated portion from the mask pattern; and
    providing, in a straight adjacent pattern extending next to the isolated pattern in a direction orthogonal to the isolated pattern and having a terminal end and a terminal end edge extending from the terminal end, an extended portion extending from the terminal end edge next to the isolated portion of the isolated pattern along a direction in which the isolated portion of the isolated pattern extends.

3. A semiconductor device comprising:
    an isolated pattern circuit including a pattern having an isolated portion; and
    an adjacent pattern circuit extending parallel to the isolated portion of the isolated pattern and having a terminal end;
    wherein an extended portion is provided to the adjacent pattern circuit and the extended portion extends from the terminal end next to the isolated portion of the isolated pattern along a direction in which the isolated portion of the isolated pattern extends.

4. A semiconductor device comprising:
    an isolated pattern circuit including a pattern having an isolated portion; and
    a straight adjacent pattern extending next to the isolated pattern in a direction orthogonal to the isolated pattern and having a terminal end and a terminal end edge extending from the terminal end;
    wherein an extended portion is provided extending from the terminal end edge next to the isolated portion of the isolated pattern along a direction in which the isolated portion of the isolated pattern extends.

5. A semiconductor device fabricated by irradiating a photomask with exposure light, transferring a mask pattern formed in the photomask onto a photoresist formed on a base substrate, and etching the base substrate using an etching mask obtained by developing the photoresist, the photomask being formed by correcting design pattern data including a plurality of design patterns, performing electron beam writing on an electron beam resist formed on a mask blank according to an electron beam writing pattern created on the basis of the corrected design pattern data, and etching the mask blank using an etching mask formed by developing the electron beam resist, wherein the step of correcting design pattern data comprises the substeps of:
    extracting an isolated pattern having an optically isolated portion from the mask pattern; and
    providing, in an adjacent pattern extending parallel to the isolated portion of the isolated pattern and having a terminal end, an extended portion extending in a direction along the isolated portion of the isolated pattern and extending from the terminal end next to the isolated portion of the isolated pattern.

6. A semiconductor device fabricated by irradiating a photomask with exposure light, transferring a mask pattern formed in the photomask onto a photoresist formed on a base substrate, and etching the base substrate using an etching mask obtained by developing the photoresist, the photomask being formed by correcting design pattern data including a plurality of design patterns, performing electron beam writing on an electron beam resist formed on a mask blank according to an electron beam writing pattern created on the basis of the corrected design pattern data, and etching the mask blank using an etching mask formed by developing the electron beam resist, wherein the step of correcting design pattern data comprises the substeps of:
    extracting an isolated pattern having an optically isolated portion from the mask pattern; and
    providing, in a straight adjacent pattern extending next to the isolated pattern in a direction orthogonal to the isolated pattern and having a terminal end and a terminal end edge extending from the terminal end, an extended portion extending from the terminal end edge next to the isolated portion of the isolated pattern along a direction in which the isolated portion of the isolated pattern extends.

* * * * *